(12) United States Patent
Chen et al.

(10) Patent No.: US 8,044,432 B2
(45) Date of Patent: *Oct. 25, 2011

(54) LOW DENSITY DRAIN HEMTS

(75) Inventors: Jing Chen, Hong Kong (CN); Kei May Lau, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 11/564,795

(22) Filed: Nov. 29, 2006

(65) Prior Publication Data

US 2007/0295993 A1 Dec. 27, 2007

Related U.S. Application Data

(60) Provisional application No. 60/740,256, filed on Nov. 29, 2005, provisional application No. 60/748,339, filed on Dec. 8, 2005.

(51) Int. Cl.
*H01L 29/66* (2006.01)

(52) U.S. Cl. ........ 257/192; 257/194; 257/201; 257/183; 257/E29.246

(58) Field of Classification Search .................. 257/103, 257/403, E21.403, 183, 190, 192, 194, 201, 257/344, 408; 438/514, 518–520, 528, 527
See application file for complete search history.

(56) References Cited

U.S. PATENT DOCUMENTS

| | | | |
|---|---|---|---|
| 3,767,984 A | 10/1973 | Sinoda et al. | |
| 4,095,331 A | 6/1978 | Rutz | |
| 4,157,556 A | 6/1979 | Decker et al. | |
| 4,615,102 A * | 10/1986 | Suzuki et al. | 438/172 |
| 4,710,787 A * | 12/1987 | Usagawa et al. | 257/12 |
| 5,571,734 A * | 11/1996 | Tseng et al. | 438/591 |
| 5,825,079 A | 10/1998 | Metzler et al. | |
| 5,907,777 A | 5/1999 | Joseph et al. | |
| 6,093,952 A | 7/2000 | Bandic et al. | |
| 6,133,593 A | 10/2000 | Boos et al. | |
| 6,166,404 A | 12/2000 | Imoto et al. | |
| 6,316,793 B1 * | 11/2001 | Sheppard et al. | 257/103 |
| 6,458,675 B1 | 10/2002 | Marukawa | |
| 6,603,179 B2 | 8/2003 | Ando et al. | |
| 6,690,042 B2 | 2/2004 | Khan et al. | |

(Continued)

FOREIGN PATENT DOCUMENTS

JP 11-121737 * 4/1999

(Continued)

OTHER PUBLICATIONS

Khan et al., "Insulating gate III-N heterostructure field-effect transistors for high-power microwave and switching applications," IEEE Trans. Microw. Theory Tech., vol. 51, No. 2, pp. 624-633, Feb. 2003.

(Continued)

*Primary Examiner* — Lynne A Gurley
*Assistant Examiner* — Jesse Y Miyoshi
(74) *Attorney, Agent, or Firm* — Turocy & Watson, LLP

(57) ABSTRACT

Methods and devices for fabricating AlGaN/GaN normally-off high electron mobility transistors (HEMTs). A fluorine-based (electronegative ions-based) plasma treatment or low-energy ion implantation is used to modify the drain-side surface field distribution without the use of a field plate electrode. The off-state breakdown voltage can be improved and current collapse can be completely suppressed in LDD-HEMTs with no significant degradation in gains and cutoff frequencies.

14 Claims, 75 Drawing Sheets

U.S. PATENT DOCUMENTS

| | | | |
|---|---|---|---|
| 6,773,999 B2 | 8/2004 | Yoneda | |
| 6,797,555 B1* | 9/2004 | Hopper et al. | 438/217 |
| 6,825,133 B2* | 11/2004 | Yu et al. | 438/787 |
| 7,052,942 B1 | 5/2006 | Smart et al. | |
| 7,262,446 B2 | 8/2007 | Toyama | |
| 7,312,472 B2 | 12/2007 | Chiyo et al. | |
| 7,339,209 B2 | 3/2008 | Brar | |
| 7,375,407 B2 | 5/2008 | Yanagihara et al. | |
| 7,382,001 B2 | 6/2008 | Beach | |
| 7,402,492 B2* | 7/2008 | Jeon et al. | 438/257 |
| 2001/0015437 A1 | 8/2001 | Ishii et al. | |
| 2001/0034116 A1 | 10/2001 | Lee et al. | |
| 2002/0177261 A1 | 11/2002 | Song et al. | |
| 2003/0020092 A1 | 1/2003 | Parikh et al. | |
| 2003/0205721 A1 | 11/2003 | Nishii et al. | |
| 2003/0218183 A1 | 11/2003 | Micovic et al. | |
| 2004/0041169 A1 | 3/2004 | Ren et al. | |
| 2004/0135161 A1 | 7/2004 | Taylor | |
| 2005/0007200 A1 | 1/2005 | Inoue et al. | |
| 2005/0059197 A1 | 3/2005 | Yamashita et al. | |
| 2005/0062069 A1 | 3/2005 | Saito et al. | |
| 2005/0110054 A1 | 5/2005 | Wohlmuth | |
| 2005/0189561 A1 | 9/2005 | Kinzer | |
| 2005/0277255 A1 | 12/2005 | Asano | |
| 2006/0060871 A1* | 3/2006 | Beach | 257/94 |
| 2006/0108606 A1 | 5/2006 | Saxler et al. | |
| 2006/0121658 A1 | 6/2006 | Ahn et al. | |
| 2006/0175633 A1 | 8/2006 | Kinzer | |
| 2007/0108547 A1 | 5/2007 | Zhu et al. | |
| 2007/0114569 A1* | 5/2007 | Wu et al. | 257/194 |
| 2007/0224710 A1* | 9/2007 | Palacios et al. | 438/12 |
| 2007/0228416 A1 | 10/2007 | Chen et al. | |
| 2007/0278518 A1 | 12/2007 | Chen et al. | |
| 2008/0116492 A1 | 5/2008 | Wu et al. | |
| 2008/0128752 A1 | 6/2008 | Wu | |
| 2008/0191216 A1 | 8/2008 | Machida et al. | |
| 2009/0032820 A1 | 2/2009 | Chen | |
| 2010/0019279 A1 | 1/2010 | Chen | |

FOREIGN PATENT DOCUMENTS

| | | |
|---|---|---|
| JP | 11121737 A | 4/1999 |
| JP | 2004-031896 | 1/2004 |

OTHER PUBLICATIONS

Khan et al., "Enhancement and depletion mode GaN/AlGaN heterostructure field effect transistors," Appl. Phys. Lett., vol. 68, No. 4, pp. 514-516, Jan. 1996.

Khan et al., "AlGaN/GaN metal oxide semiconductor heterostructure field effect transistor," IEEE Electron Device Lett., vol. 21, No. 2, pp. 63-65, Feb. 2000.

Kim et al., "Gate current leakage and breakdown mechanism in unpassivated AlGaN/GaN high electron mobility transistors by post-gate annealing", Appl. Phys. Lett. vol. 86, 143505, Mar. 2005.

Koudymov et al., "Maximum current in nitride-based heterostructure field-effect transistors," Appl. Phys. Lett., vol. 80, No. 17, pp. 3216-3218, Apr. 2002.

Kumar et al., "AlGaN/GaN HEMTs on SiC with fT of over 120 GHz," IEEE Electron Device Lett. vol. 23, No. 8, pp. 455-457, Aug. 2002.

Kumar et al., "High transconductance enhancement-mode AlGaN/GaN HEMTs on SiC substrate," Electron. Lett., vol. 39, No. 24, pp. 1758-1760, Nov. 2003.

Lanford, et al., "Recessed-gate enhancement-mode GaN HEMT with high threshold Voltage," Electron. Lett., vol. 41, No. 7, pp. 449-450, Mar. 2005.

Lee et al., "High Breakdown Voltage GaN Schottky Barrier Diode employing Floating Metal Rings on AlGaN/GaN Hetero-junction," Proceedings of the 17 International Symposium on Power Semiconductor Devices & IC's May 23-26, 2005 Santa Barbara, CA.

Limb et al., "Low on-resistance GaN pin rectifiers grown on 6H-SiC substrates," Electronics Letters vol. 43 No. 6, Mar. 2007.

Liu et al., "AlGaN/GaN/InGaN/GaN Double Heterojunction HEMTs with an InGaN-Notch for Enhanced Carrier Confinement," IEEE Electron Device Lett. vol. 27, No. 1, pp. 10-12, Jan. 2006.

Liu et al., "DC and RF Characteristics of AlGaN/GaN/InGaN/GaN Double-Heterojunction HEMTs," IEEE Trans. Electron Devices, vol. 54, No. 1, pp. 2-10, Jan. 2007.

Mahajan et al. "Fabrication and characterization of an InAlAs/InGaAs/InP ring oscillator using integrated enhancement- and depletion-mode high-electron mobility transistors," IEEE Electron Device Lett., vol. 18, No. 8, pp. 391-393, Aug. 1997.

Meneghesso et al., "Current Collapse and High-Electric-Field Reliability of Unpassivated GaN/AlGaN/GaN HEMTs," IEEE Electron Device Lett., vol. 53, No. 12, pp. 2932-2941, Dec. 2006.

Menozzi, Roberto, "Off-State Breakdown of GaAs PHEMTs: Review and New Data", IEEE Trans. Electron Devices vol. 4, No. 1, pp. 54-62, Mar. 2004.

Micovic et al., "GaN double heterojunction field effect transistor for microwave and millimeterwave power applications," in IEDM Tech. Dig. 2004, pp. 807-810.

Micovic et al., "GaN enhancement/depletion-mode FET logic for mixed signal applications," Electron. Lett., vol. 41, No. 19, pp. 1081-1083, Sep. 2005.

Mikkelson et al., "High-density GaAs integrated circuit manufacturing," IEEE Trans. Semicond. Manuf., vol. 16, No. 3, pp. 384-389, Aug. 2003.

Miller et al., "Gate leakage current mechanisms in AlGaN/GaN heterostructure field-effect transistors," J. Appl. Phys., vol. 88, No. 10, pp. 5951-5953, Nov. 2000.

Moon et al., "Submicron Enhancement-Mode AlGaN/GaN HEMTs," Jun. 2002, Digest of 60th Device Research Conference, pp. 23-44.

Nakao et al., "Study on off-state breakdown in AlGaN/GaN HEMTs," Phys. Stat. Sol. (c) vol. 0, No. 7, pp. 2335-2338, Dec. 2003.

Neudeck et al., "High-temperature electronics—A role for wide bandgap semiconductors?," Proc. IEEE, vol. 90, No. 6, pp. 1065-1076, Jun. 2002.

Nowakowski, "Choosing the Optimum Switching Frequemncy for DC-DC Converters," EE Times-India, Oct. 2006.

Ohno et al., "Effects of surface passivation on breakdown of AlGaN/GaN high-electron-mobility transistors," Appl. Phys. Lett. vol. 84, No. 12, pp. 2184-2186, Mar. 2004.

Omura et al. "Gallium Nitride Power HEMT for High Switching Frequency Power Electronics," IEEE pub. No. 978-14244-17285 (2007).

Palacios et al., "AlGaN/GaN high electron mobility transistors with InGaN back-barriers," IEEE Electron Device Lett., vol. 27, No. 1, pp. 13-15, Jan. 2006.

Palacios et al., "High-performance E-mode AlGaN/GaN HEMTs," IEEE Electron Device Lett., vol. 27, No. 6, pp. 428-430, Jun. 2006.

Cai et al., Published conference abstract of submission on Jan. 27, 2005 to the 4ih Electronics Material Conference, which was held on Jun. 22-24, 2005 in Santa Barbara, California, entitled "Threshold Voltage Control of AlGaN/GaN HEMTs by CF4 Plasma Treatment."

Rumyantsev et al., "Effect of gate leakage current on noise properties of AlGaN/GaN field effect transistors," J. Appl. Phys., vol. 88, No. 11, pp. 6726-6730, Dec. 2000.

Saito et al., "Recessed-Gate Structure Approach Toward Normally Off High-Voltage AlGaN/GaN HEMT for Power Electronics Applications," 53 IEEE Transactions of Electron Devices 356-362, Feb. 2006.

Saito et al., "High breakdown voltage AlGaN-GaN power-HEMT design and high current density switching behavior," IEEE Trans. Electron Devices, vol. 50, No. 12, pp. 2528-2531, Dec. 2003.

Sierakowski et al., "Analysis of Schottky gate electron tunneling in polarization induced AlGaN/GaN high electron mobility transistors," J. Appl. Phys., vol. 86, No. 6, pp. 3398-3401, Sep. 1999.

Song et al., "Normally Off AlGaN/GaN Low-Density Drain HEMT (LDD-HEMT) With Enhanced Breakdown Voltage and Reduced Current Collapse". IEEE Electron Device Lett., vol. 28, No. 3, pp. 189-191, 2007.

Takatani et al., "AlGaN/GaN Schottky-ohmic combined anode field effect diode with fluoride-based plasma treatment," Electronics Letters vol. 44 No. 4, Feb 2008.

Tan et al., "Gate leakage effect and breakdown voltage in metalorganic vapor phase epitaxy AlGaN/GaN heterostructure field-effect transistors", Appl. Phys. Lett. vol. 80, No. 17, pp. 3207-3209, Apr. 2002.

Tanimoto et al., "Single-Voltage-Supply Highly Efficient E/D Dual-Gate Pseudomorphic Double-Hetero HEMT's with Platinum Buried Gates" IEEE Electron Device Lett., vol. 45, No. 6, pp. 1176-1182, Jun. 1998.

Tipirneni et al., "The 1.6-kV AlGaN/GaN HFETs" IEEE Electron Device Lett., vol. 27, pp. 716-718, 2006.

Uemoto et al., "8300V Blocking Voltage AlGaN/GaN Power HFET with Thick Poly-AlN Passivation," IEDM'07, pp. 861-864, 2007.

Uren et al., "Punchthrough in short-channel AlGaN/GaN HFETs," IEEE Trans. Electron Devices, vol. 53, No. 2, pp. 395-398, Feb. 2006.

Vetury et al., "Performance and RF Reliability of GaN-on-SiC HEMT's using Dual-Gate Architectures" pp. 714-717, 2006.

Wang et al., "Source Injection Induced Off-State Breakdown and Its Improvement by Enhanced Back Barrier with Fluorine Ion Implantation in AlGaN/GaN HEMTs," IEDM'08, pp. 149-152, 2008.

Wang et al., "Enhancement Mode $Si_3N_4$/AlGaN/GaN MISHFETs," IEEE Electron Device Letters, vol. 27, No. 10, pp. 793-795, 2006.

Wang et al., "Planar Integration of E/D-Mode AlGaN/GaN HEMTs Using Fluoride-Based Plasma Treatment," IEEE Electron Device Letters, vol. 27, No. 8, pp. 633-635, Aug. 2006.

Webb et al., "Semi-insulating C-doped GaN and high-mobility AlGaN/GaN heterostructures grown by ammonia molecular beam epitaxy," Appl. Phys. Lett. vol. 75, No. 7, pp. 953-955, Aug. 1999.

Wu et al., "High-gain Microwave GaN HEMTs with Source-terminated Field-plates" IEDM 2004, pp. 1078-1079.

Wu et al., "30-W/mm GaN HEMT by field plate optimization," IEEE Electron Device Lett. vol. 25, No. 3, pp. 117-119, Mar. 2004.

Xing et al., "High breakdown voltage AlGaN—GaN HEMTs achieved by multiple field plates," IEEE Electron Device Lett., vol. 25, No. 4, pp. 161-163, Apr. 2004.

Yoshida et al., "Low On-Voltage Operation AlGaN/GaN Schottky Barrier Diode with a Dual Schottky Structure," IEICE Trans. Electron., vol. E88-C, No. 4, pp. 690-693, Apr. 2005.

Zhang et al., "Vertical and lateral GaN rectifiers on free-standing GaN substrates," Applied Physics Letters vol. 79, No. 10, pp. 1555-1557, Sep. 2001.

Zhang et al., "Comparison of GaN P-I-N and Schottky Rectifier Performance," IEEE Transactions on Electron Devices, vol. 48, No. 3, pp. 407-501, Mar. 2001.

Zhang et al., "Kilovolt AlGaN/GaN HEMTs as Switching Devices," phys. stat. sol. (a) 188, No. 1, 213-217 (2001).

Zhou et al., "High breakdown voltage Schottky rectifier fabricated on bulk n-GaN substrate," Solid-State Electronics 50 (2006) 1744-1747.

Ziegler, James, "Instruction Manual: The Stopping and Range of Ions in Matter," Dec. 22, 1995.

Final Office Action dated Dec. 24, 2009, issued in U.S. Appl. No. 11/564,780.

Non-Final Office Action dated Jan. 5, 2009, issued in U.S. Appl. No. 11/564,780.

Non-Final Office Action dated Jun. 29, 2009, issued in U.S. Appl. No. 11/564,780.

Non-Final Office Action dated Jan. 8, 2010, issued in U.S. Appl. No. 11/564,766.

Final Office Action dated Apr. 29, 2009, issued in U.S. Appl. No. 11/564,766.

Non-Final Office Action dated Oct. 30, 2008, issued in U.S. Appl. No. 11/564,766.

Neuberger et al., "Observation of ion-induced changes in the channel current of high electron mobility AlGaN/GaN transistors (HEMT)", 2002, Elsevier—Materials Science and Engineering, pp. 143-146.

Lab notes between Mar. 29-Oct 30, 2004 of Dr. Yong Cai, one of the inventors.

Email from Dr. Cai to Dr. Chen dated Oct. 29, 2004 and attachment report.

Liu et al., "Highly Linear Al0:3Ga0:7N—Al0:05Ga0:95N—GaN Composite-Channel HEMTs," IEEE Electron Device Letters, vol. 26, No. 3, Mar. 2005, pp. 145-147.

Okamoto et al., "Improved Power Performance for a Recessed-Gate AlGaN—GaN Heterojunction FET With a Field-Modulating Plate," IEEE Transactions on Microwave Theory and Techniques, vol. 52, No. 11, Nov. 2004, pp. 2536-2540.

Ambacher et al., ""Two-dimensional electron gases induced by spontaneous and piezoelectric polarization charges in N- and Ga-face AlGaN/GaNheterostructures."" J. Appl. Phys., vol. 85, No. 6, pp. 3222-3233, Mar. 1999.

Ando et al., "10-W/mm AlGaN—GaN HFET With a Field Modulating Plate," IEEE Electron Device Letters, vol. 24, No. 5, 289-291, May 2003.

Ando et al., "Novel AlGaN/GaN Dual-Field-Plate FET With High Gain, Increased Linearity and Stability," IEDM 2005, pp. 576-579, 2005.

Anwar et al. "Carrier trapping and current collapse mechanism in GaN metal-semiconductor field-effect transistors," Appl. Phys. Lett. vol. 84, No. 11, pp. 1970-1972, Mar. 2004.

Ao et al., "Copper gate AlGaN/GaN HEMT with low gate leakage current," IEEE Electron Device Lett., vol. 24, No. 8, pp. 500-502, Aug. 2003.

Arulkumaran et al., "Surface passivation effects on GaN high-electron-mobility transistors with $SiO_2$, $Si_3N_4$, and silicon oxynitride," J. Appl. Phys., vol. 84, No. 4, pp. 613-615, Jan. 2004.

Bahat-Treidel et al., "Punchthrough-Voltage Enhancement of AlGaN/GaN HEMTs Using AlGaN Double-Heterojunction Confinement", IEEE Trans. Electron Devices vol. 55, No. 12, pp. 3354-3359, Dec. 2008.

Bahl et al., "A New Drain-Current Injection Technique for the Measurement of Off-State Breakdown Voltage in FET's," IEEE Trans. Electron Devices, vol. 40, No. 8, pp. 1558-1560, Aug. 1993.

Bandic et al., "High voltage (450 V) GaN Schottky rectifiers," Applied Physics Letters vol. 74, No. 9, pp. 1266-1268, Mar. 1999.

Ben-Yaacov et al., "AlGaN/GaN current aperture vertical electron transistors with regrown channels," J. Appl. Phys., vol. 95, No. 4, pp. 2073-2078, Feb. 2004.

Bern et al., "Effect of surface passivation on performance of AlGaN/GaN/Si HEMTs," Solid State Electron., vol. 47, No. 11, pp. 2097-2103, Nov. 2003.

Boguslawski et al., "Native Defects in Gallium Nitride". Phys. Rev. B, vol. 51, No. 23, pp. 17255-17259, Jun. 1995.

Cai et al., "Control of Threshold Voltage of AlGaN/GaN HEMTs by Fluoride-Based Plasma Treatment: From Depletion to Enhancement Mode," IEEE Electron Device Letters, vol. 53, No. 9, pp. 2207-2215, 2006.

Cai et al., "III-nitride metal-insulator-semiconductor heterojunction field-effect transistor," Appl. Phys. Lett., vol. 86, No. 3, p. 032109, Jan. 2005.

Cai et al., "High-Performance Enhancement-Mode AlGaN/GaN HEMTs Using Fluoride-Based Plasma Treatment," IEEE Electron Device Lett. vol. 26, No. 7, pp. 435-437, Jul. 2005.

Cai et al., "Monolithically Integrated Enhancement/Depletion-Mode AlGaN/GaN HEMT Inverters and Ring Oscillators Using CF4 Plasma Treatment," IEEE Trans. Electron Devices, vol. 53, No. 9, pp. 2223-2230, Sep. 2006.

Cai et al., "Monolithic integration of enhancement- and depletion-mode AlGaN/GaN HEMTs for GaN digital integrated circuits," in IEDM Tech. Dig., Dec. 2005, pp. 771-774.

Cai et al., "High-Temperature Operation of AlGaN/GaN HEMTs Direct-Coupled FET Logic (DCFL) Integrated Circuits," IEEE Electron Device Lett. vol. 28, No. 5, pp. 328-331, May 2007.

Chen et al., "High-Performance InP-based Enhancement-Mode HEMTs Using Non-Alloyed Ohmic Contacts and Pt-based Buried-Gate Technologies," Feb. 1996, IEEE Trans. on Electron Devices, vol. 43, No. 2, pp. 252-257.

Chen et al., "AlGaN/GaN dual-gate modulation-doped field-effect transistors" IEEE Electronics Letters vol. 35, No. 11, pp. 933-934, May 1999.

Chen et al., "Dual-Gate AlGaN/GaN Modulation-Doped Field-Effect Transistors with Cut-Off Frequencies fT > 60 GHz," IEEE Electron Device Lett., vol. 21, No. 12, pp. 549-551, Dec. 2000.

Chini et al., "Power and linearity characteristics of GaN MISFET on sapphire substrate," IEEE Electron Device Lett., vol. 25, No. 2, pp. 55-57, Feb. 2004.

Chow et al., "Wide band gap compound semiconductors for superior high-voltage unipolar power devices," IEEE Trans. Electron Devices, vol. 41, No. 8, pp. 1481-1483, Aug. 1994.

Chu, "Recent developments and applications of plasma immersion ion implantation," J. Vac. Sci. Technol. B, vol. 22, No. 1, pp. 289-296, Jan./Feb. 2004.

Dang et al., "Fabrication and characterization of enhanced barrier AlGaN/GaN HFET", Electron. Lett. vol. 35, No. 7, pp. 602-603, 1999.

Daumiller et al., "Evaluation of the temperature stability of AlGaN/GaN heterostructure FET's," IEEE Electron Device Lett., vol. 20, No. 9, pp. 448-450, Sep. 1999.

Di Forte-Poisson et al., "Relationship between physical properties and gas purification in GaN grown by metalorganic vapor phase epitaxy," J. Cryst. Growth, vol. 195, No. 1-4 pp. 314-318, Dec. 1998.

Dora et al., "High breakdown voltage achieved on AlGaN/GaN HEMTs with integrated slant field plates," IEEE Electron Device Lett., vol. 27, No. 9, pp. 713-715, Sep. 2006.

Ketterson et al., "GaAs/AlGaAs and InGaAs/AlGaAs MODFET inverter simulations," IEEE Trans. Electron Devices, vol. ED-33, No. 11, pp. 1626-1634, 1986.

Dyakonova et al., "Temperature dependence of impact ionization in AlGaN-GaN heterostructures field effect transistors," Appl. Phys. Lett. vol. 72, No. 20, pp. 2562-2564, May 1998.

Eden et al., "Planar GaAs IC Technology: Applications for digital LSI," IEEE J. Solid-State Circuits, vol. 13, No. 4, pp. 419-426, Aug. 1978.

Egawa et al., "Characterizations of recessed gate AlGaN/GaN HEMTs on sapphire," IEEE Trans. Electron Devices, vol. 48, No. 3, pp. 603-608, Mar. 2003.

Endoh et al., "Non-recessed-gate enhancement-mode AlGaN/GaN high electron mobility transistors with high RF performance," Jpn. J. Appl. Phys., vol. 43, No. 4B, pp. 2255-2258, 2004.

Hashizume et al., "Leakage mechanism in GaN and AlGaN Schottky interfaces," Appl. Phys. Lett., vol. 84, No. 24, pp. 4884-4886, Jun. 2004.

Hashizume et al., "Suppression of current collapse in insulated gate AlGaN/GaN heterostructure field-effect transistors using ultrathin $Al_2O_3$ dielectric," Appl. Phys. Lett., vol. 83, No. 14, pp. 2952-2954, Oct. 2003.

Heikman et al., "Growth of Fe doped semi-insulating GaN by metalorganic chemical vapor deposition," Appl. Phys. Lett. vol. 81, No. 3, pp. 439-441, Jul. 2002.

Horio et al., "Physics-based simulation of buffer-trapping effects on slow current transients and current collabpse in GaN field effect transistors," J. Appl. Phys., vol. 98, pp. 124502-1-124502-7, Dec. 2005.

Hu et al., "$Si_3N_4$ /AlGaN/GaN-metal-insulator-semiconductor heterostructure field-effect transistors," Appl. Phys. Lett., vol. 79, No. 17, pp. 2832-2834, Oct. 2001.

Hu et al., "Enhancement mode AlGaN/GaN HFET with selectively grown pn junction gate," Electron. Lett., vol. 36, No. 8, pp. 753-754, 2000.

Hussain, et al., "GaN HFET digital circuit technology for harsh environments," Electron. Lett., vol. 39, No. 24, pp. 1708-1709. Nov. 2003.

Irokawa et al., "Current-voltage and reverse recovery characteristics of bulk GaN p-i-n rectifiers," Applied Physics Letters, vol. 83, No. 11, pp. 2271-2273, Sep. 2003.

Jia et al., "Enhancement-mode AlGaN/GaN HEMTs on silicon substrate" phys. stat. sol. (c) 3, No. 6, 2368-2372 (2006).

Joh et al., "Mechanisms for Electrical Degradation of GaN High-Electron Mobility Transistors," Electron Devices Meeting, 2006. IEDM '06. International Volume, Dec. 11-13, 2006.

Johnson et al., "Breakdown Voltage and Reverse Recovery Characteristics of Free-Standing GaN Schottky Rectifiers," IEEE Transactions on Electron Devices, vol. 49, No. 1, pp. 32-36, Jan. 2002.

Johnson et al., "12 W/mm AlGaN/GaN HFETs on siicon substrates," IEEE Electron Device Lett, vol. 25, No. 7, pp. 459-461, Jul. 2004.

Kanamura et al., "An over 100 W n-GaN/n-AlGaN/GaN MIS-HEMT power amplifier for wireless base station applications," in IEDM Tech. Dig., Dec. 2005, pp. 572-575.

Kanechika et al., "A vertical insulated gate AlGaN/GaN heterojunction field-effect transistor," Jpn. J. Appl. Phys., vol. 46, No. 21, pp. L503-L505, May 2007.

Karmalkar et al., "Enhancement of Breakdown Voltage in AlGaN/GaN High Electron Mobility Transistors Using a Field Plate," IEEE Trans. Electron Devices, vol. 48, No. 8, pp. 1515-1521, Aug. 2001.

Karmalkar et al., "Mechanism of the reverse gate leakage in AlGaN/GaN high electron mobility transistors," Appl. Phys. Lett., vol. 82, No. 22, pp. 3976-3978, Jun. 2000.

Cai et al. "Self-aligned Enhancement Mode AlGan/GaN HEMTs Using Fluoride-based Plasma Treatment" 2005 IEEE, pp. 179-180.

Office Action dated Feb. 22, 2011, for U.S. Appl. No. 12/414,865, 46 pages.

Office Action dated Jul. 9, 2010 for U.S. Appl. No. 11/564,766, 64 pages.

Notice of Allowance mailed Mar. 4, 2011 for U.S. Appl. No. 11/564,780, 36 pages.

Office Action dated Apr. 15, 2011 for U.S. Appl. No. 12/185,241, 36 pages.

* cited by examiner

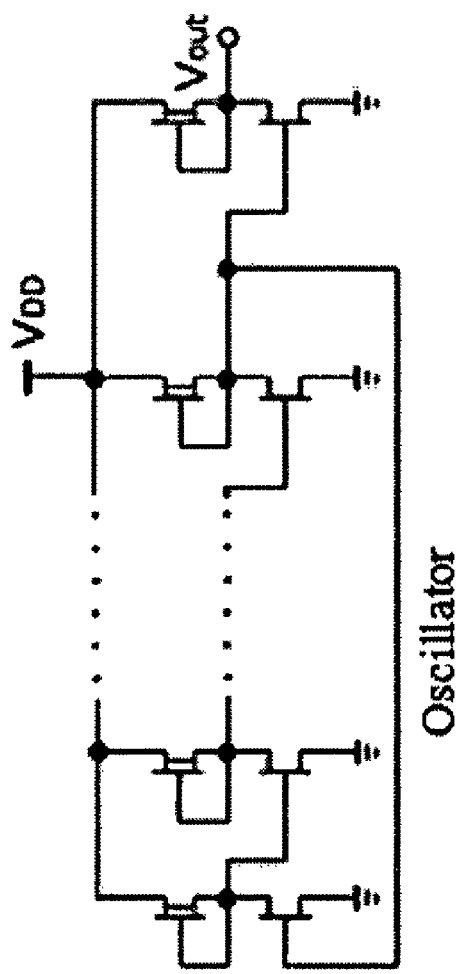

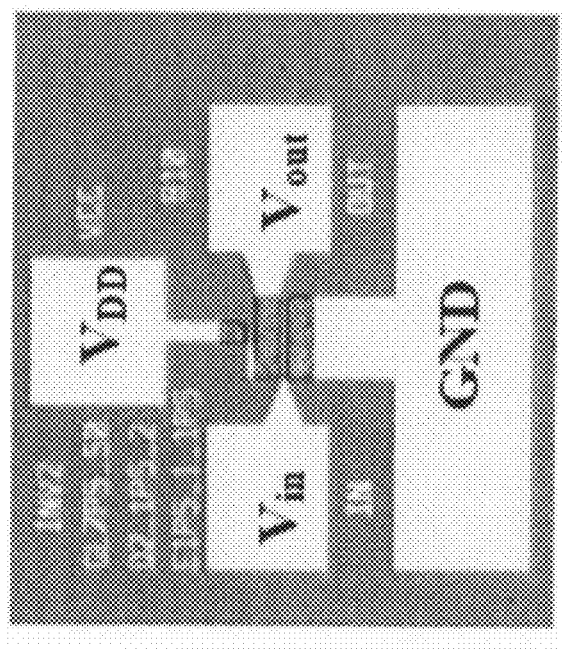

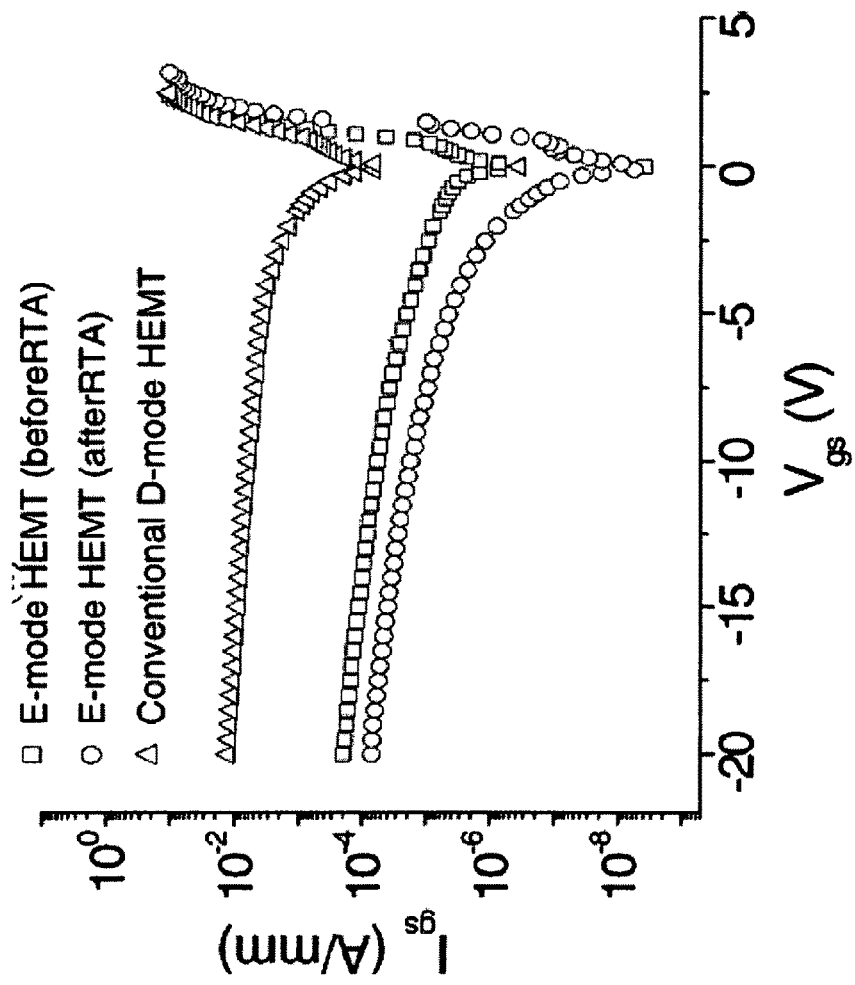

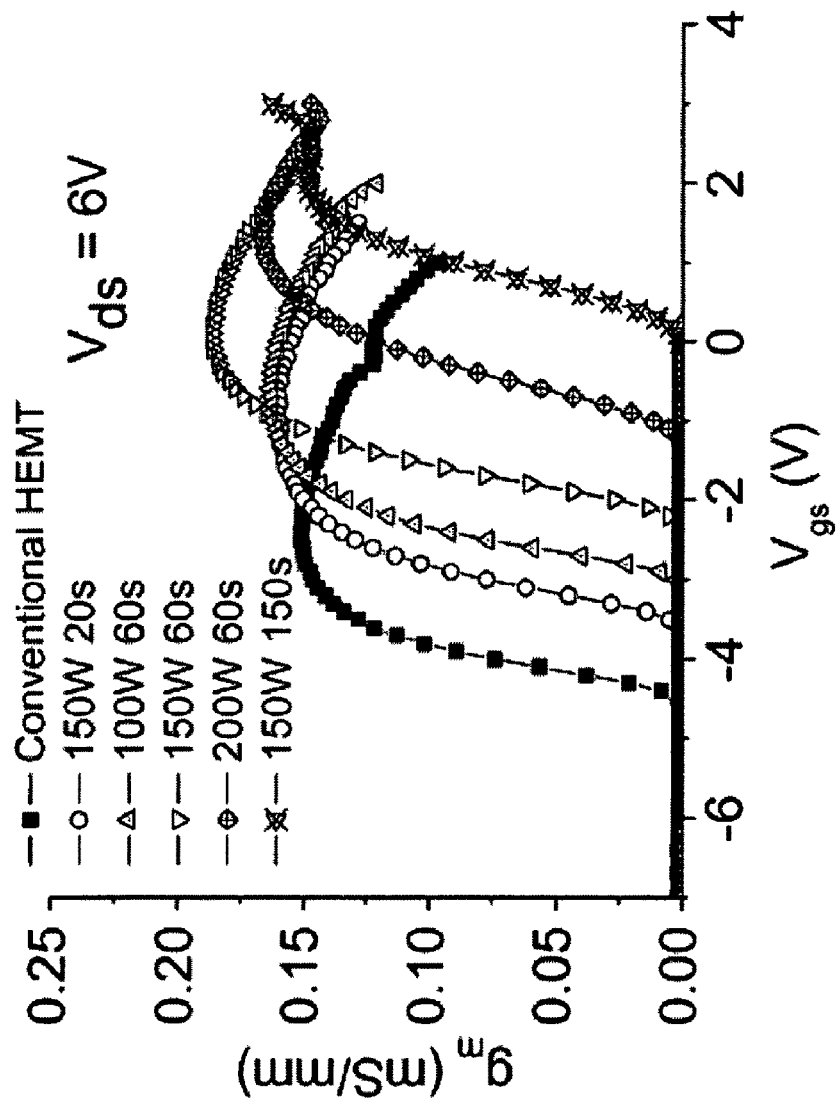

Fig. 9

EXTRACTED BARRIER HEIGHTS AND IDEALITY FACTORS OF GATE SCHOTTKY DIODES WITH DIFFERENT PLASMA TREATMENTS FROM FORWARD GATE CURRENTS; THRESHOLD VOLTAGES ARE ALSO LISTED

| $CF_4$ Plasma treatment condition | Barrier height (eV) | Ideality factor | $V_{th}$ (V) |
|---|---|---|---|
| Conventional HEMT | 0.4 | 8 | -4.0 |
| 100W, 60s | 0.6 | 4 | -2.87 |
| 150W, 20s | 0.71 | 2.5 | -2.37 |
| 150W, 60s | 0.62 | 4.8 | -1.53 |
| 150W, 150s | 0.74 | 3.5 | 0.9 |
| 200W, 60s | 0.9 | 2.4 | -0.29 |

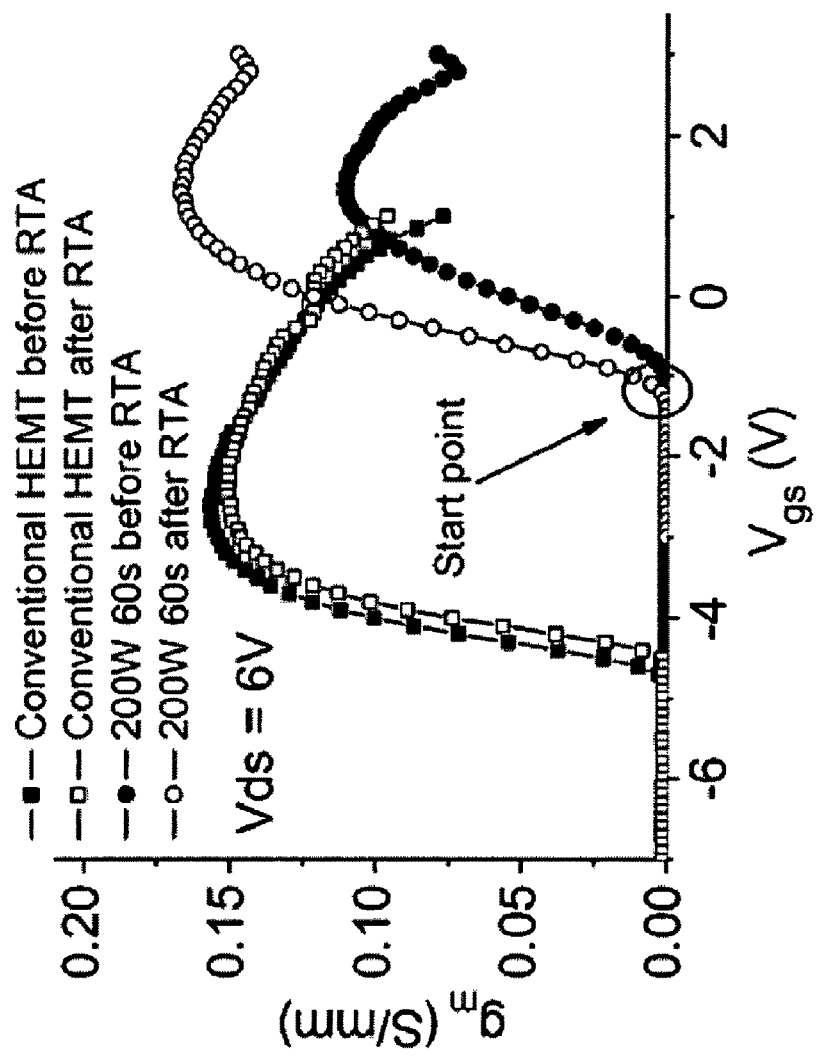

Fig. 16

ON-WAFER MEASURED $f_t$ AND $f_{max}$ OF AlGaN/GaN HEMTS WITH DIFFERENT PLASMA TREATMENTS

| CF$_4$ Plasma treatment condition | $f_t$(GHz) @ V$_{gs}$, V$_{ds}$ | $f_{max}$ (GHz) @ V$_{gs}$, V$_{ds}$ |
|---|---|---|
| Conventional HEMT | 13.1 @ -3V, 12V | 37.1 @ -3V, 2V |
| 100W, 60s | 10.3 @ -0.5V, 8V | 34.1 @ -1V, 8V |
| 150W, 20s | 10.3 @ -1V, 8V | 35.7 @ -2V, 8V |
| 150W, 60s | 14.3 @ 0V, 8V | 38.9 @ 0V, 12V |
| 150W, 150s | 10.1 @ 1.9V, 12V | 34.3 @ 1.9V, 12V |
| 200W, 60s | 9.9 @ 1.2V, 12V | 31.5 @ 0.8V, 12V |

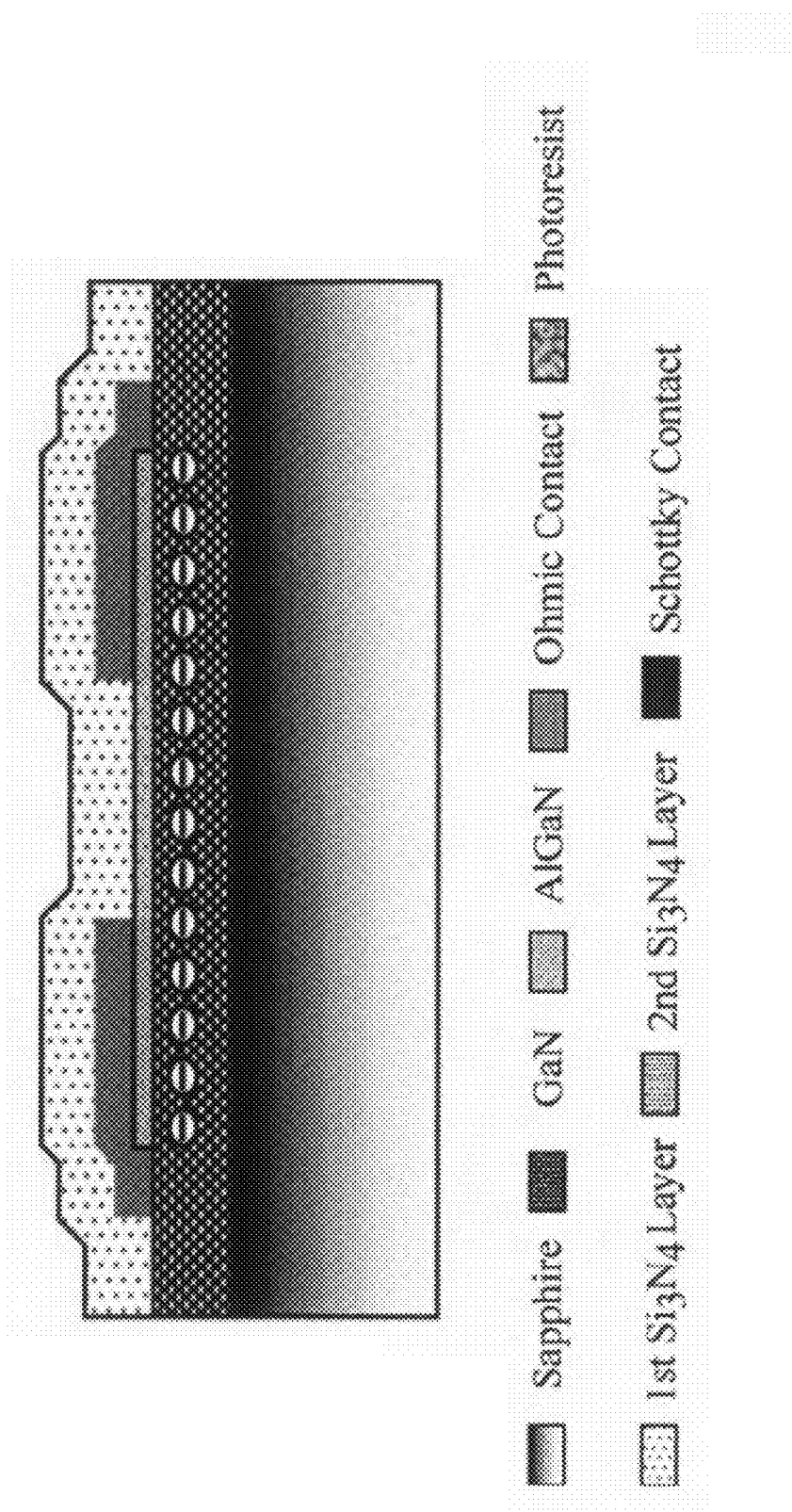

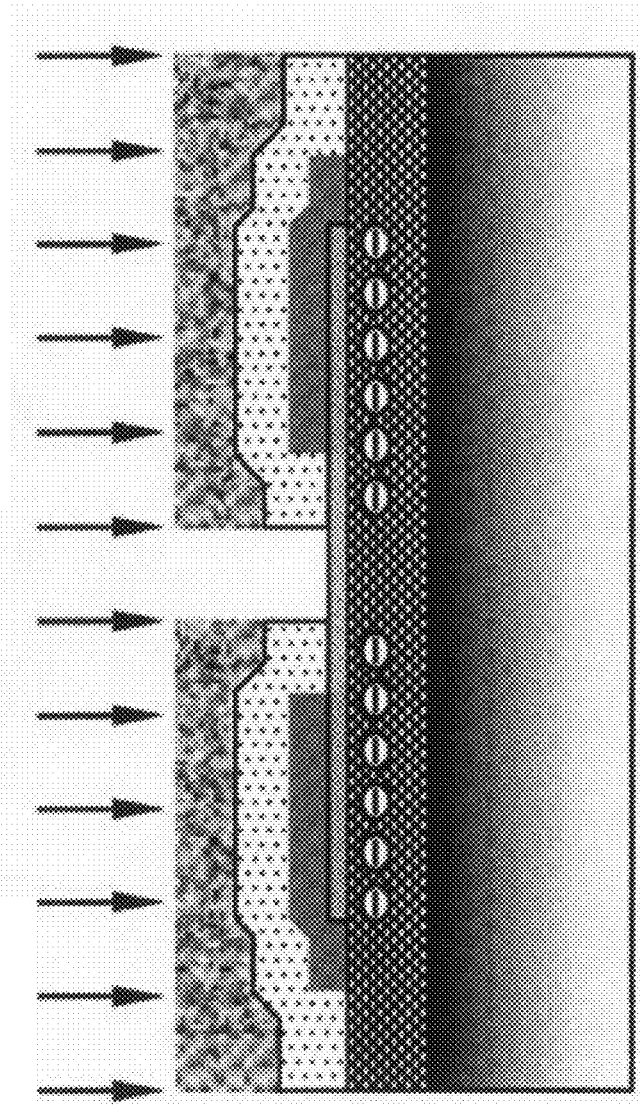
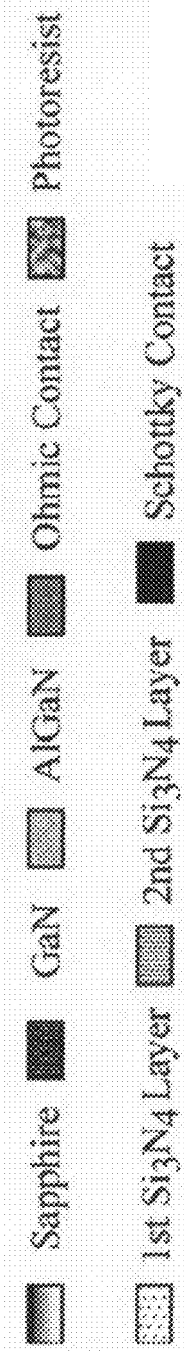
Fig. 17C

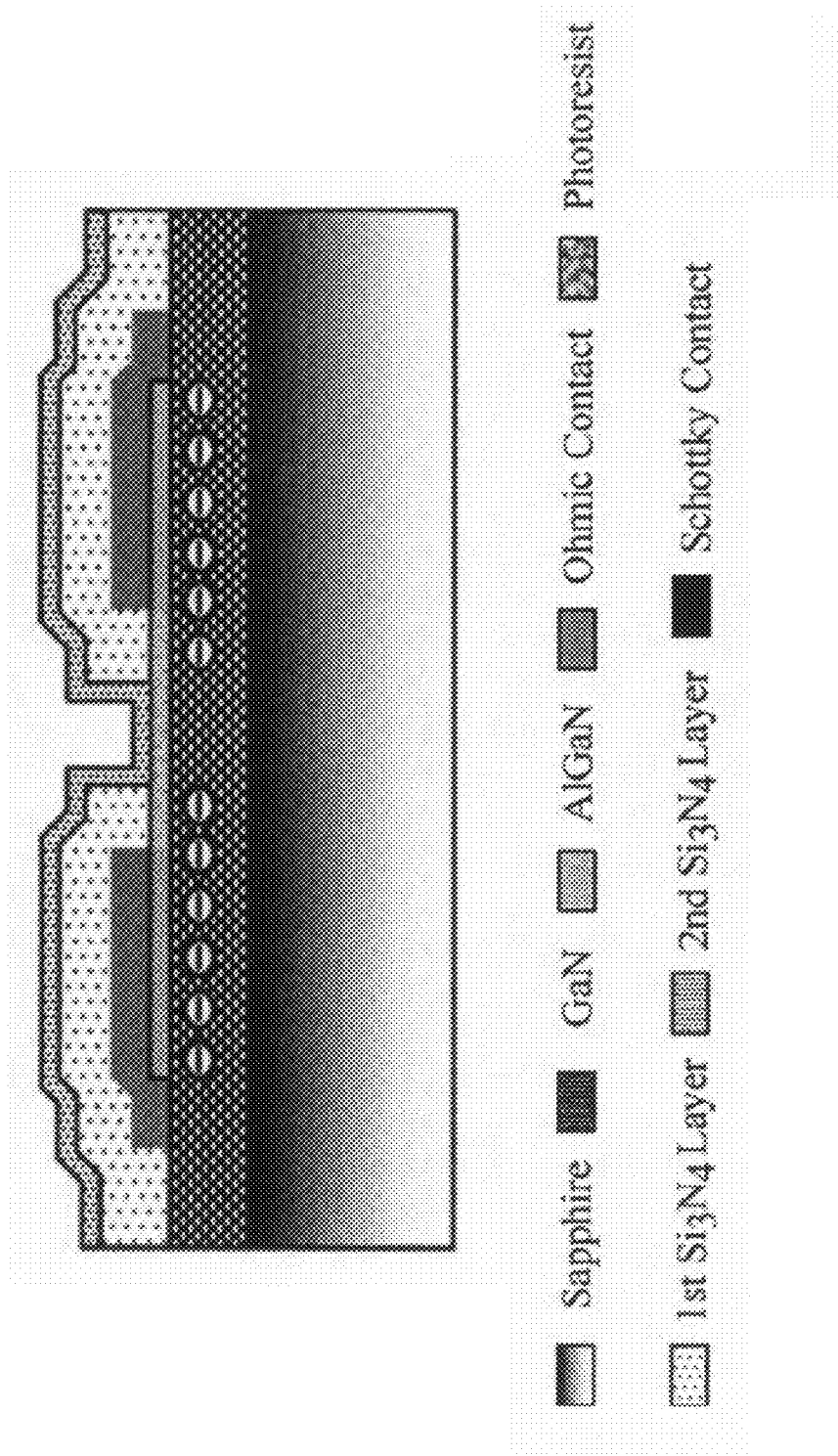

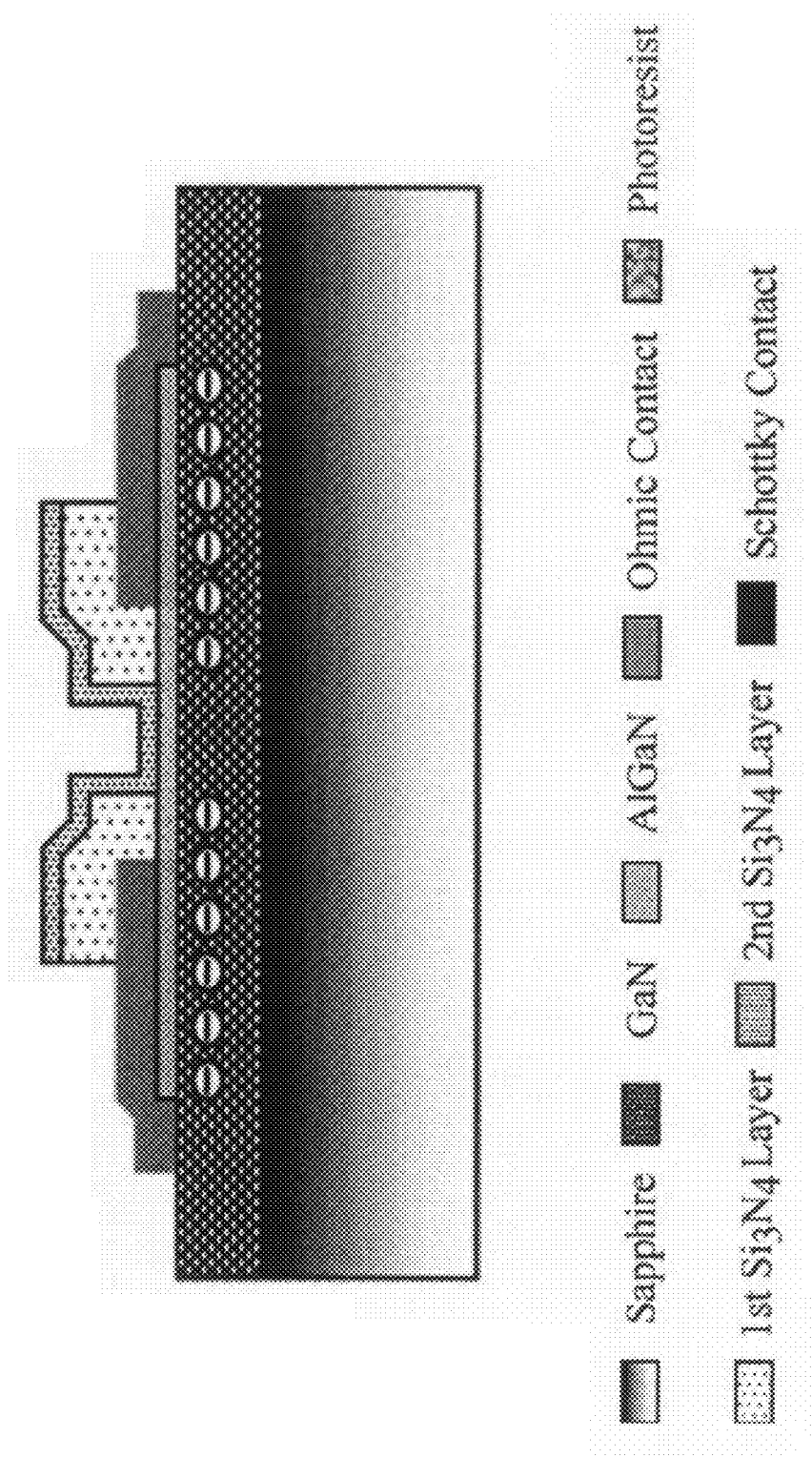

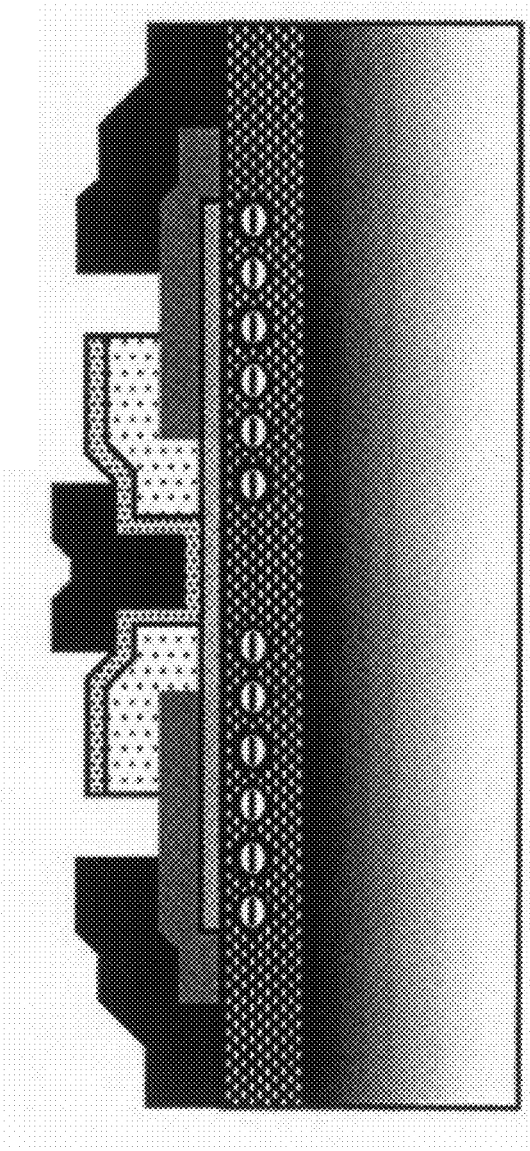

Fig. 34

GEOMETRY PARAMETERS OF INVERTERS AND RING OSCILLATORS

| $(W_g/L_g)_{\text{D-mode}}$ | $(W_g/L_g)_{\text{E-mode}}$ | β | Circuit units |
|---|---|---|---|
| 7.5μm / 1.5μm | 50μm / 1.5μm | 6.7 | Both INV &RO |
| 7.5μm / 1.5μm | 50μm / 1μm | 10 | Both INV &RO |
| 8μm / 4μm | 50μm / 1μm | 25 | Both INV &RO |
| 8μm / 4μm | 100μm / 1μm | 50 | INV only |

Fig.36

PERFORMANCES OF FABRICATED E- AND D-MODE AlGaN/GaN HEMTs

| | $V_{th}$ (V) | $G_{m,max}$ (mS/mm) | $I_{max}$ (mA/mm) | $f_t$ (GHz) | $f_{max}$ (GHz) |
|---|---|---|---|---|---|
| D-mode | -2.6 | 142 | 476 @ $V_{gs}$ =1V | 14.3 | 28.7 |
| E-mode | 0.75 | 132 | 273 @ $V_{gs}$ =3V | 10.7 | 21.9 |

Fig.40

NOISE MARGINS FOR INVERTERS WITH DIFFERENT $\beta$'S
MEASURED AT $V_{DD} = 1.5$ V

| $\beta$ | $V_{OH}$ | $V_{OL}$ | Output Swing | $V_{TH}$ | $G$ | $NM_L$ | $NM_H$ |
|---|---|---|---|---|---|---|---|
| 6.7 | 1.46 | 0.35 | 1.11 | 0.89 | 2 | 0.26 | 0.28 |
| 10 | 1.48 | 0.25 | 1.23 | 0.79 | 2.4 | 0.3 | 0.41 |
| 25 | 1.5 | 0.18 | 1.32 | 0.75 | 3 | 0.37 | 0.53 |
| 50 | 1.5 | 0.09 | 1.41 | 0.62 | 4.1 | 0.38 | 0.71 |

Fig. 42

Noise Margins Measured at Different $V_{DD}s$ for the Inverter with $\beta = 10$

| $V_{DD}$ | $V_{OH}$ | $V_{OL}$ | Output Swing | $V_{TH}$ | $G$ | $NM_L$ | $NM_H$ |
|---|---|---|---|---|---|---|---|
| 1 | 0.96 | 0.23 | 0.73 | 0.56 | 1.7 | 0.13 | 0.15 |
| 1.5 | 1.48 | 0.25 | 1.23 | 0.79 | 2.4 | 0.3 | 0.41 |
| 2 | 1.99 | 0.28 | 1.71 | 0.95 | 3.2 | 0.44 | 0.73 |
| 2.5 | 2.45 | 0.38 | 2.07 | 1.01 | 4.2 | 0.53 | 1.13 |

LOW DENSITY DRAIN HEMTS

CROSS-REFERENCE TO RELATED APPLICATIONS

This application claims priority from U.S. Provisional Patent Application 60/740,256 filed on Nov. 29, 2005, and also from U.S. Provisional Patent Application 60/748,339 filed on Dec. 8, 2005, both of which are hereby incorporated by reference.

BACKGROUND AND SUMMARY

The present application relates to a method for breakdown voltage enhancement and current collapse suppression in normally-off high electron mobility transistors ("HEMTs"), and in particular, to fabrication of aluminum-gallium nitride/gallium nitride ("AlGaN/GaN") HEMTs using electrode-less drain-side surface field engineering, resulting in a "Low Density Drain" HEMT.

Excessive electric field can create problems in semiconductor devices. (One type of problem is hot carriers, where sufficiently energetic electrons or holes become able to travel through dielectrics; another type of problem is avalanching, where conduction becomes uncontrolled.) Even in devices designed to operate at minimal logic voltages, it is important to ensure that the voltage does not change too sharply at the drain boundary; and in devices which are intended to switch higher voltages, it becomes increasingly necessary to minimize the peak electric field.

Drain engineering has been one of the longest-running sub-areas of integrated device development, going back to the original LDD proposal of 1974. See Blanchard, "High Voltage Simultaneous Diffusion Silicon-Gate CMOS," 9 IEEE J.S.S.C. 103 (1974). Many techniques have been used to control peak electric field in high-voltage devices, often including various configurations of field plates and non-current-carrying diffusions.

This long-standing development challenge has particular relevance to the relatively new area of enhancement-mode ("E-mode") III-N HEMTs. Normally-off AlGaN/GaN HEMTs are desirable for microwave power amplifier and power electronics applications because they offer simplified circuit configurations and favorable operating conditions for device safety. However, the normally-off AlGaN/GaN HEMTs usually exhibit lower maximum drain current compared to their normally-on counterparts, especially when the threshold voltage is increased to about +1 V to assure the completer turn-off of the 2DEG channel at zero gate bias and provide additional operating safety. To compensate the reduction in maximum current and achieve the same power handling capability, the breakdown voltage ($V_{BK}$) needs to be further improved, but preferably not at the cost of increased gate-to-drain distance (which inevitably increases the device size). The use of a field-plate, connected to the gate or source electrodes, can effectively enhance $V_{BK}$ by modifying the surface field distribution. The gate-terminated field plate, however, can introduce additional gate capacitances ($C_{GS}$ and $C_{GD}$), which reduce the devices' gain and cutoff frequencies. A source-terminated field plate has been used for achieving enhanced $V_{BK}$ and mitigating the gain reduction, but this required a thick dielectric layer between the gate and field plate.

A problem in GaN devices has been the current collapse phenomenon: when the source-drain voltage reaches a level at which impact ionization can occur, the maximum current carried by the device can actually decrease. It has been suggested that this undesirable effect is due to a trapping phenomenon in which mid-gap states are populated by hot electrons.

Low Density Drain HEMTs

The present application discloses new approaches to the control of an electric field in a field effect transistor. Methods and devices are disclosed for fabrication of an HEMT modifying the surface field distribution between the gate and drain of a normally-off HEMT. Part or all of the region between gate and drain can be transformed into a region with low density of 2DEG using a $CF_4$ plasma treatment, forming a Low-Density Drain ("LDD") HEMT. The off-state breakdown voltage can be improved and current collapse can be completely suppressed in LDD-HEMTs with no significant degradation in gains and cutoff frequencies.

The disclosed innovations, in various embodiments, provide one or more of at least the following advantages:

Allows for modification of the surface field distribution in normally-off HEMTs without the use of a field plate electrode.
Asymmetric modification to drain side only is easily achieved.
No change in topology is required: the additional fixed charge introduced into the wide-bandgap barrier layer does not affect physical topology.
Provides for enhanced breakdown voltage and suppressed current collapse without degradation in gains or cutoff frequencies.
Does not add any additional process steps to those already required for enhancement+depletion III-N fabrication.
Surface state trapping and de-trapping is reduced or prevented.
Current collapse is reduced or prevented.

BRIEF DESCRIPTION OF THE DRAWINGS

The disclosed innovations will be described with reference to the accompanying drawings, which show important sample embodiments of the present innovations and which are incorporated in the specification hereof by reference, wherein:

FIG. 1B shows a DCFL circuit for a ring oscillator.

FIG. 1C shows a photomicrograph of an inverter as one embodiment of the present innovations.

FIG. 4B shows $I_g$-$V_{gs}$ characteristics for one embodiment of an E-mode AlGaN/GaN HFET.

FIG. 8B shows the $g_m$ versus $V_{gs}$ transfer characteristics of E-mode AlGaN/GaN HFETs after different $CF_4$ plasma-treatment conditions.

FIG. 9 shows the extracted barrier heights and ideality factors of gate Schottky diodes with different $CF_4$ plasma treatments.

FIG. 12B shows the DC $g_m$ versus $V_{gs}$ transfer characteristics for various E-mode AlGaN/GaN HFET embodiments.

FIG. 16 shows on-wafer measured $f_t$ and $f_{max}$ with different $CF_4$ plasma treatments.

FIGS. 17A through 17F show a sample process of fabricating an E-mode $Si_3N_4$AlGaN/GaN MISHFET.

FIG. 34 show sample geometry parameters for inverters and ring oscillators.

FIG. 36 shows performances of fabricated E- and D-mode AlGaN/GaN HEMTs.

FIG. 40 shows noise margins for inverters with different beta values.

FIG. 42 show noise margins measured at different $V_{DD}$'s for an inverter with $\beta$=10.

DETAILED DESCRIPTION OF THE PREFERRED EMBODIMENTS

The numerous innovative teachings of the present application will be described with particular reference to the presently preferred embodiment (by way of example, and not of limitation).

The present application presents a simple way to modify the surface field distribution between the gate and drain without using a field plate electrode. The field modification is achieved by turning part or all of the region between gate and drain into a region with low density of 2DEG, effectively forming Low-Density Drain ("LDD"). With the same device dimensions, the off-state breakdown voltage $V_{BK}$ improves from 60 V in an HEMT without LDD to over 90 V in a device with LDD. No degradation in $f_t$ and slight improvement of power gain and $f_{max}$ were observed in the LDD-HEMT. In addition, current collapse can be completely suppressed in the LDD-HEMTs.

EXAMPLE

Figure 47:
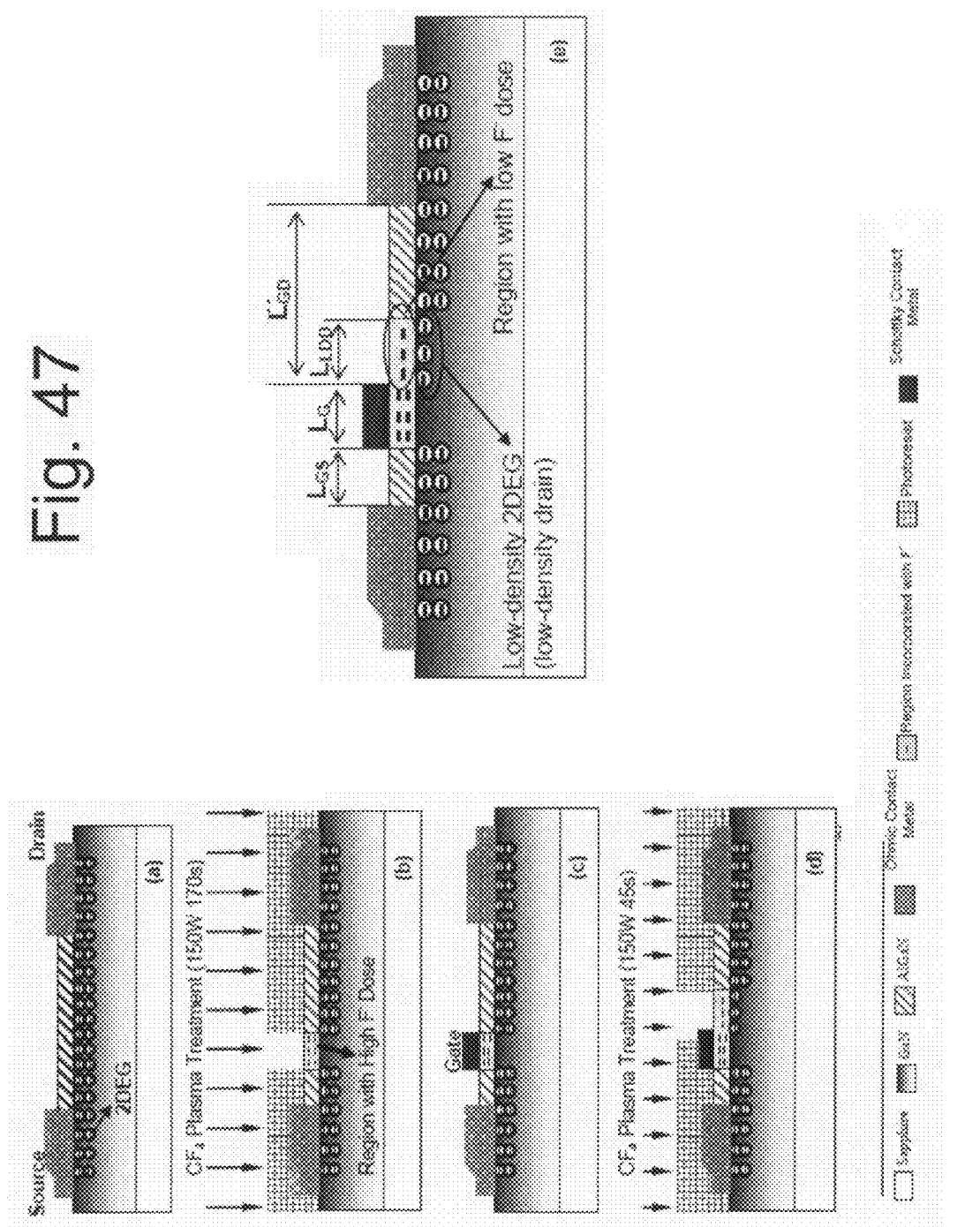
FIG. 47 shows the process flow for fabrication of an LDD-HEMT according to one embodiment of the present innovations.
Figure 47A:
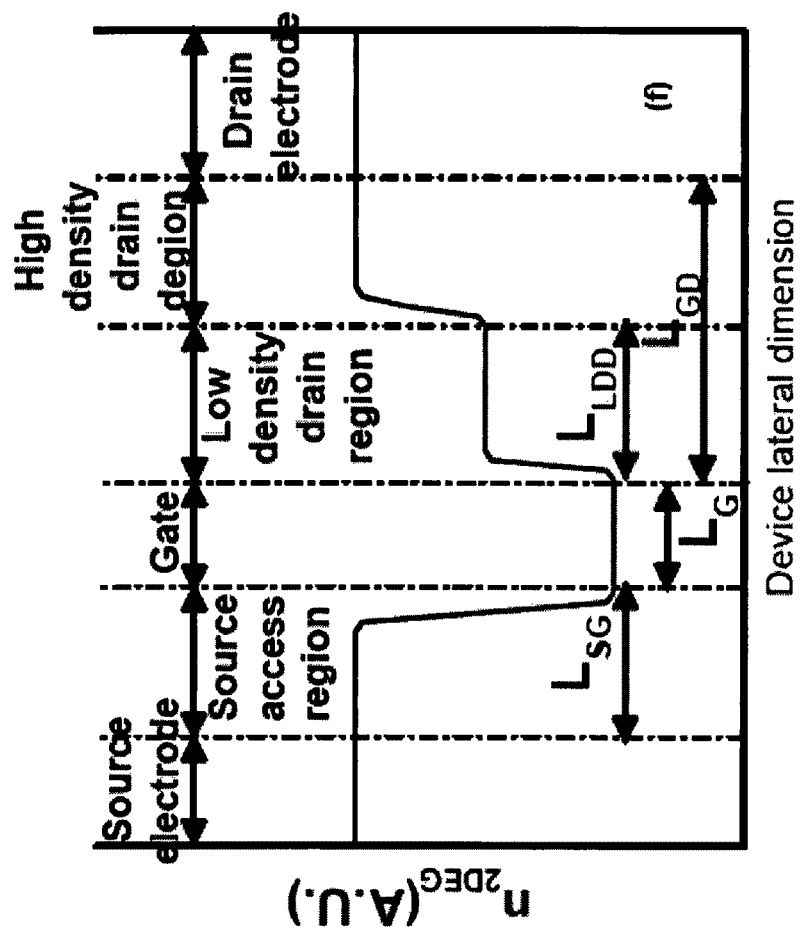
FIG. 47A shows the 2DEG for an LDD-HEMT according to one embodiment of the present innovations.

An AlGaN/GaN LDD-HEMT was fabricated according to the process shown in FIGS. 47A through 47F. The epitaxial structure and device fabrication flow of the LDD-HEMTs on sapphire substrate are similar to the process used for FIG. 3, except one additional step shown in FIG. 47D, that defines the LDD region at the end of the device process. After the windows of low-density drain region are defined, a $CF_4$ plasma treatment under an RF source power of 150 W is applied for 45 seconds. The sample was then annealed at 400° C. for 10 minutes. FIG. 47E shows the cross-section of a finished LDD-HEMT. The gate length ($L_G$) at 1 μm and the gate-source spacing ($L_{GS}$) at 1 μm. The gate-drain spacing ($L_{GD}$) was chosen to be either 1 μm or 3 μm. The length of the low-density drain region ($L_{LDD}$) is 0.5 μm and 1 μm for devices with 1 μm $L_{GD}$, and 0.5 μm, 1 μm, 1.5 μm, 2 μm and 3 μm for devices with 3 μm $L_{GD}$. A schematic sketch of 2DEG density distribution in different regions of an LDD-HEMT is shown in FIG. 47F. For comparison testing, conventional HEMT devices with $L_{LDD}=0$ were also fabricated on the same wafer.

Fluorine ions incorporated in the AlGaN layer of the LDD region provide negative fixed charge which can modulate the surface electric-field and the 2DEG density, enabling the redistribution of the E-field and reduction of the peak field. The function of the LDD region is similar to a metal field plate in terms of improving the breakdown voltage, but without introducing any additional capacitances. Secondly, the fluorine ions incorporated in the AlGaN layer can effectively raise the energy band, effectively hindering the trapping and de-trapping process. Recent DLTS and photo-conductivity experiments have revealed that the incorporation of fluorine ions in the AlGaN layer is predominantly substitutional, with the fluorine atoms filling nitrogen vacancies in the AlGaN layer.

The incorporation of fluorine ions in the AlGaN layer is believed to be substitutional and the fluorine atoms can fill out the nitrogen vacancies in the AlGaN layer. Thus, the current collapse associated with the surface states and traps can also be suppressed by implementing the low-density drain.

Figure 48:
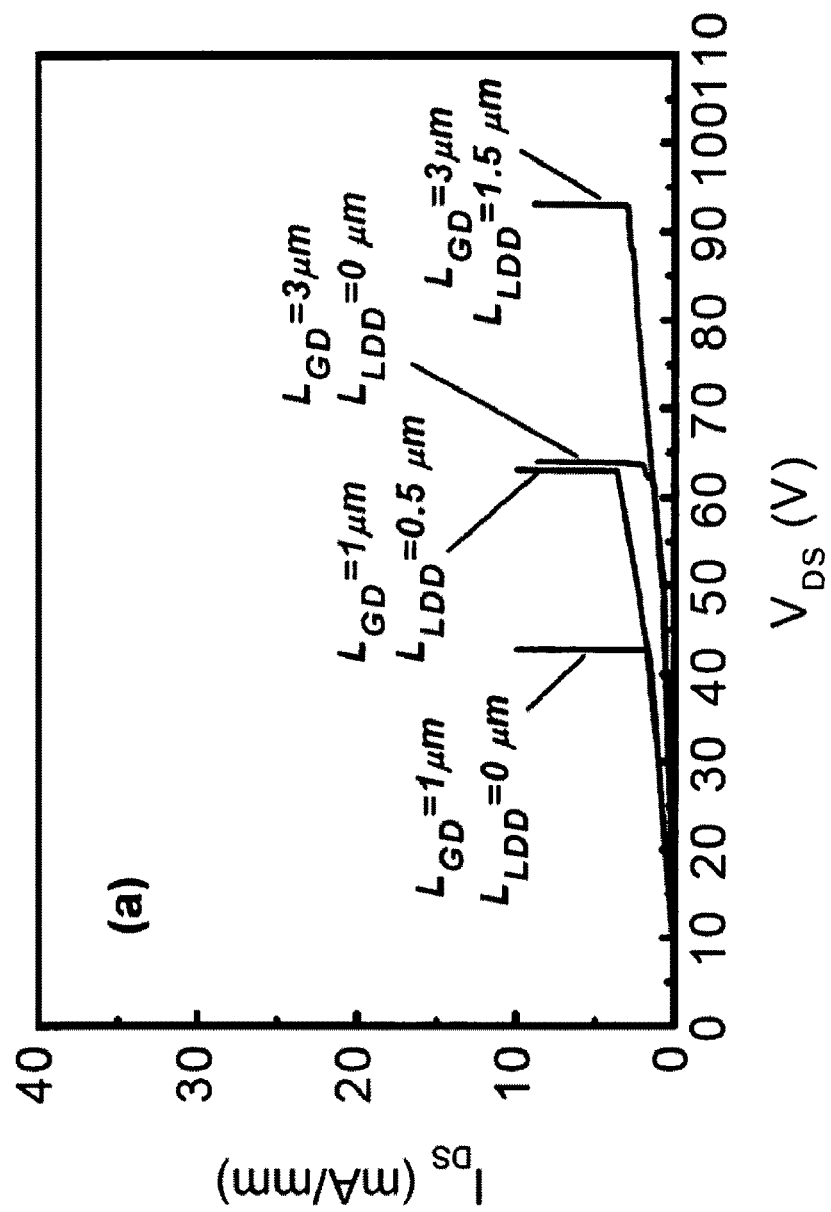
FIG. 48 shows off-state breakdown voltages of one embodiment of the present innovations.
Figure 49:
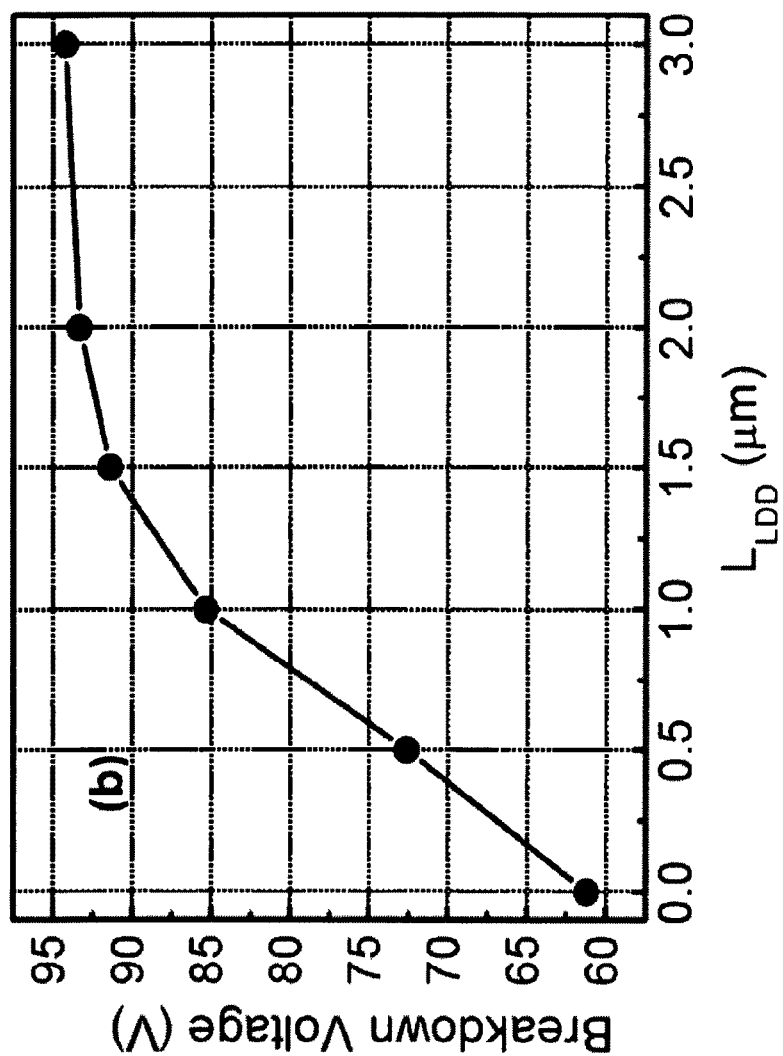
FIG. 49 shows breakdown voltage dependence on the length of the LDD region for a fixed gate-drain spacing $L_{GD}$=3 μm for multiple embodiments of the present innovations.
Figure 50:
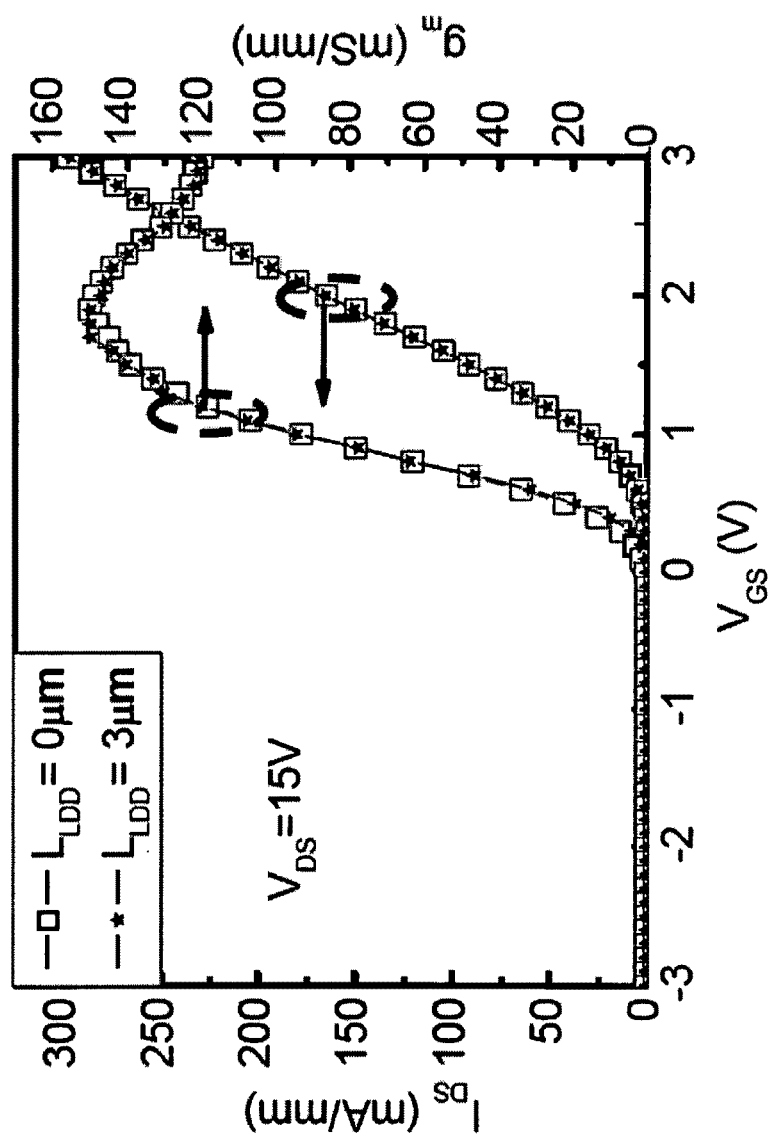
FIG. 50 shows DC transfer characteristics for one embodiment of the present innovations.
Figure 51:
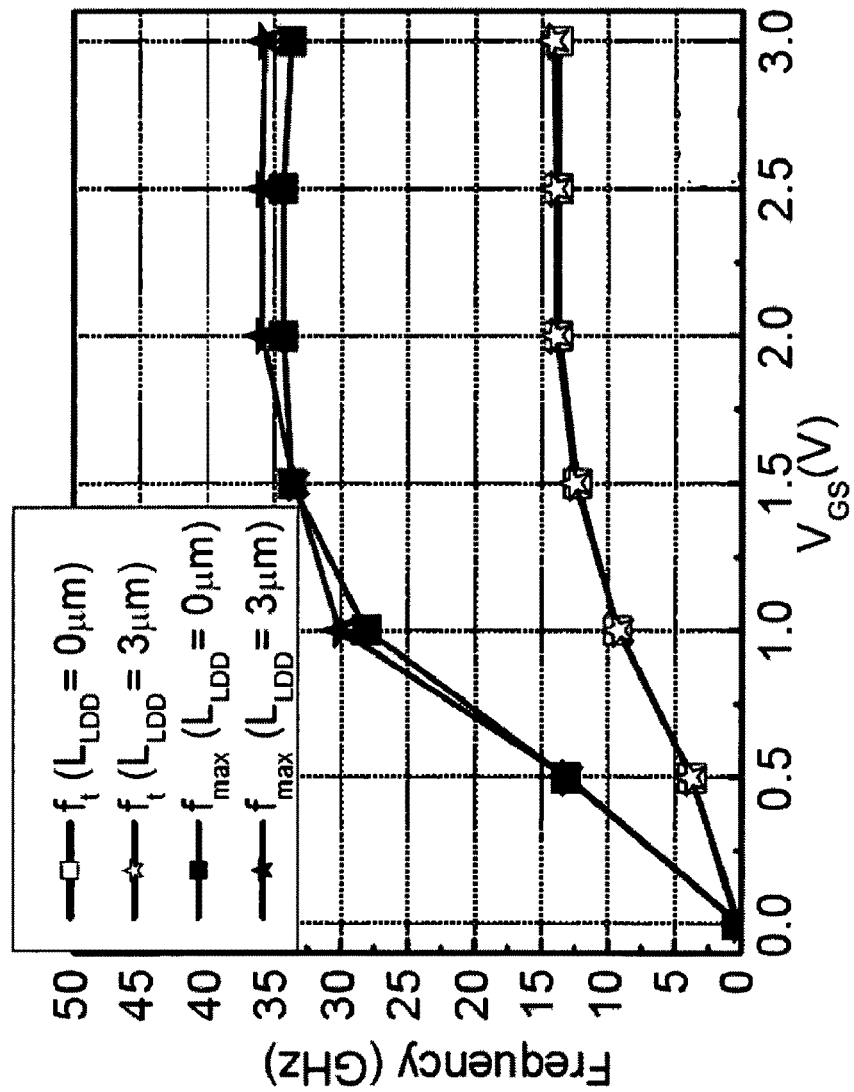
FIG. 51 shows cutoff frequencies for one embodiment of the present innovations.
Figure 52:
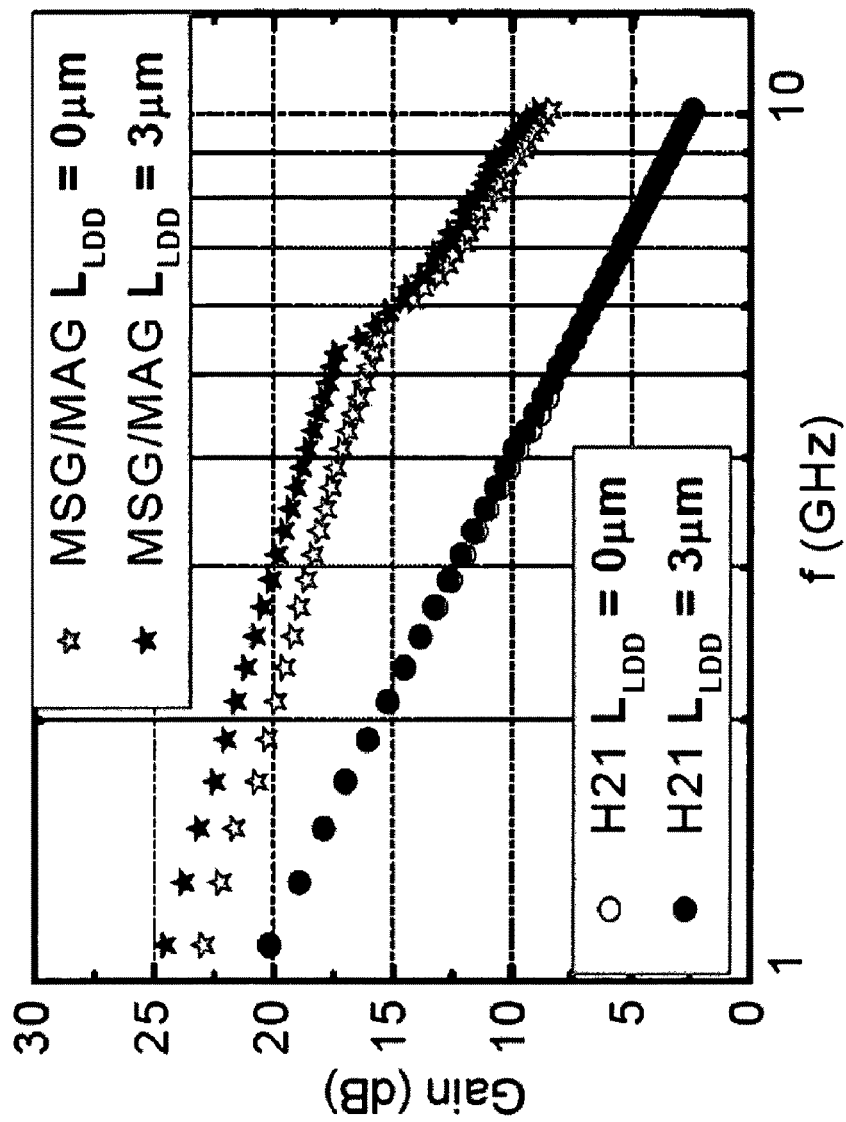
FIG. 52 shows $H_{21}$ and MSG/MAG for one embodiment of the present innovations.
Figure 53:
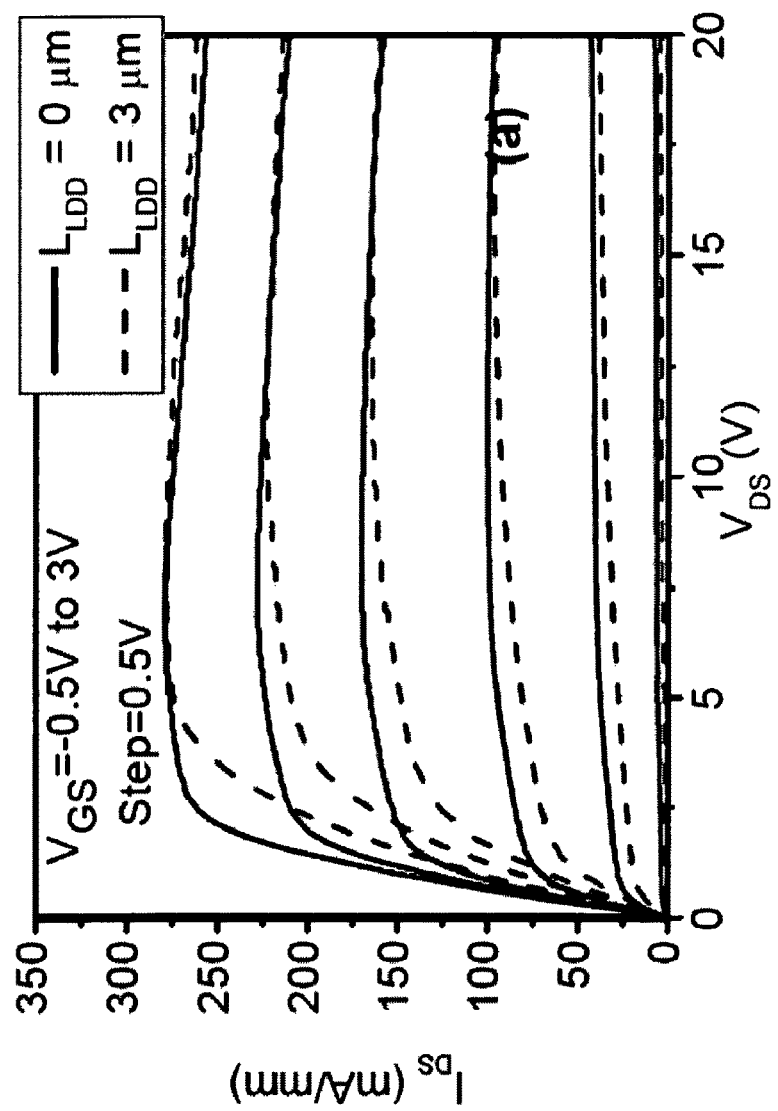
FIG. 53 shows the DC output curve of one embodiment of the present innovations.
Figure 54:
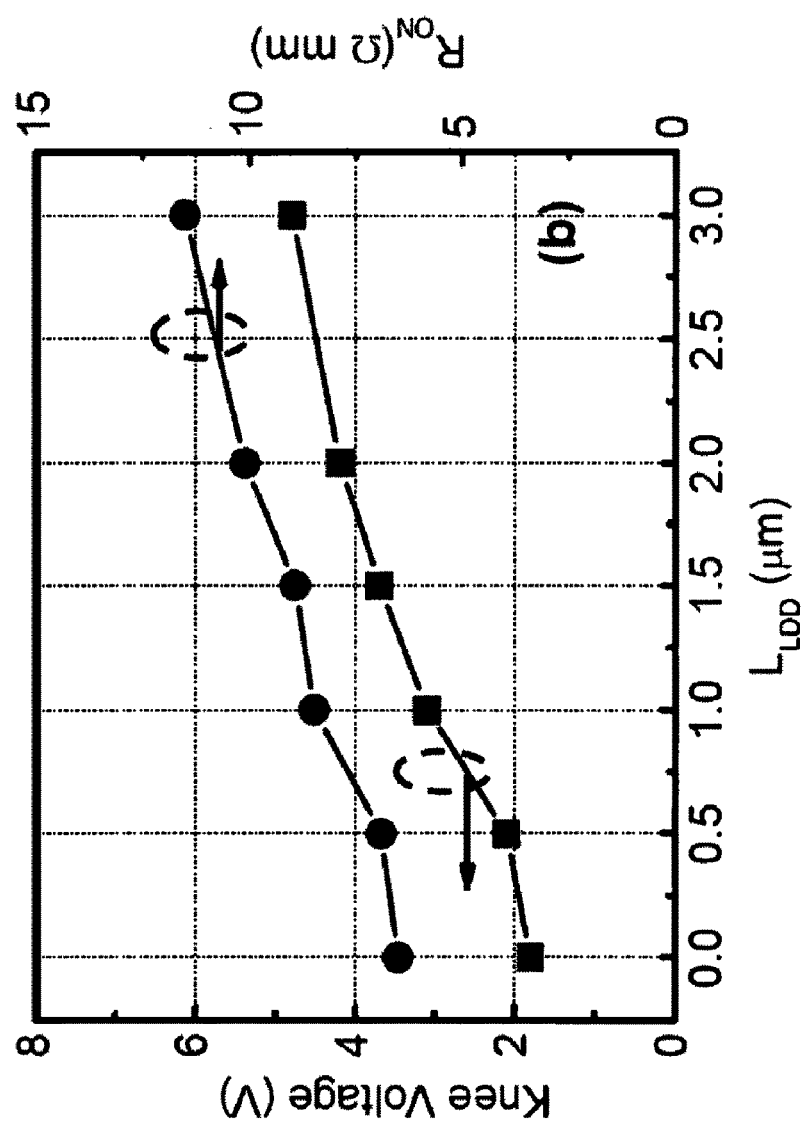
FIG. 54 shows on-resistance and knee voltages for multiple embodiments of the present innovations.
Figure 55:
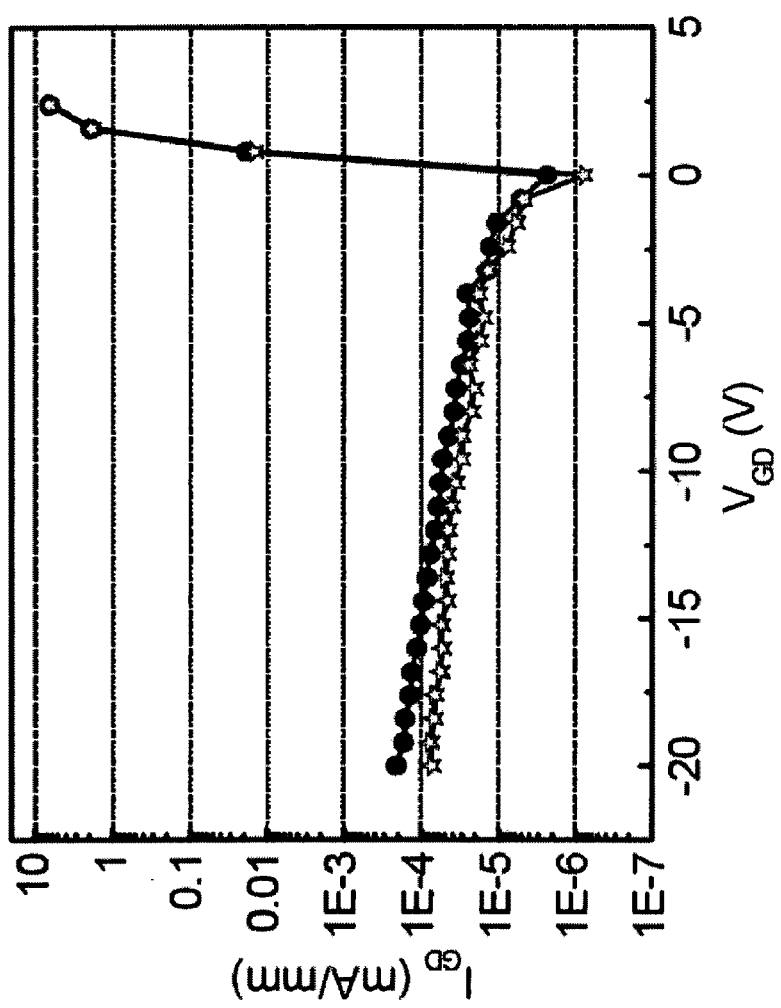
FIG. 55 shows gate-drain diode I-V characteristics for one embodiment of the present innovations.
Figure 56:
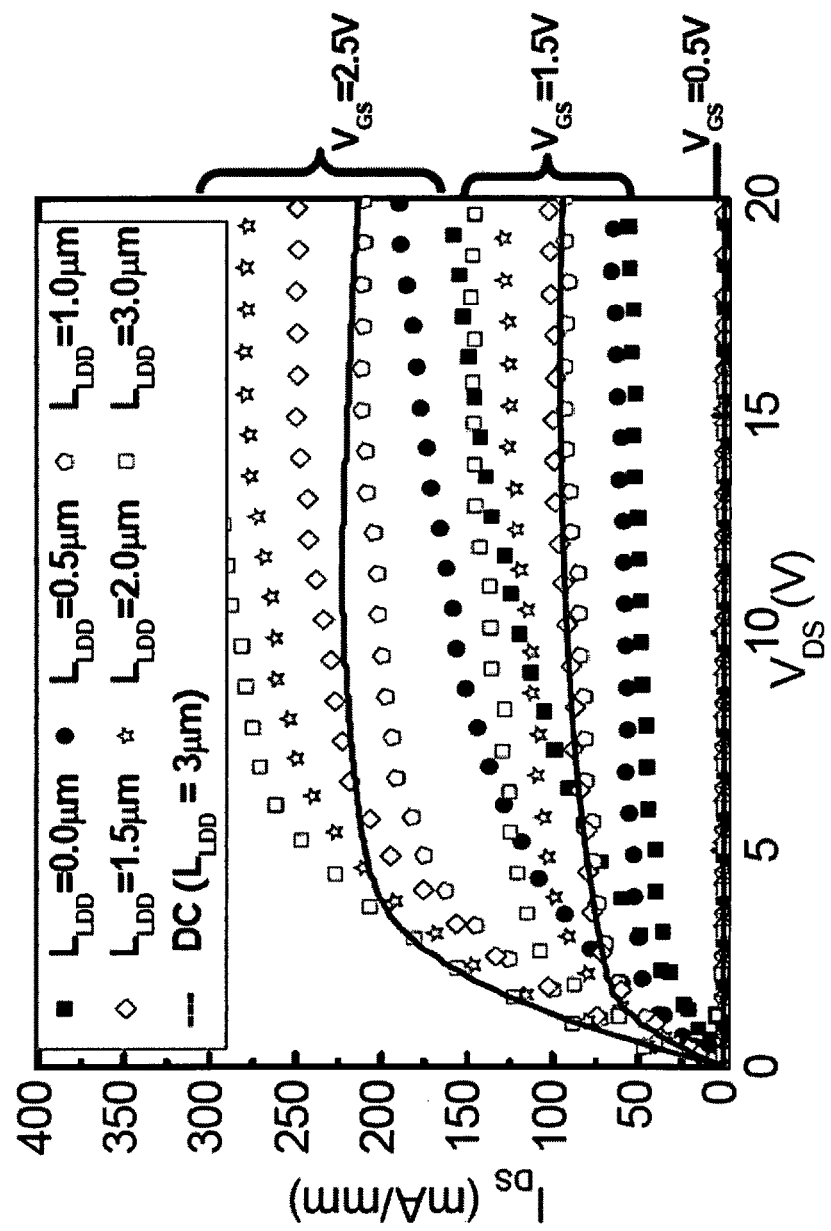
FIG. 56 shows DC and pulsed I-V characteristics for multiple embodiments of the present innovations.
Figure 57:
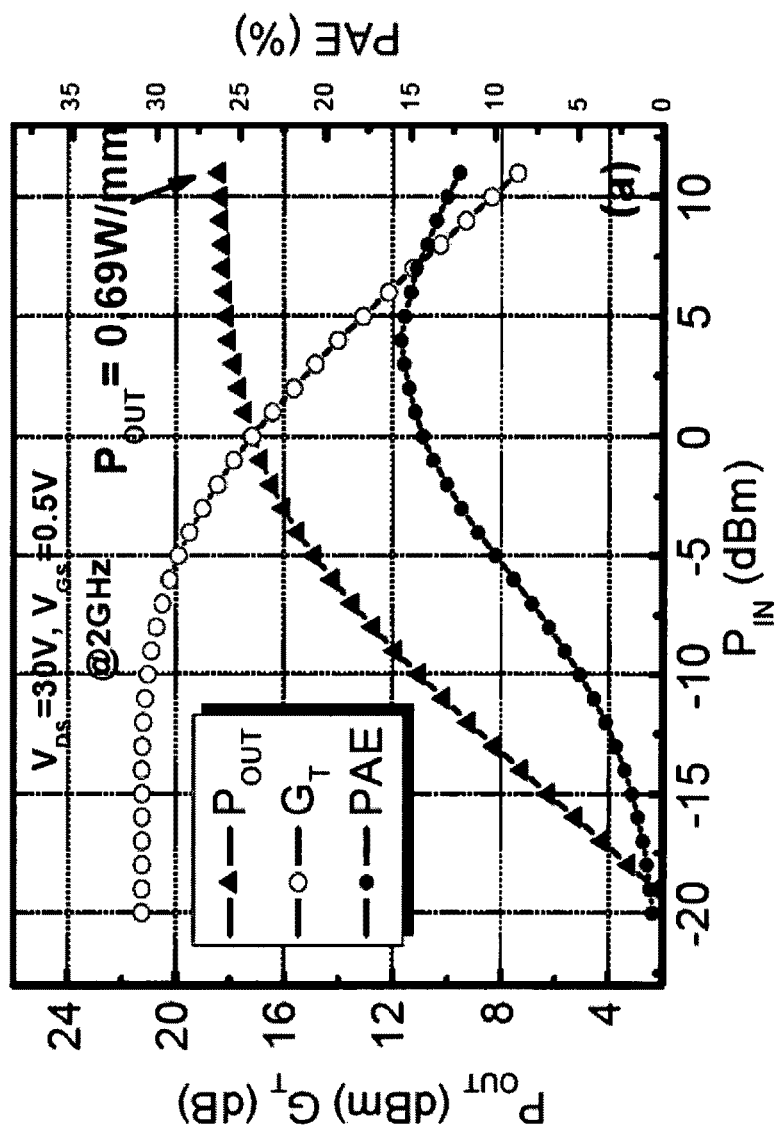
FIG. 57 shows large-signal power characteristics without the benefit of the present innovations.
Figure 58:
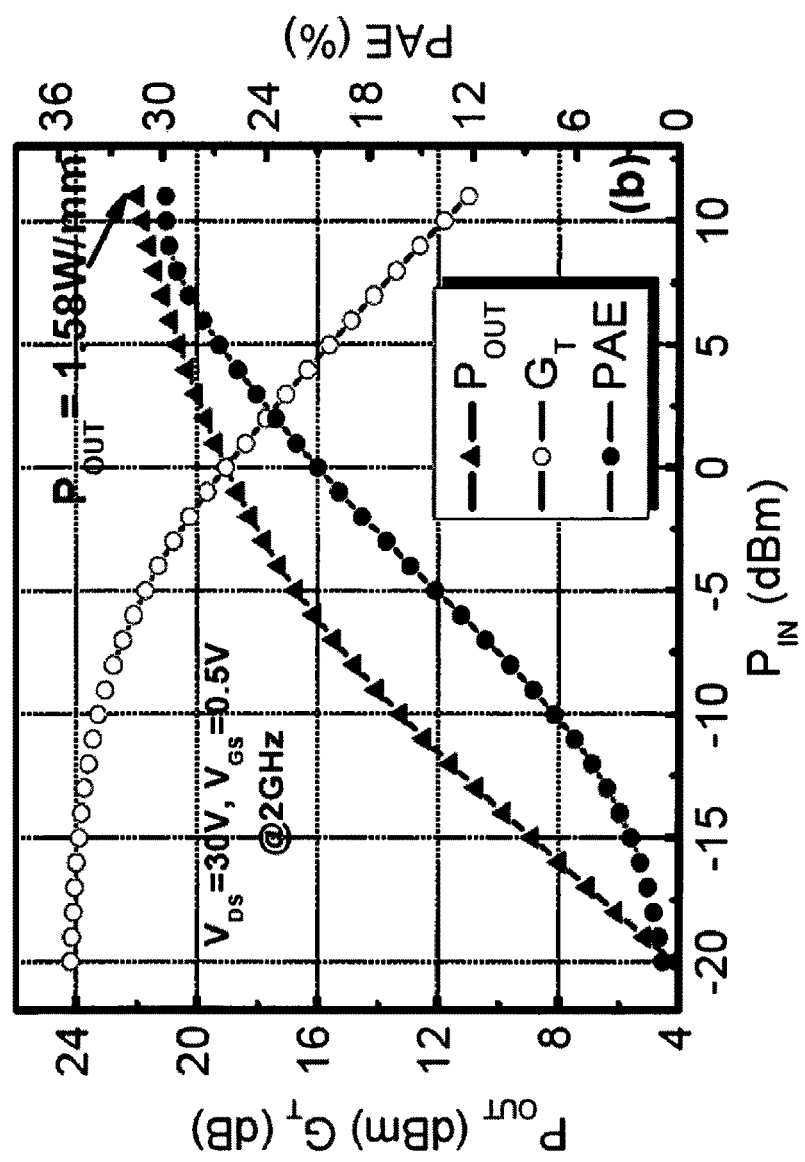
FIG. 58 shows large-signal power characteristics for one embodiment of the present innovations.

FIG. 48 shows the breakdown voltage enhancement in an LDD-HEMT. By converting half of the gate-to-drain region into a low-density region, a 50% increase is realized in $V_{BK}$. As shown in FIG. 48, the device with $L_{GD}=1$ μm and $L_{LDD}=0.5$ μm exhibits a breakdown voltage similar to that achieved in a bulkier device with $L_{GD}=3$ μm and $L_{LDD}=0$ μm (without the LDD). The dependence of $V_{BK}$ on $L_{LDD}$ is shown in FIG. 49. For devices with the same LGD=3 μm and different $L_{LDD}$ (0 or 3 μm), the same $V_{th}=0.75V$, $I_{MAX}=300$ mA/mm and $G_M=150$ mS/mm are obtained. As shown in FIGS. 50, 51, and 52, the LDD-HEMT shows no degradations in current gain and $f_t$, slight improvement in power gain (MSG/MAG) and $f_{max}$—a result of increased output resistance (RDS). The only penalty imposed on the LDD-HEMT is the increased on-resistance that results in a knee voltage increase of 2 V at most as shown in FIGS. 53 and 54, which is much smaller than the enhancement in $V_{BK}$ (<30 V). FIG. 55 shows that the reverse gate-drain leakage current at a bias of 20 V can be reduced from 25 μA/mm to 15 μA/mm in an LDD-HEMT, compared to a conventional device. FIG. 56 shows the DC and pulsed I-V characteristics and shows the passivation effect of fluorine ions with different $L_{LDD}$. With $L_{LDD}$ increasing, the current collapse is reduced, reaching a complete suppression when the gate-to-drain region is fully treated by the fluorine ions ($L_{LDD}=3$ μm). The comparison of large signal measurement is shown in FIGS. 57 and 58. Due to the current collapse, the maximum power of the conventional HEMT saturates at around 0.69 W/mm. The LDD-HEMT, with suppressed current collapse, exhibits a maximum power of 1.58 W/mm.

The LDD-HEMT structures and process described above can be integrated into an enhancement+depletion process which used patterned fluorine treatment of a wide-bandgap layer, as will now be described.

Figure 3A:
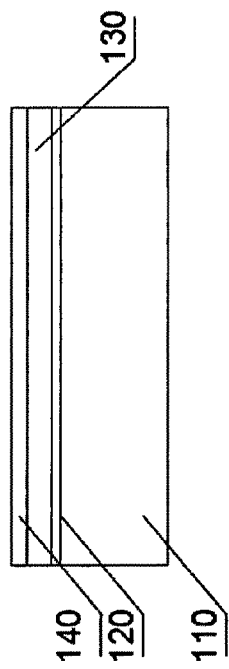
FIGS. 3A through 3F show one embodiment of a process of fabricating an E-mode AlGaN/GaN HFET.
Figure 3B:
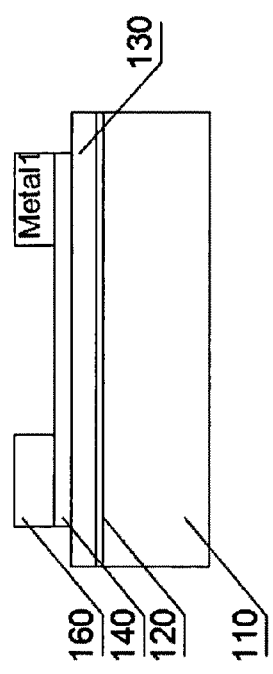
Figure 3C:
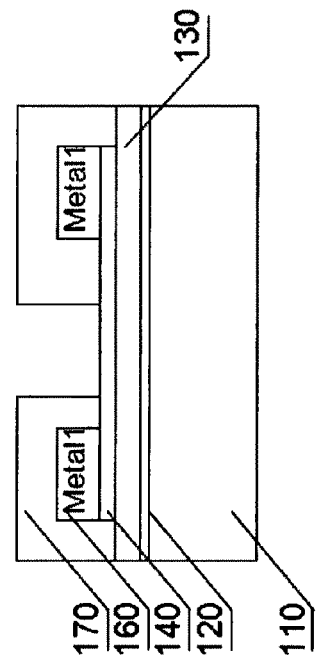
Figure 3D:
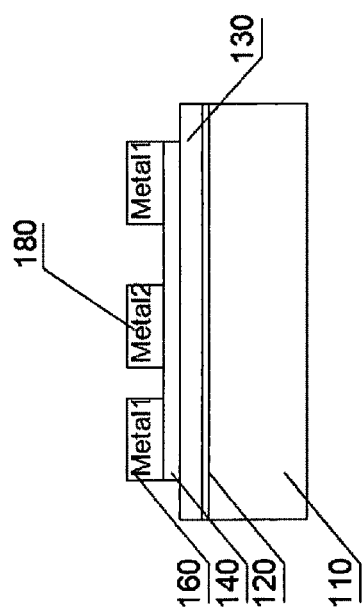
Figure 3E:
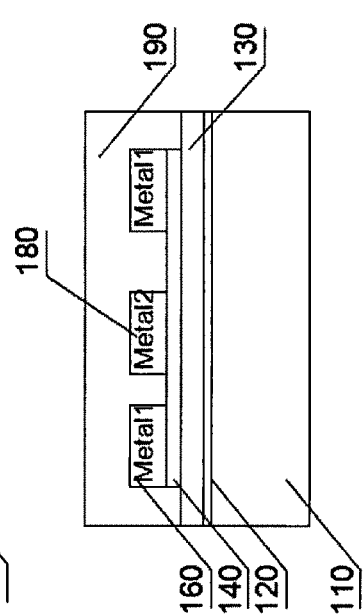
Figure 3F:
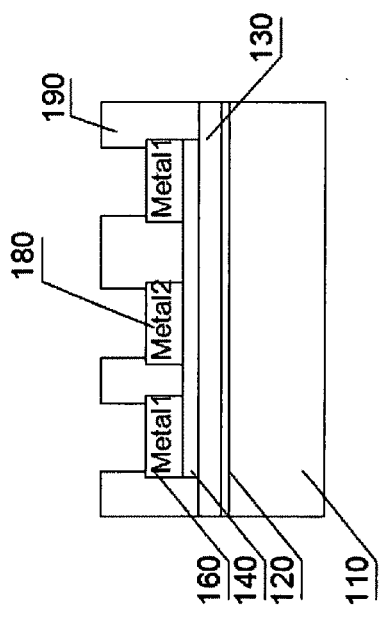

FIGS. 3A through 3F illustrate the process of fabricating an enhancement-mode III-nitride HFET according to a first embodiment of the present innovations. FIG. 3A illustrates a preferred epitaxial structure of the present innovations, where the reference numerals 110, 120, 130 and 140 denote substrate (e.g. sapphire, silicon or SiC), nucleation layer (low temperature grown GaN nucleation layer, AlGaN or AlN), high temperature-grown GaN buffer layer, and $Al_xGa_{1-x}N$ barrier layer including the modulation doped carrier supply layer. The manufacturing method of enhancement mode III-nitride HFET of one embodiment is described below. The mesa isolation is formed using $Cl_2$/He plasma dry etching followed by the source/drain ohmic contact formation 160 with Ti, Al, Ni and Au annealed at 850° C. For 45 seconds as shown in FIG. 3B. Next, photoresist 170 is patterned with the gate windows exposed. Then, the fluorine ions are incorporated into $Al_xGa_{1-x}N$ barrier layer by, for examples, either fluorine plasma treatment or fluorine ions implantation as shown in FIG. 3C. The gate electrode 180 is formed on the barrier layer 140 by depositing and lift-off Ni and Au as shown in FIG. 3D. Thereafter, post-gate RTA is conducted at 400-450° C. for 10 minutes. A passivation layer 190 is grown on the top of the wafer as shown in FIG. 3E. Finally, the contact pads are opened by removing portions of the passivation layer on the contact pads as shown in FIG. 3F.

EXAMPLE

An AlGaN/GaN HEMT structure was grown on a (0001) sapphire substrate in an Aixtron AIX 2000 HT metal-organic chemical vapor deposition (MOCVD) system. The HEMT structure consists of a low-temperature GaN nucleation layer, a 2.5-m-thick unintentionally doped GaN buffer layer and an AlGaN barrier layer with nominal 30% Al composition. The barrier layer consists of a 3-nm undoped spacer, a 15-nm carrier supplier layer dopes at $2.5\times10^{18}$ $cm^{-3}$, and a 2-nm undoped cap layer. Room temperature Hall measurements of the structure yield an electron sheet density of $1.3\times10^{13}$ $cm^{-2}$ and an electron mobility of 1000 $cm^2$/Vs. The device mesa was formed using $Cl_2$/He plasma dry etching in an STS ICP-RIE system followed by the source/drain ohmic contact formation with Ti/Al/Ni/Au annealed at 850° C. for 45 seconds. The ohmic contact resistance was typically measured to be 0.8 ohm-mm.

After gate windows with 1 nm length were opened by contact photolithography, the sample was treated by $CF_4$ plasma in an RIE system at an RF plasma power of 150 W for 150 seconds. Pressure of the treatment is typically 50 mTorr. The typical depth distribution profile of the fluorine ions thus incorporated via the treatment is Gaussian, and the typical depth when the fluorine concentration drops from the peak by one order of magnitude is 20 nm. Note that ion implantation is another method for incorporating the fluorine ions, and it is estimated that an energy of about 10 KeV would be required.

Ni/Au electron-beam evaporation and liftoff were carried out subsequently to form the gate electrodes. The plasma treated gate region and the gate electrode were self-aligned. Post-gate RTA was conducted at 400° C. for 10 minutes. This RTA temperature was chosen because RTA at temperatures high then 500° C. can degrade both the gate Schottky contact and the source/drain ohmic contacts. The devices have a source-gate spacing of $L_{sg}$=1 μm and a gate-drain spacing of $L_{gd}$=2 μm. D-mode HEMTs were also fabricated on the same sample without plasma treatment to the gate regions.

Figure 2:
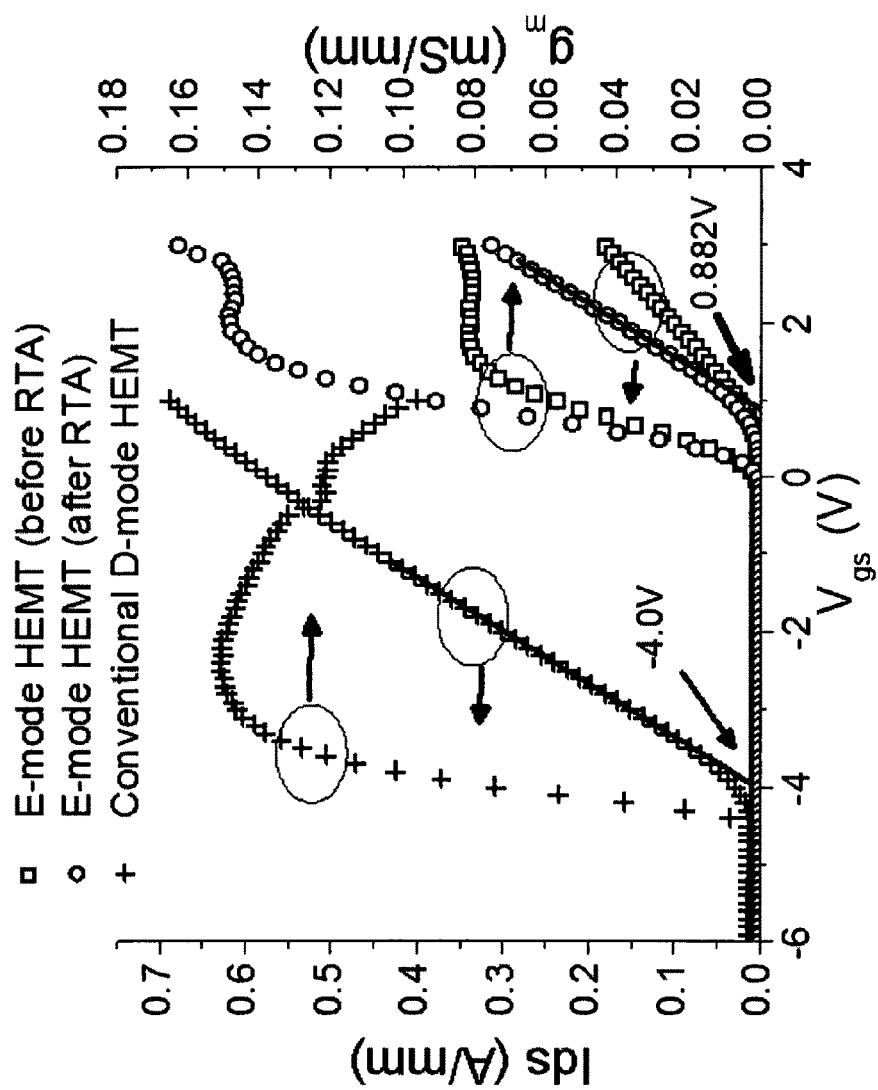
FIG. 2 shows transfer characteristics of a conventional D-mode HEMT, an E-mode HEMT without the benefit of the present innovations, and one embodiment of the present innovations.
Figure 4A:
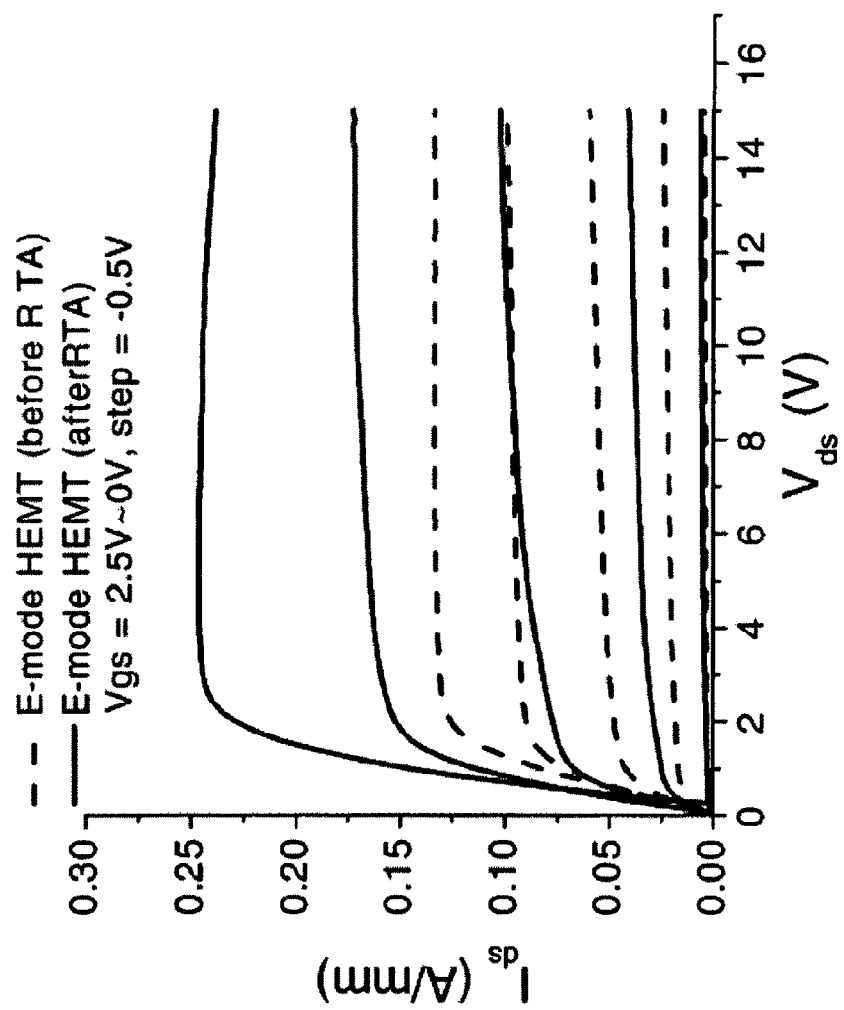
FIG. 4A shows I-V output characteristics for one embodiment of an E-mode AlGaN/GaN HFET.

FIG. 2 shows the transfer characteristics of both DE-mode and E-mode (before and after post-gate annealing) AlGaN/GaN HEMTs. Defining $V_{th}$ as the gate bias intercept of the linear extrapolation of drain current at the point of peak transconductance ($g_m$), the $V_{th}$ of the E-mode device was determined to be 0.9 V, while the $V_{th}$ of the D-mode device is −4.0 V. More than 4 V of $V_{th}$ shift was achieved by the plasma treatment. At $V_{gs}$=0, the transconductance reaches zero, indicating a true E-mode operation. The drain current is well pinched-off and shows a leakage of 28 μA/mm at $V_{ds}$=6 V, the smallest value reported up to date for E-mode AlGaN/GaN HEMTs. The peak $g_m$ is 151 mS/mm for the D-mode HEMT and 148 mS/mm for the E-mode HEMT, respectively. The maximum drain current ($I_{max}$) reaches 313 mA/mm at the gate bias ($V_{gs}$) of 3 V for the E-mode HEMT. Comparison of the current-voltage (I-V) characteristics of E-mode device before and after RTA suggests that RTA at 400° C. for 10 minutes plays an important role in recovering the damages induced during the plasma treatment and achieving high current density and transconductance. FIG. 4A shows the output curves of the E-mode device before and after the RTA process. No change in threshold voltage was observed after the RTA. At a $V_{gs}$ of 2.5 V, the saturation drain current (247 mA/mm) of E-mode device after RTA of 400° C. is 85% higher than that (133 mA/mm) before RTA, and the knee voltage of the E-mode device with RTA is 2.2 V, where the drain current is 95% saturation drain current. The off-state drain breakdown voltage at $V_{gs}$=0V is larger than 80 V, showing no degradation compared to that observed in the D-mode HEMTs. FIG. 4B shows $I_g/V_{gs}$ curves of these three devices. Lower gate leakage currents were achieved for E-mode HEMT, especially after RTA.

Figure 5:
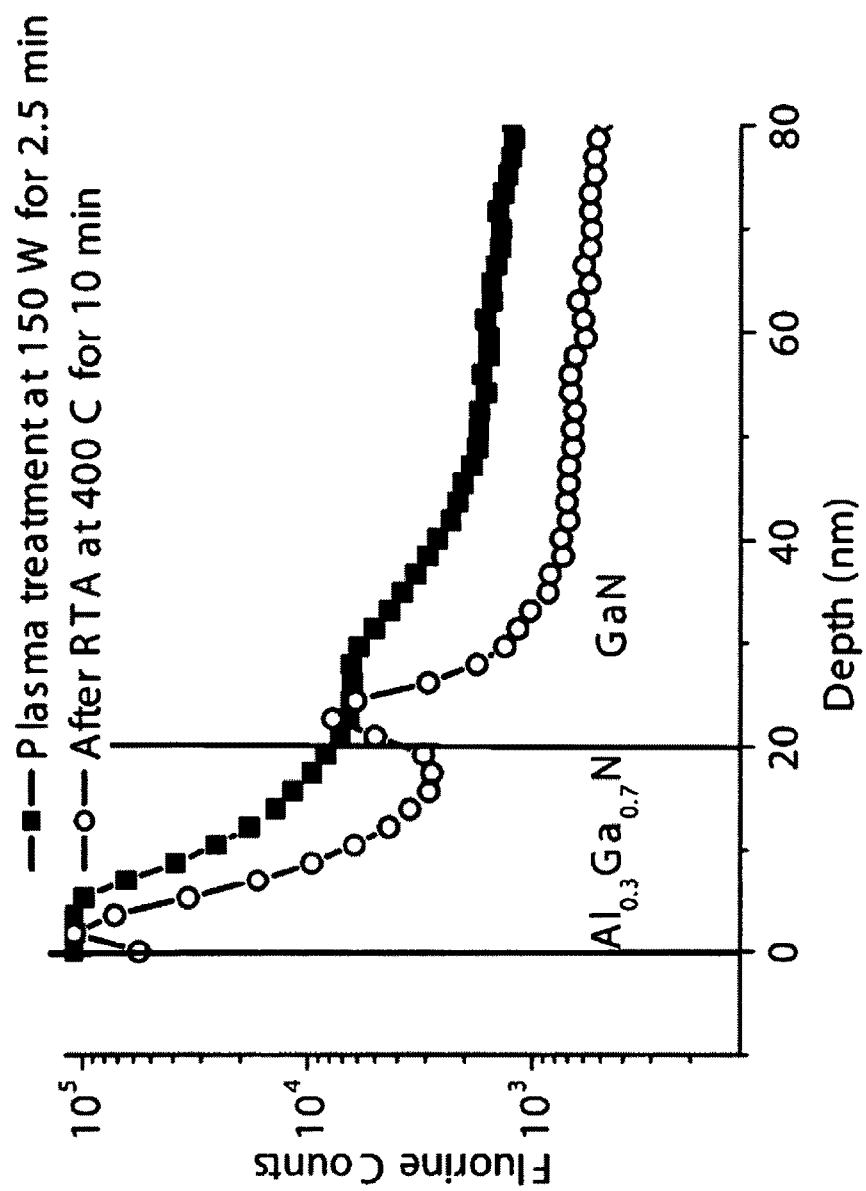
FIG. 5 shows fluorine ion concentration profiles as measured by "SIMS" for one embodiment of an E-mode AlGaN/GaN HFET.
Figure 6:
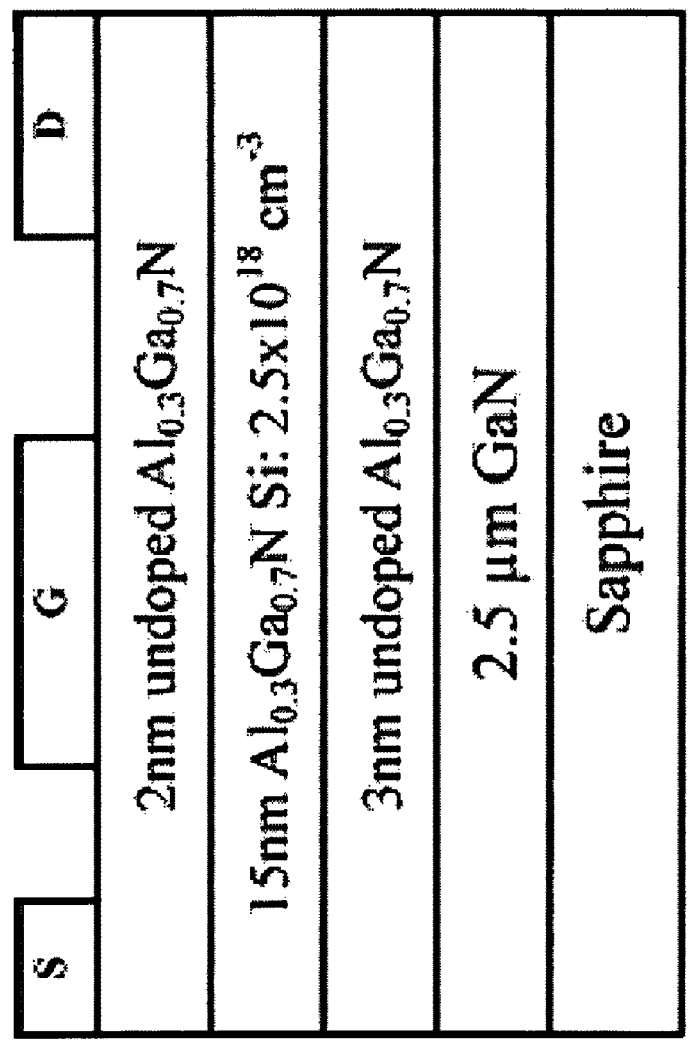
FIG. 6 shows the cross section of one embodiment of the present innovations prior to implantation of fluorine ions.

In order to investigate the mechanisms of the $V_{th}$ shift by $CF_4$ plasma treatment, secondary ion mass spectrum (SIMS) measurements were carried out on accompanying samples to monitor the atomic composition changes of the $CF_4$ plasma treated AlGaN/GaN materials. In addition of Al, Ga, and N, significant amount of fluorine atoms were detected in the plasma treated sample. FIG. 5 shows the fluorine atom concentration profile of the sample treated at a $CF_4$ plasma power of 150 W for 2.5 minutes. The concentration of fluorine atoms is the highest near the AlGaN surface and drops by one order of magnitude in the channel. It can be deduced that the fluorine ions produced by the $CF_4$ plasma were incorporated into the sample surface, similar to the effects of plasma immersion ion implantation ("PIII"), a technique developed to realize ultra-shallow junctions in advanced silicon technology. Because of the strong electro-negativity of the fluorine ions, the incorporated fluorine ions can provide immobile negative charges in the AlGaN barrier and effectively deplete the electrons in the channel. With enough fluorine ions incorporated in the AlGaN barrier, the D-mode HEMT can be converted to an E-mode HEMT. The $CF_4$ plasma treatment can result in a threshold voltage shift as large as 4.9 V. After RTA at 400° C. for 10 minutes, the peak fluorine atom concentration near the AlGaN surface is unchanged while that around the AlGaN/GaN interface experiences more significant reduction. It should be noted, however, SIMS measurement results from different runs do not offer accurate quantitative comparison because of the lack of reference criterion. Nevertheless, the minute change in $V_{th}$ before and after RTA indicates that the total number of fluorine ions incorporated into the AlGaN barrier is near constant before and after RTA, while the plasma damages are significantly recovered by the RTA. The lower gate reverse leakage currents of an E-mode HEMT can be attributed to an upward band bending of the AlGaN layer as a result of fluorine ion incorporation. After the RTA process, the defects at the interface of metal and AlGaN induced by $CF_4$ were recovered, leading to further suppression of gate leakage current. From the atomic force microscopy ("AFM") measurement conducted on a patterned sample, it was observed that the plasma treatment only results in a 0.8 nm reduction in the overall AlGaN barrier layer (20 nm thick).

On-wafer small-signal RF characteristics of D-mode and E-mode AlGaN/GaN HEMTs were measured from 0.1 to 39.1 GHz. The current gain and maximum stable gain/maximum available gain (MSG/MAG) of both types of devices with 1 μm-long gate were derived from measured S-parameters as a function of frequency, as shown in FIG. 5. At $V_{ds}$=12 and $V_{gs}$=1.9 V, a current gain cutoff frequency ($f_T$) of 10.1 GHz and a power gain cutoff frequency ($f_{MAX}$) of 34.3 GHz were obtained for the E-mode AlGaN/GaN HEMT, a little lower than that of its D-mode counterpart, whose and were measured at the drain bias of 12 V and gate bias of −3 V to be 13.1 and 37.1 GHz, respectively.

One advantage of the present innovations is that the E-mode HFET with fluorine ions incorporated in barrier layer can stand a larger gate bias (>3V) corresponding to a larger input voltage swing.

Also, thermal reliability testing has shown that the fluorine ion incorporation in the AlGaN barrier is stable up to 700° C. However, the Schottky contact, made of nickel, is only stable up to 500° C. Therefore, the application temperature range is up to 500° C. unless another Schottky contact technique is used. Tungsten gate is one possible candidate.

Figure 7:
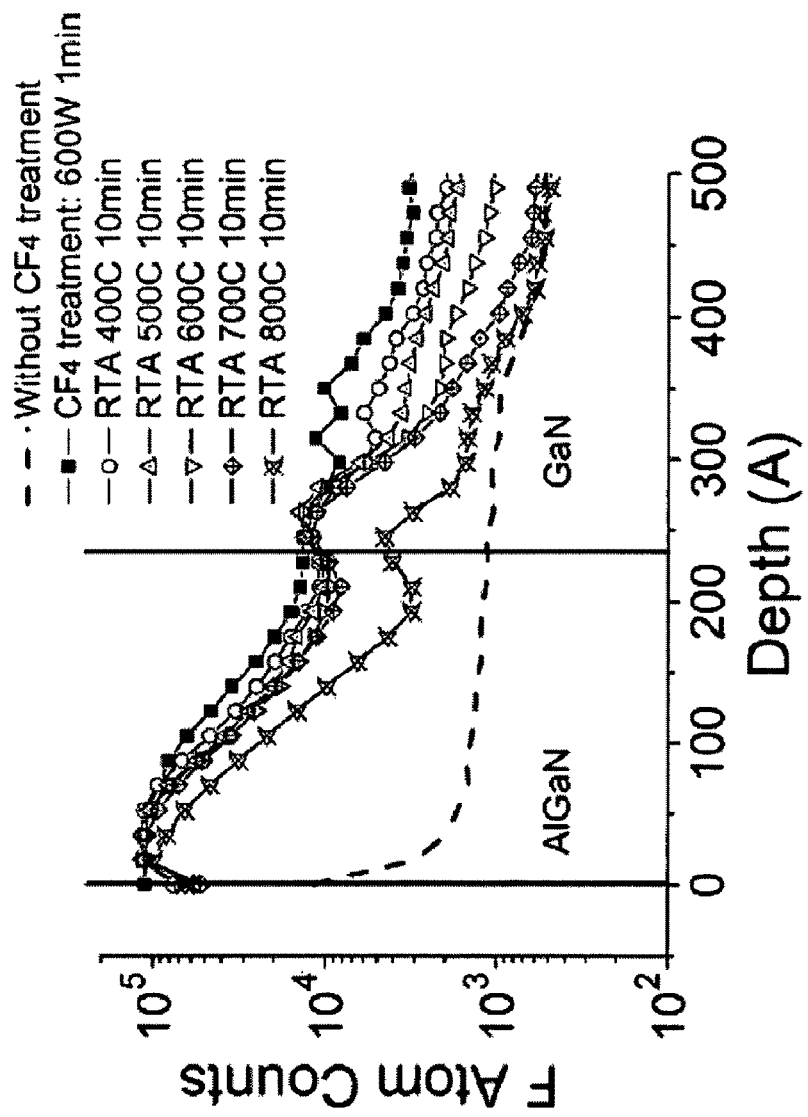
FIG. 7 shows fluorine ion concentration profiles as measured by "SIMS" for various embodiments.

In FIG. 7, the effect of different post-gate RTA's on the fluorine atoms' distributions in AlGaN/GaN heterostructures, as measured by SIMS, is shown. The untreated device is used as a reference.

It was found that the fluorine ions, which were incorporated into the AlGaN barrier layer by $CF_4$ plasma treatment, could effectively shift the threshold voltage positively. The fluorine ions' incorporation in the AlGaN layer was confirmed by secondary-ion-mass-spectrum (SIMS) measurements, as shown in FIG. 7. During $CF_4$ plasma treatment, fluorine ions are implanted into AlGaN/GaN heterostructure in a self-built electrical field stimulated by the RF power.

It is also concluded from the results shown in FIG. 7 that the implanted fluorine ions have a good thermal stability in the AlGaN layer up to 700° C. Deep-level transient spectroscopy ("DLTS") has been conducted on the HEMT samples treated by $CF_4$ plasma. The fluorine ions incorporated in the AlGaN barrier appear to introduce a deep-level state that is at least 1.8 eV below the conduction-band minimum. As a result, the fluorine ions are believed to introduce a negatively charged acceptor-like deep level in the AlGaN.

Note that in SIMS plots such as FIG. 7, it is difficult to make accurate calculation of concentration from SIMS measurement because the beam size is not known. However, based on the bandstructure and threshold voltage calculation, the peak value of the F concentration can be as high as about $1\times20$ cm$^{-3}$.

Figure 7A:
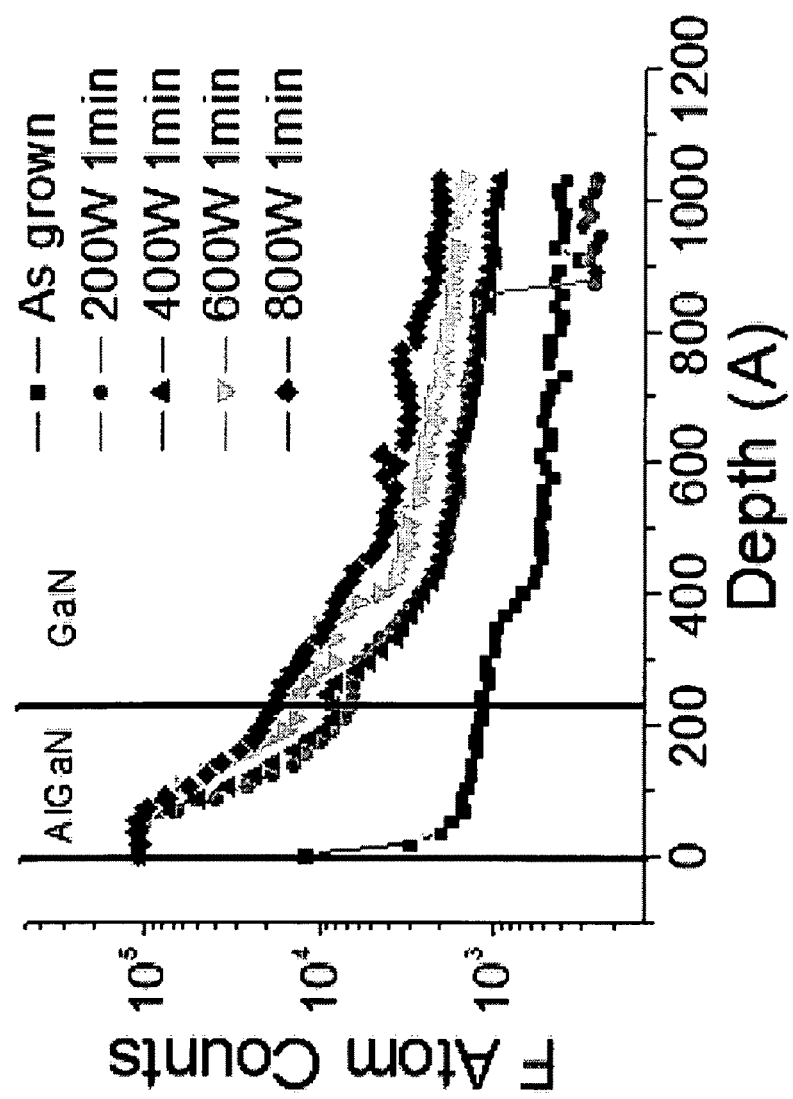
FIGS. 7A and 7B show fluorine ion concentration profiles as measured by "SIMS" for various embodiments.

In FIG. 7A, the effect of different plasma power levels without RTA on The fluorine atoms' distributions in AlGaN/GaN heterostructures, as measured by SIMS, is shown.

Note that the 200 W and 400 W lines show a "bump" at the interface between the AlGaN/GaN interface. During an incorporation process, the fluorine ions can fill up surface or interface states (or "traps"), producing "anomalous stopping". Therefore, this indicates there are more traps at the interface. Further, the 600 W and 800 W lines do not show the bump most likely because of the greater penetration depth and overall concentration.

Figure 7B:
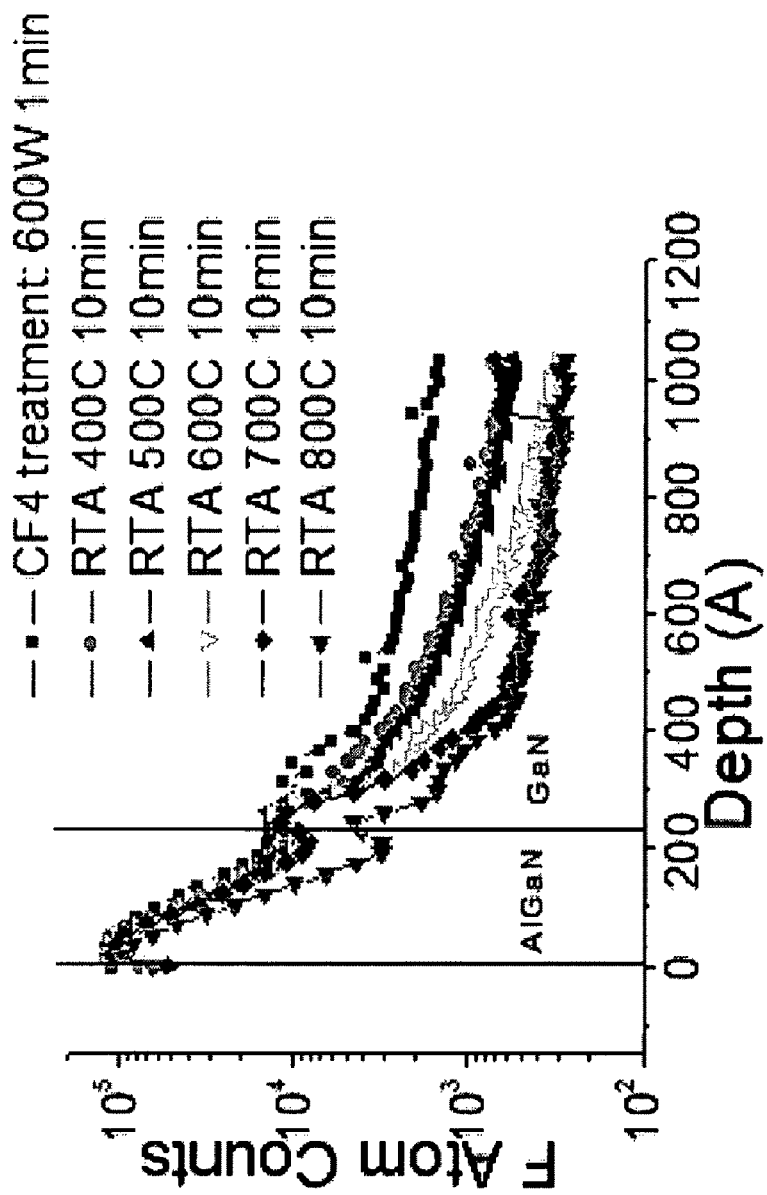

The untreated device is used as a reference. In FIG. 7B, the effect of different post-gate treatment temperatures at a fixed power of 600 W for RTA on the fluorine atoms' distributions in AlGaN/GaN heterostructures, as measured by SIMS, is shown. The untreated device is used as a reference. Note that the distributions in the AlGaN for 700° C. and below show a normal effect of root Dt, but the distribution in the AlGaN layer seems to reflect a very different diffusivity (or perhaps some other activation energy effect). Thus, the data indicates that fluorine ions are more stable in AlGaN than in GaN. Further, the binding energy can be higher, and the fluorine-related energy states are deeper below the conduction band in AlGaN than in GaN.

Figure 8A:
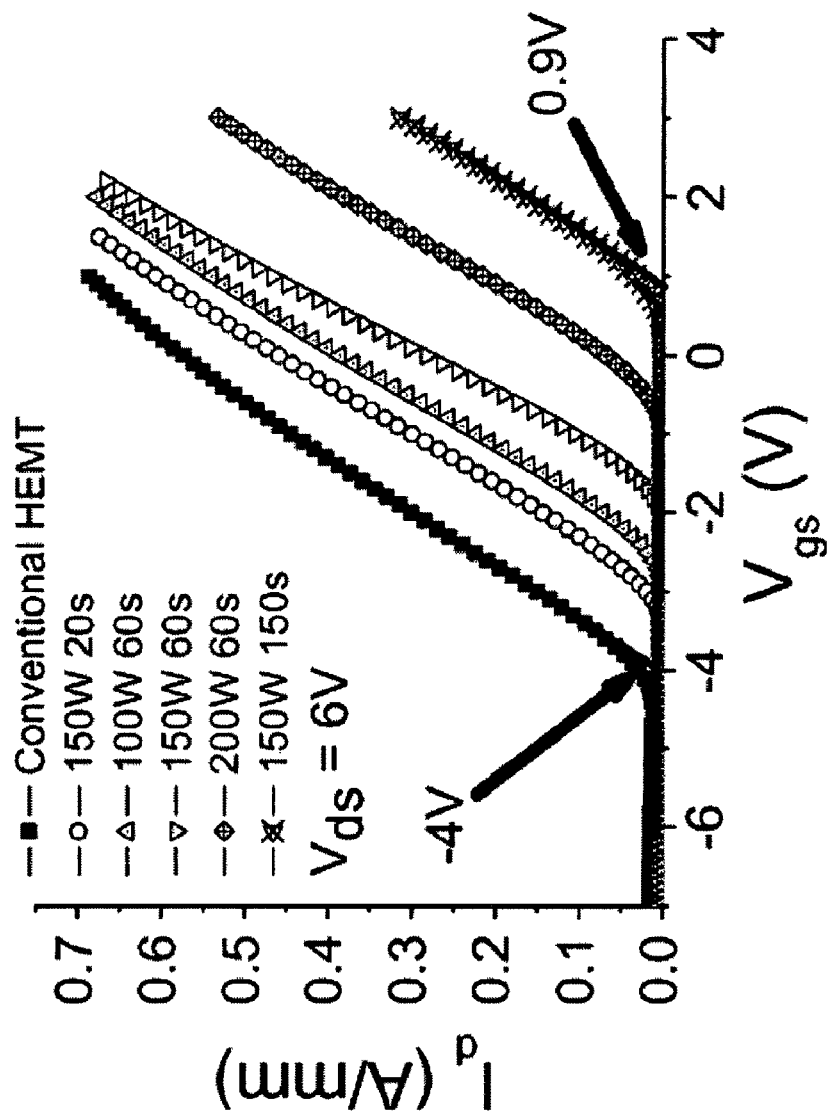
FIG. 8A shows the $I_d$ versus $V_{gs}$ transfer characteristics of E-mode AlGaN/GaN HFETs after different $CF_4$ plasma-treatment conditions.
Figure 10:
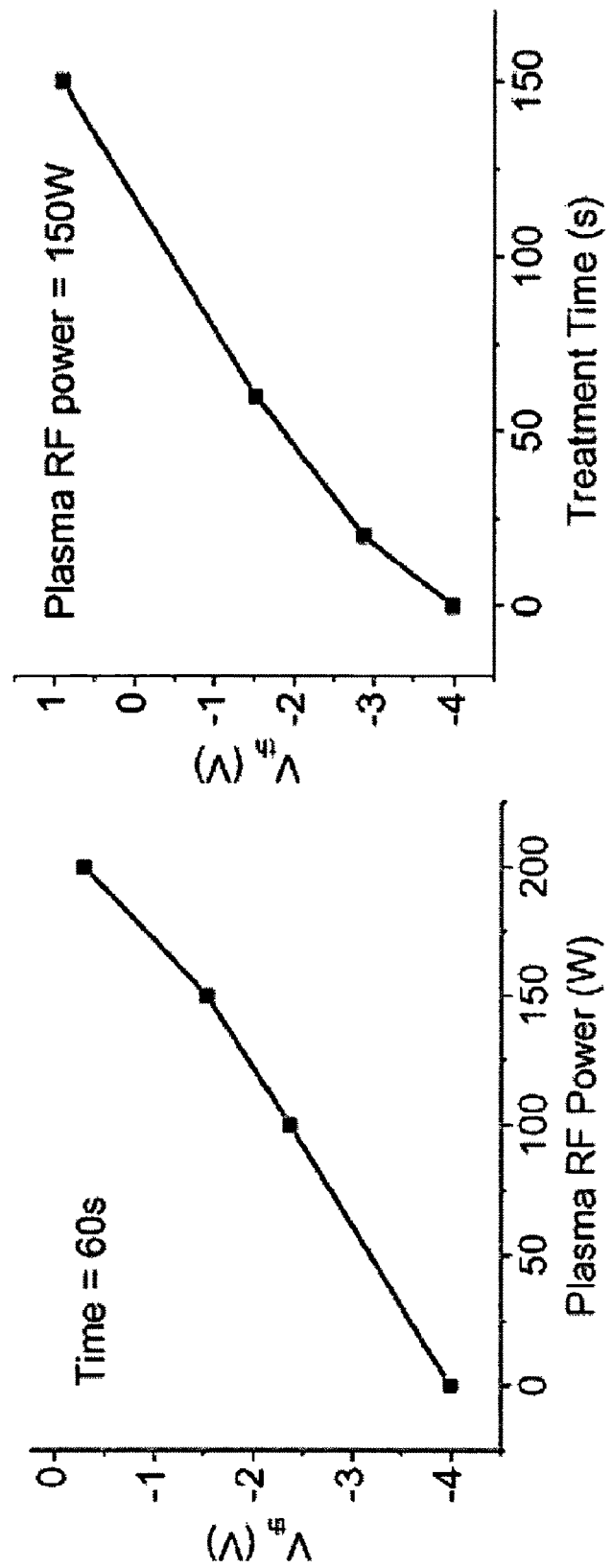
FIG. 10 shows the $V_{th}$ dependence of plasma power and treatment time for various E-mode AlGaN/GaN HFETs.
Figure 11:
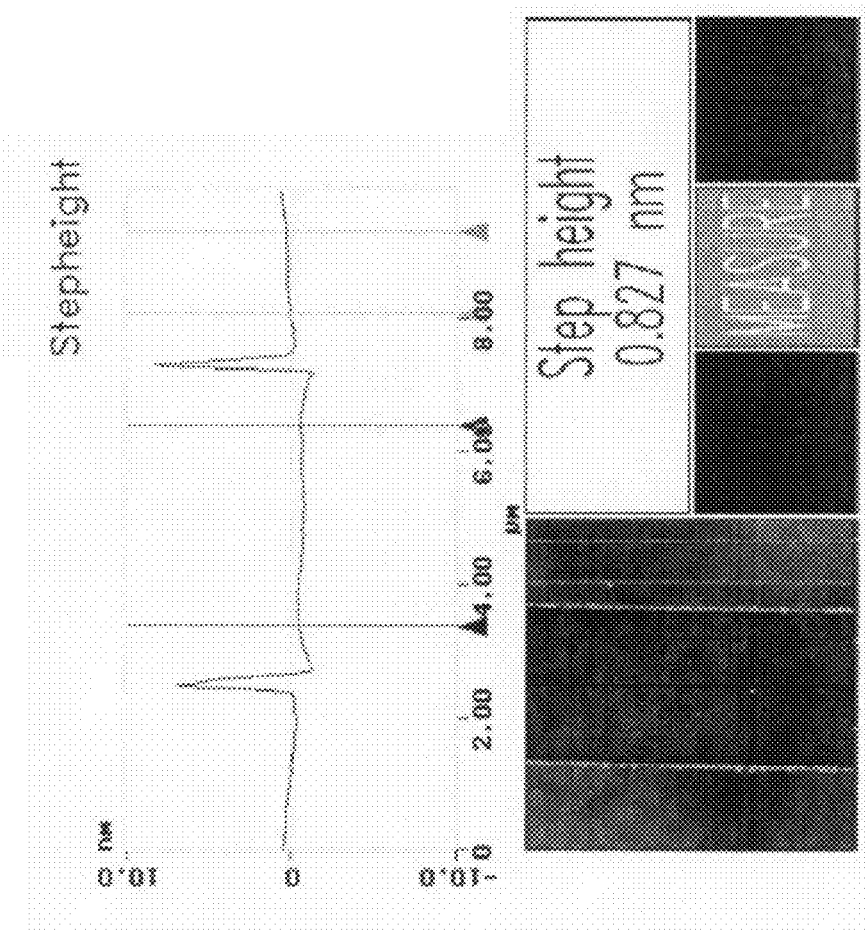
FIG. 11 shows an AFM image depicting the insignificant etching effect of the $CF_4$ plasma treatment on the AlGaN layer.

Sensitivity to plasma treatment parameters was also investigated. Devices were fabricated with different $V_{th}$ values by applying different $CF_4$ plasma power and treatment times. Five different combinations were used: 100 W for 60 seconds, 150 W for 20 seconds, 150 W for 60 seconds, 150 W for 150 seconds, and 200 W for 60 seconds. For comparison, an HEMT without $CF_4$ treatment was also fabricated on the same sample and in the same processing run. All the devices were unpassivated in order to avoid any confusion caused by the passivation layer, which may change the stress in the AlGaN layer and alter the piezoelectric polarization. All the HEMT devices have a gate length of 1 μm a source-gate spacing of $L_{sg}$=1 μm and a gate-drain spacing of $L_{gd}$=2 μm. DC current-voltage (I-V) characteristics of the fabricated devices were measured using an HP4156A parameter analyzer. Transfer characteristics and transconductance ($g_m$) characteristics are shown in FIGS. 8A and 8B, respectively. Taking the conventional HEMT (i.e., without $CF_4$ plasma treatment) as the baseline devices, the threshold voltage of all the other $CF_4$ plasma-treated HEMTs are shifted to the positive direction. Defining $V_{th}$ as the gate-bias intercept of the linear extrapolation of the drain-current at the point of peak transconductance ($g_m$), the $V_{th}$ of all the devices were extracted and listed in FIG. 9. For the conventional HEMT, $V_{th}$ is −4 V. For the HEMT treated by $CF_4$ plasma at 150 W for 150 seconds, the $V_{th}$ is 0.9 V, which corresponds to the E-mode HEMT. A maximum $V_{th}$ shift of 4.9 V was achieved. In order to further reveal the effects of $CF_4$ plasma treatment, the dependencies of $V_{th}$ on both $CF_4$ plasma treatment time and RF power are plotted in FIG. 10. As the plasma power is increased and as longer treatment time are utilized, larger shifts in $V_{th}$ are effected. With the increase in the plasma treatment time, more fluorine ions were implanted into AlGaN layer. The increased fluorine ion concentration leads to a reduced electron density in the channel, and causes the positive shift of $V_{th}$. When the plasma power increases, fluorine ions obtain a higher energy and fluorine ion flux increases due to the enhanced ionization rate of $CF_4$. With higher energy, fluorine ions can reach at a deeper depth closer to the channel. The closer the fluorine ions are to the channel, the more effective they at depleting 2DEG, and a larger shift in $V_{th}$ is achieved. The increased fluorine ions flux has the same effect on $V_{th}$ as the increase of the plasma treatment time by raising the fluorine atoms concentration in AlGaN layer. It should be noted that the nearly linear $V_{th}$ versus time and $V_{th}$ versus power relationships imply the possibilities of a precise control of $V_{th}$ of AlGaN/GaN HEMTs. Although the $V_{th}$ is shifted by $CF_4$ plasma treatment, the $g_m$ is not degraded. As shown in FIG. 8B, all the devices' maximum $g_m$ are in the range of 149-166 mS/mm, except for that treated at 150 W for 60 seconds, which has a higher peak $g_m$ of 186 mS/mm. It is suspected that this singularity point was caused by the non-uniformity in epitaxial growth. Confirmed by an AFM measurement conducted on a $CF_4$-treated patterned sample (with part of the sample treated and other parts protected from the plasma treatment), the $CF_4$ plasma treatment only results in an AlGaN-thickness reduction of less than 1 nm, as shown in FIG. 11. Thus, the almost constant transconductance indicates that the 2DEG mobility in the channel is maintained in the device fabrication according to the present innovations. A key step in maintaining the transconductance is the post-gate annealing process.

Recovery of Plasma-Induced Damages by Post-Gate Annealing

Figure 12A:
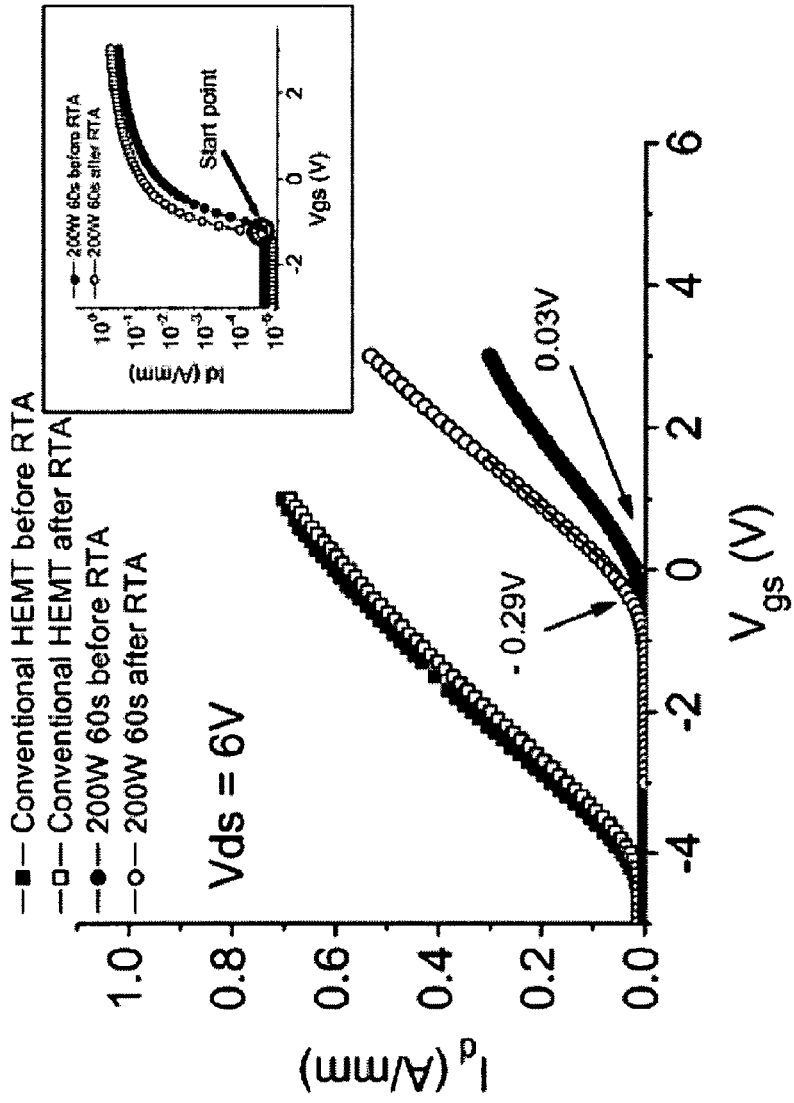
FIG. 12A shows the DC $I_d$ versus $V_{gs}$ transfer characteristics for various E-mode AlGaN/GaN HFET embodiments.
Figure 13:
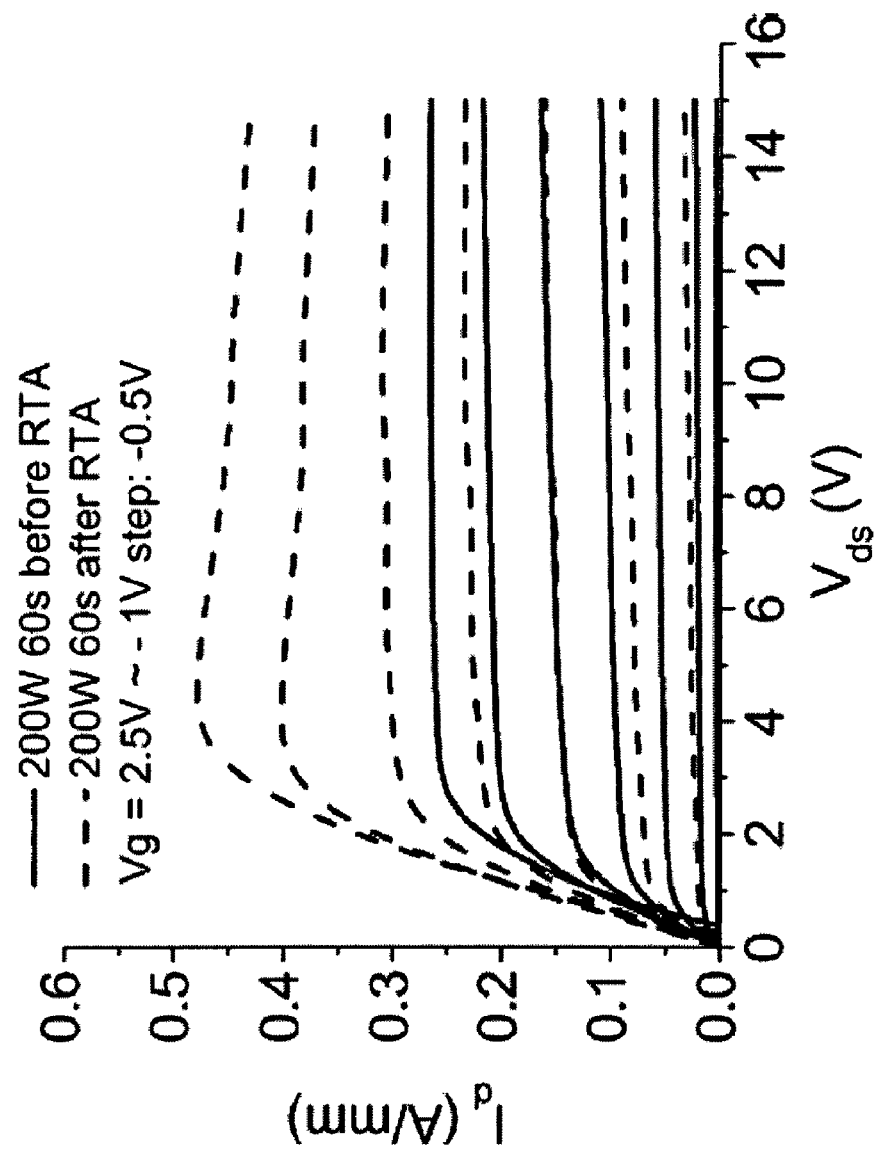
FIG. 13 shows the DC output characteristics for one E-mode AlGaN/GaN HFET embodiment.

As previously discussed, the plasma normally induces damages and creates defects in semiconductor materials, and consequently degrades carriers' mobility. RTA is an effective method to repair these damages and recover the mobility. In the $CF_4$ plasma-treated AlGaN/GaN HEMTs, drain-current and transconductance degradation occurs just after the plasma treatment. In FIGS. 12A and 12B, the drain-current and transconductance measured on an untreated device and a treated device (200 W, 60 seconds) before and after RTA (400° C. for 10 minutes) are plotted. FIG. 13 compares the output characteristics of the treated device before and after RTA. The drain-current was 76% and the transconductance was 51% higher after the RTA in the treated device. The RTA process can recover majority of the mobility degradation in the plasma-treated device, while showing an insignificant effect on the conventional untreated device. Therefore, the recovery of $I_d$ and $g_m$ in the $CF_4$ plasma-treated device is the result of the effective recovery of the 2DEG mobility at this RTA condition. Compared to a higher annealing temperature of 700° C., which is needed to recover damages induced by chlorine-based ICP-RIE in the case of recessed gate, this lower RTA temperature implies that the $CF_4$ plasma treatment creates lower damages than the chlorine-based ICP-RIE. It also enables the RTA process to be carried out after the gate deposition, fulfilling the goal of a self-aligned process. If the previous definition of $V_{th}$ is used, the $V_{th}$ of the $CF_4$ plasma-treated device seems to be shifted from 0.03 to −0.29 V after the RTA. When the start point of $g_m$, as shown in FIG. 12B, or the start point of $I_d$ at the logarithm scale, as shown in the inset of FIG. 12A, is used as the criteria to evaluate $V_{th}$, the $V_{th}$ of the $CF_4$ plasma-treated device is not changed after the RTA. The good thermal stability of $V_{th}$ is consistent with the previously mentioned good thermal stability of fluorine atoms in AlGaN layer.

Suppression of Schottky Gate-Leakage Current

AlGaN/GaN HEMTs always show much higher reverse gate leakage current than the values theoretically predicted by the thermionic-emission ("TE") model. The higher gate currents degrade the device's noise performance and raise the standby power consumption. In particular, forward gate currents limit the gate input voltage swing, hence the maximum drain-current. Other approaches have been attempted to suppress gate currents of AlGaN/GaN HEMTs. These efforts include using the gate metal with higher work function, using copper, modifying the HEMTs structure (such as adding a GaN cap), or diversion to metal-insulator-semiconductor heterostructure field-effect transistors (MISHFETs). In the $CF_4$ plasma-treated AlGaN/GaN HEMTs of the present innovations, suppressions of gate currents in both reverse and forward bias regions can be achieved. Gate-current suppressions show dependencies on $CF_4$ plasma-treatment conditions.

Figure 14A:
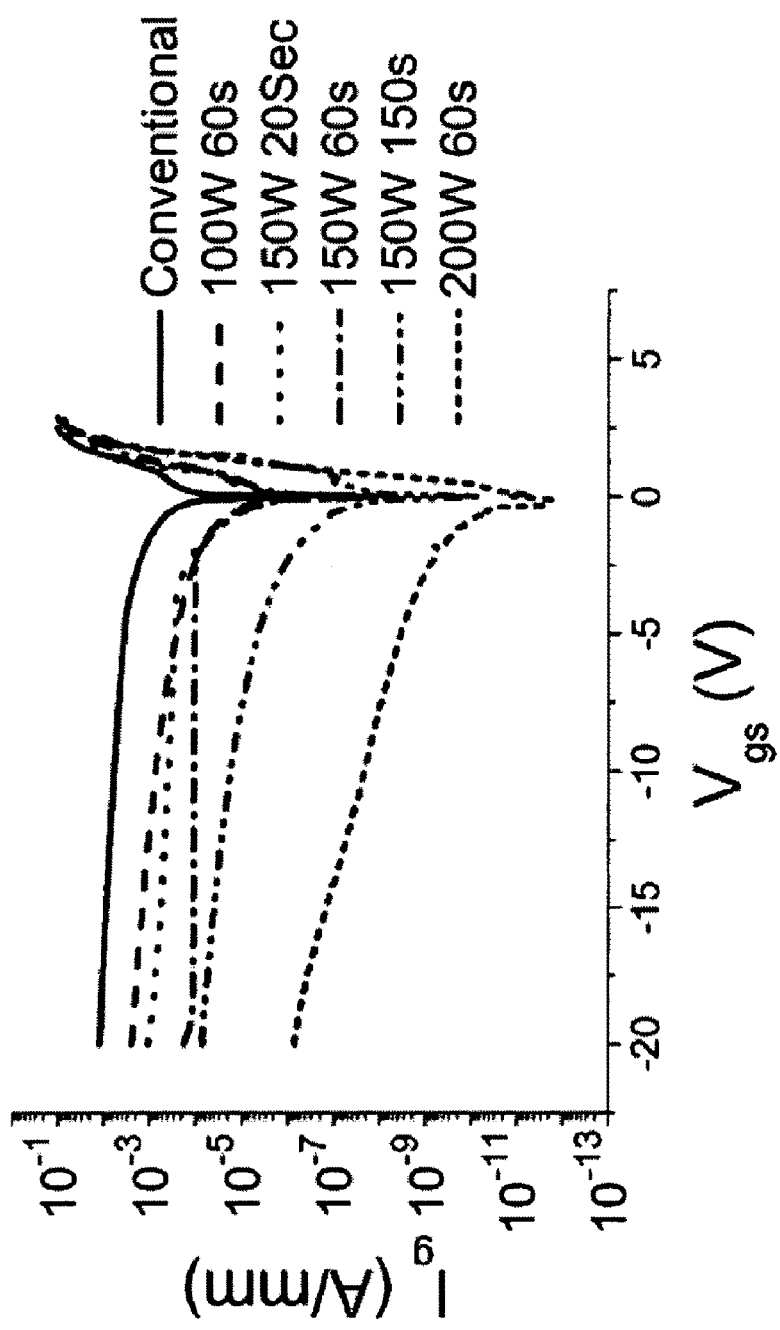
FIG. 14A shows both reverse and forward gate currents with different $CF_4$ plasma treatments for various embodiments of an E-mode AlGaN/GaN HFET.
Figure 14B:
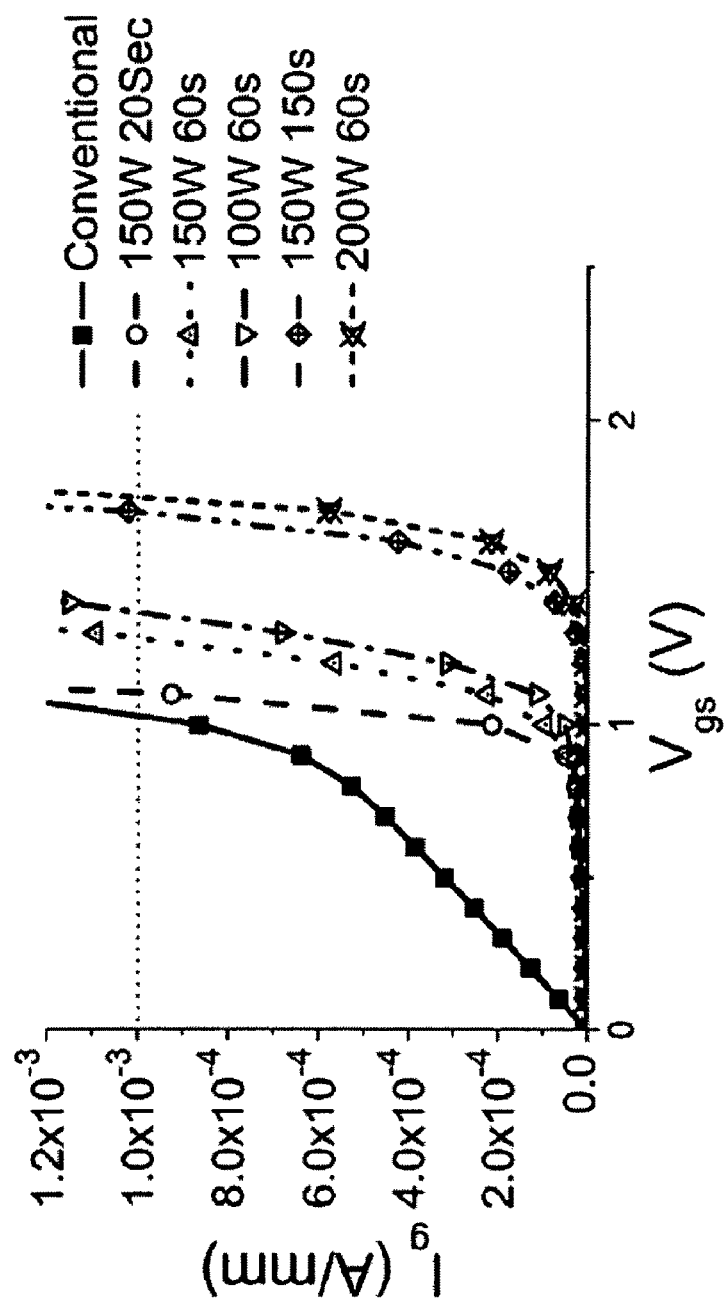
FIG. 14B shows enlarged and forward gate currents with different $CF_4$ plasma treatments for various embodiments of an E-mode AlGaN/GaN HFET.

FIGS. 14A and 14B shows gate currents of AlGaN/GaN HEMTs with different $CF_4$ plasma treatments. FIG. 14B is the enlarged plot of the forward gate bias region. In reverse bias region, compared to the conventional HEMT without $CF_4$ plasma treatment, the gate-leakage currents of all the $CF_4$ plasma-treated AlGaN/GaN HEMTs decreased. At $V_g$=−20 V, the gate-leakage current drops by more than four orders of magnitude from $1.2 \times 10^{-2}$ A/mm for conventional HEMT to $7 \times 10^{-7}$ A/mm for the AlGaN/GaN HEMT plasma treated at 200 W, 60 seconds. In the forward region, the gate currents of all the $CF_4$ plasma-treated AlGaN/GaN HEMTs also decrease. As a result, the turn-on voltages of the gate Schottky diode are extended, and the gate input voltage swings are increased. Using 1 mA/mm as the criterion, the turn-on voltage of the gate Schottky diode increases from 1 V for conventional HEMT to 1.75 V for the $CF_4$ plasma-treated AlGaN/GaN HEMT at 200 W for 60 seconds.

Figure 23:
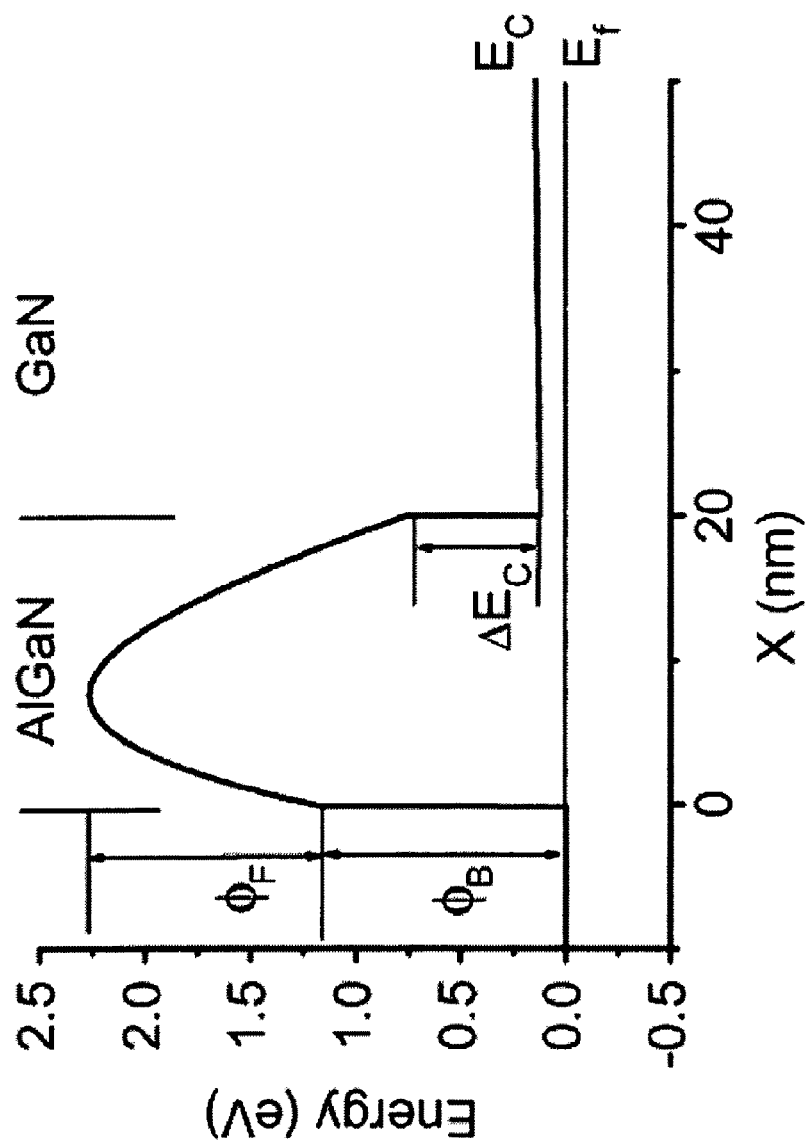
FIG. 23 shows simulated conduction-band diagrams of an E-mode AlGaN/GaN HEMT with a $CF_4$ plasma treatment.

The suppression of the gate-leakage current in the $CF_4$ plasma-treated AlGaN/GaN HEMT can be explained as follows. During $CF_4$ plasma treatment, fluorine ions are incorporated into the AlGaN layer. These ions with a strong electronegativity act as immobile negative charges that cause the upward conduction-band bending in the AlGaN barrier layer due to the electrostatic induction effect. Thus, an additional barrier height $\Phi F$, as shown in FIG. 23 is formed, and the effective metal-semiconductor barrier height is increased from $\Phi_B$ to $\Phi_B+\Phi_F$. This enhanced barrier height can effectively suppress the gate Schottky diode current in both reverse and forward bias regions. With higher plasma power and longer treatment time, the fluorine ion concentration in the AlGaN layer increases, and the effective barrier height is raised further, leading to a more significant gate-current suppression. In FIG. 9 the effective barrier heights and ideality factors that were extracted from the forward region of the measured gate currents by using the TE model are detailed. The effective barrier height of conventional HEMT is 0.4 eV, while the effective barrier height increases to 0.9 eV for the $CF_4$ plasma-treated HEMT at 200 W for 60 seconds. The effective barrier heights of the $CF_4$ plasma-treated HEMT also show a trend of increase with the plasma power and treatment time, except for the HEMT treated as 150 W for 20 seconds, which has a relatively higher effective barrier height. This exception is thought to be due to the process variations. The fact that the extracted effective barrier height is much lower than the theoretically predicted values and very large ideality factors (>2.4) indicates that the gate currents of fabricated AlGaN/GaN HEMTs are not dominated by the TE mechanism but other mechanisms, such as vertical tunneling, surface barrier thinning, and trap-assisted tunneling. Thus, the barrier heights and ideality factors, which are extracted by using the TE model, are not accurate. Nevertheless, they provide sufficient qualitative information for explaining the mechanism of the gate-current suppression in $CF_4$ plasma-treated AlGaN/GaN HEMTs.

Dynamic I-V characterizations were conducted by using an Accent DIVA D265 system to investigate the effects of $CF_4$ plasma treatment on drain-current dispersion. The pulse width is 0.2 μs and the pulse separation is 1 ms. The quiescent point is at $V_{GS}$ slightly (~0.5 V) below the pinch-off and $V_{DS}$=15 V. Compared to static I-V characteristics, the maximum drain-current of conventional D-mode HEMT dropped by 63% while that of E-mode HEMT with $CF_4$ plasma treatment at 150 W for 150 seconds dropped by 6%.

The alleviation of drain-current drops for E-mode HEMT is likely due to a raised gate bias of the quiescent point ($V_{GS}$=0 V for E-mode HEMT, $V_{GS}$=−4.5 V for D-mode HEMT).

RF Small-Signal Characteristics

Figure 15:
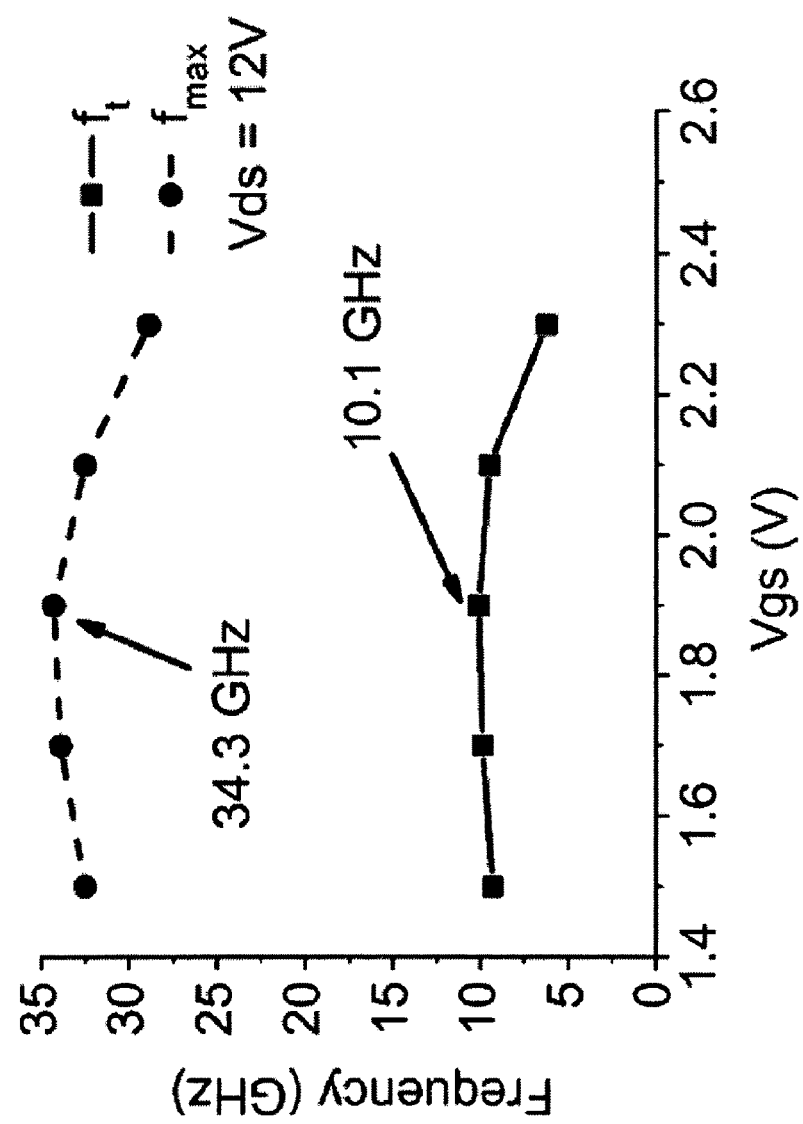
FIG. 15 shows dependencies of $f_t$ and $f_{max}$ on gate bias, where $V_{ds}$ is fixed at 12V.

On-wafer small-signal RF characterization of the fabricated AlGaN/GaN HEMTs were carried out at the frequency range of 0.1-39.1 GHz using Cascade microwave probes and an Agilent 8722ES network analyzer. Open-pad de-embeddings with the S-parameters of dummy pads were carried out to eliminate a parasitic capacitance of the probing pads. The current gain and maximum stable gain/maximum available gain (MSG/MAG) of all devices with 1-μm long gate were derived from the de-embedded S-parameters as a function of frequency. The current cutoff frequency ($f_t$) and maximum oscillation frequency ($f_{max}$) were extracted from current gains and MSG/MAGs at unit gain. It has been observed that the intrinsic $f_t$ and $f_{max}$ are generally 10-15% higher than the extrinsic ones without the de-embeddings process. The dependencies of $f_t$ and $f_{max}$ on the gate bias are shown in FIG. 15 for the E-mode HEMT. Both $f_t$ and $f_{max}$ are relatively constant at both low and high gate bias, indicating a good linearity. FIG. 16 lists $f_t$ and $f_{max}$ of all samples. For the conventional HEMT, $f_t$ and $f_{max}$ are 13.1 and 37.1 GHz, while for the $CF_4$ plasma-treated HEMTs, $f_t$ and $f_{max}$ are approximately 10 and 34 GHz, slightly lower than that of the conventional HEMT, except for the HEMT treated at 150 W for 60 seconds. This higher $f_t$ and $f_{max}$ in the 150 W/60 second device are consistent with the higher $g_m$ presented before, and are attributed to a material non-uniformity and process variation. The slightly lower $f_t$ and $f_{max}$ in the $CF_4$ plasma-treated HEMTs indicate that the post-gate RTA at 400° C. can effectively recover the 2DEG mobility degraded by the plasma treatment, but the recovery is less than 100%. It suggests that the optimization of the RTA temperature and time is needed to further improve the 2DEG mobility, while not degrading the gate Schottky contact.

MISHFETs

In another embodiment, E-mode $Si_3N_4$/AlGaN/GaN MISHFET were constructed with a two-step $Si_3N_4$ process which features a thin layer of $Si_3N_4$ (15 nm) under the gate and a thick layer of $Si_3N_4$ (about 125 nm) in the access region. Fluorine-based plasma treatment was used to convert the device from D-mode to E-mode. The E-mode MISHFETs with 1-μm long gate footprint exhibited a threshold voltage of 2 V, a forward turn-on gate bias of 6.8 V (compared to about a 3 V realized in E-mode AlGaN/GaN HEMTs) and a maximum current density of 420 mA/mm.

Figure 17A:
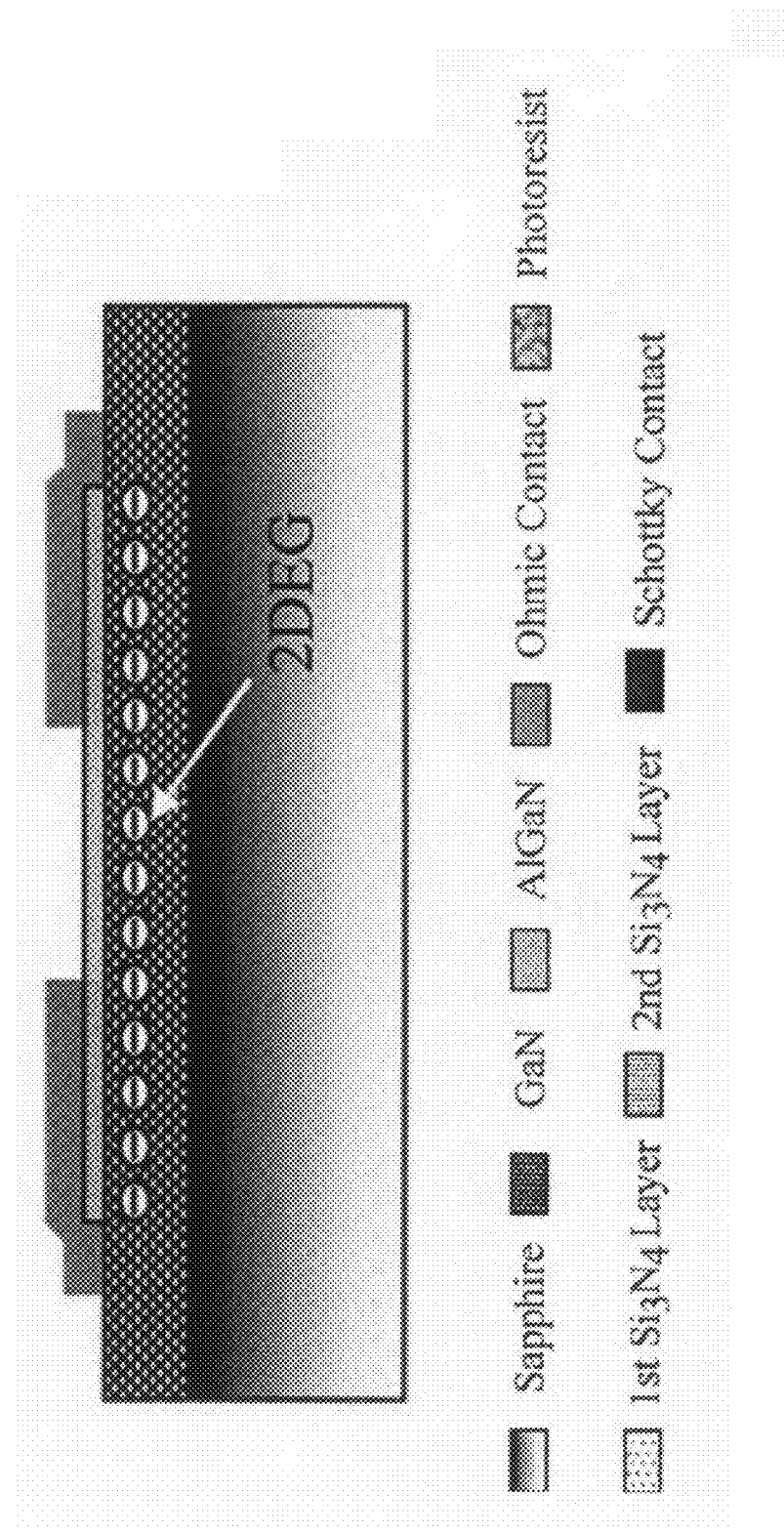

The AlGaN/GaN HFET structure used in this example was grown on (0001) sapphire substrates in an Aixtron AIX 2000 HT MOCVD system. The HFET structure consists of a 50-nm thick low temperature GaN nucleation layer, a 2.5-μm thick not-intentionally doped GaN buffer layer, and an AlGaN barrier layer with nominal 30% Al composition. The barrier layer is composed of a 3-nm undoped spacer, a 16-nm carrier supplier layer doped at 2×10$^{18}$ cm$^{-3}$, and a 2-nm undoped cap layer. The capacitance-voltage ("C-V") measurement by mercury probe yields an initial threshold voltage of −4 V for this sample. The process flow is illustrated in FIGS. 17A through 17F. The device mesa is formed using Cl$_2$/He plasma dry etching in an STS ICP-RIE system followed by the source/drain ohmic contact formation with Ti/Al/Ni/Au (20 nm/150 nm/50 nm/80 nm) annealed at 850° C. for 30 seconds, as shown in FIG. 17A. Then, the first Si$_3$N$_4$ layer (about 125 nm) is deposited on the sample by plasma enhanced chemical vapor deposition (PECVD) as in FIG. 17B. After gate windows with 1-μm length are opened by photolithography, the sample was put in an RIE system under CF$_4$ plasma treatment, which removed the Si$_3$N$_4$ and incorporated fluorine ions in the AlGaN. The RF power of the plasma was 150 W, as shown in FIG. 17C. The gas flow was controlled to be 150 sccm, and the total etching and treatment time is 190 seconds. After removing the photoresist, the second Si$_3$N$_4$ film (about 15 nm) was deposited by PECVD to form the insulating layer between gate metal and AlGaN as in FIG. 17D. Subsequently, the Si$_3$N$_4$ layer was patterned and etched to open windows in the source and drain ohmic contact regions, as shown in FIG. 17E. Next, the 2-μm long gate electrodes were defined by photolithography followed by e-beam evaporation of Ni/Au (~50 nm/300 nm) and liftoff as in FIG. 17F. To ensure that the gate electrode covers the entire plasma-treated region, the metal gate length (2 μm) was chosen to be larger than the treated gate area (1 μm), leading to a T-gate configuration. The gate overhang in the source/drain access regions is insulated from the AlGaN layer by the thick Si$_3$N$_4$ layer, keeping the gate capacitances at low level. Finally, the whole sample was annealed at 400° C. for 10 minutes to repair the plasma-induced damage in the AlGaN barrier and channel. Measured from the foot of gate, the gate-source and gate-drain spacings are both 1.5 μm. The E-mode MISHFETs are designed with gate width of 10 μm for dc testing and 100 μm for RF characterizations.

Figure 18:
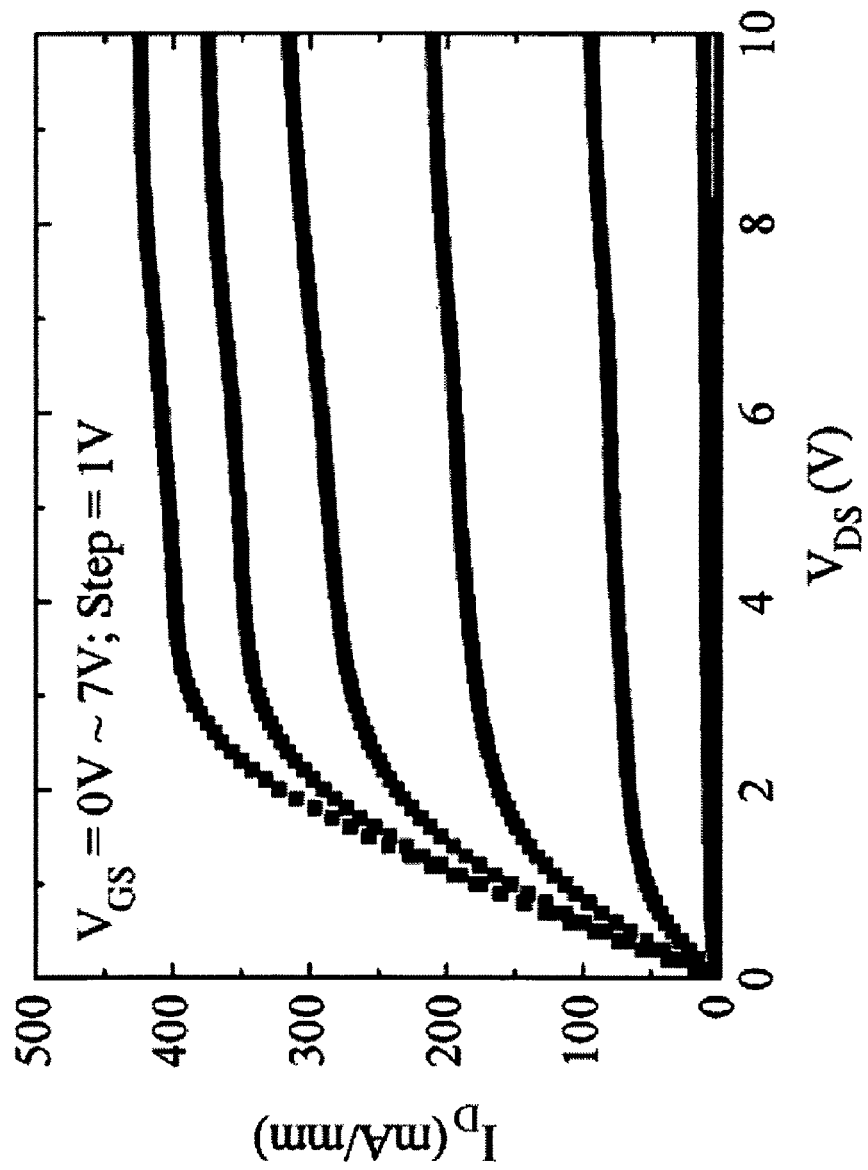
FIG. 18 shows sample DC output characteristics.
Figures 19A, 19B:
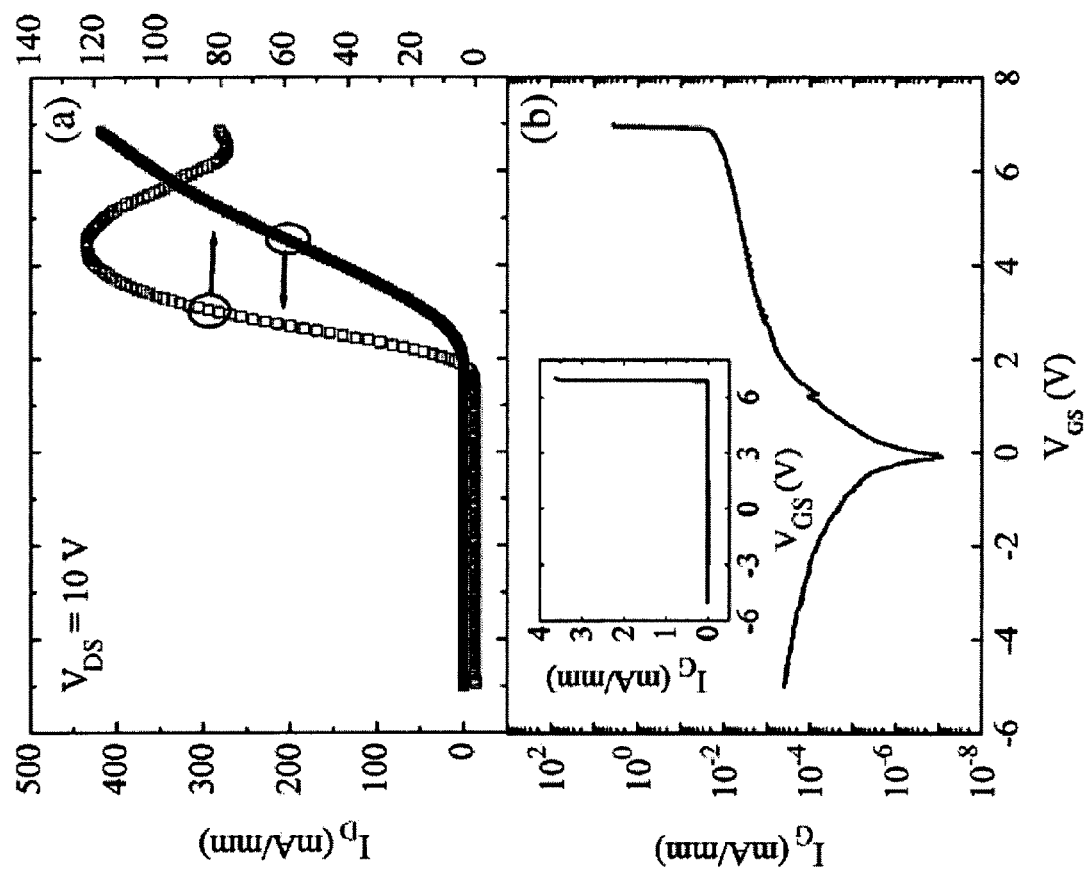
FIG. 19A shows the transfer characteristics.
FIG. 19B shows gate leakage currents.
Figure 20:
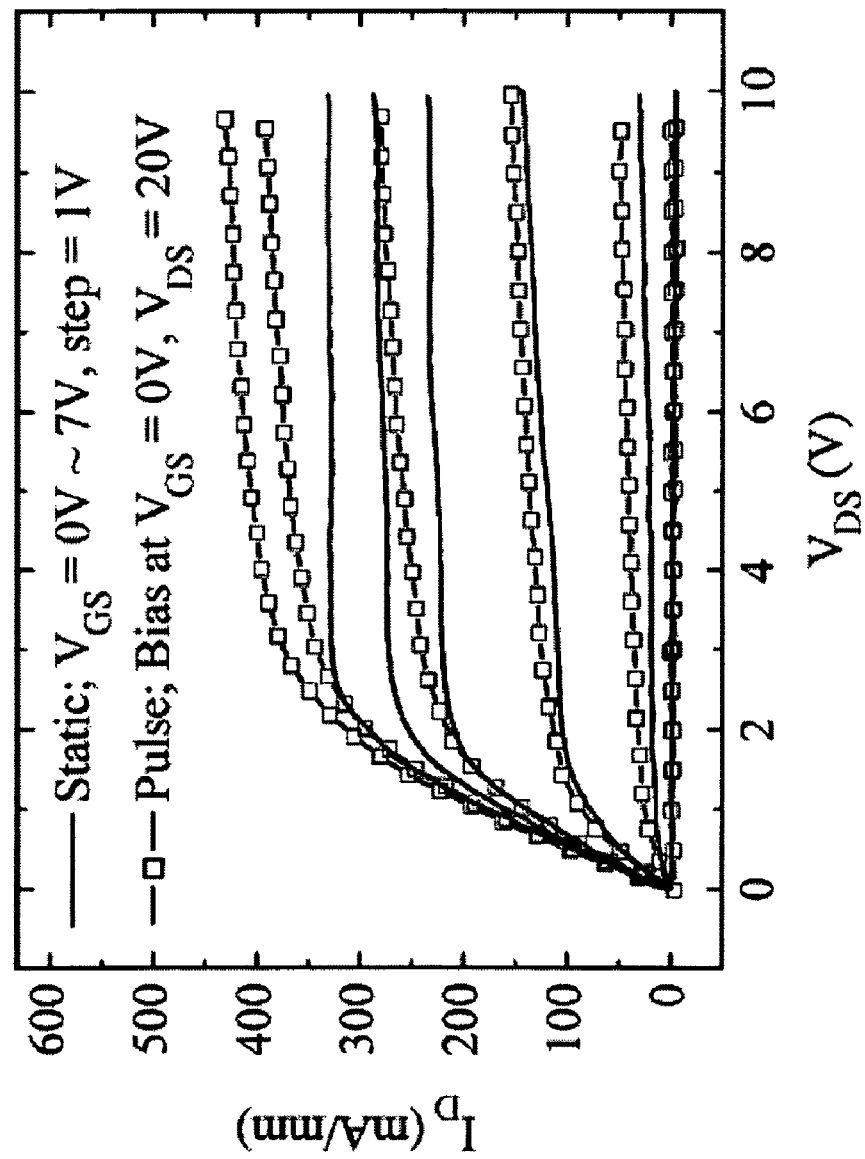
FIG. 20 shows pulse measurements.
Figure 21:
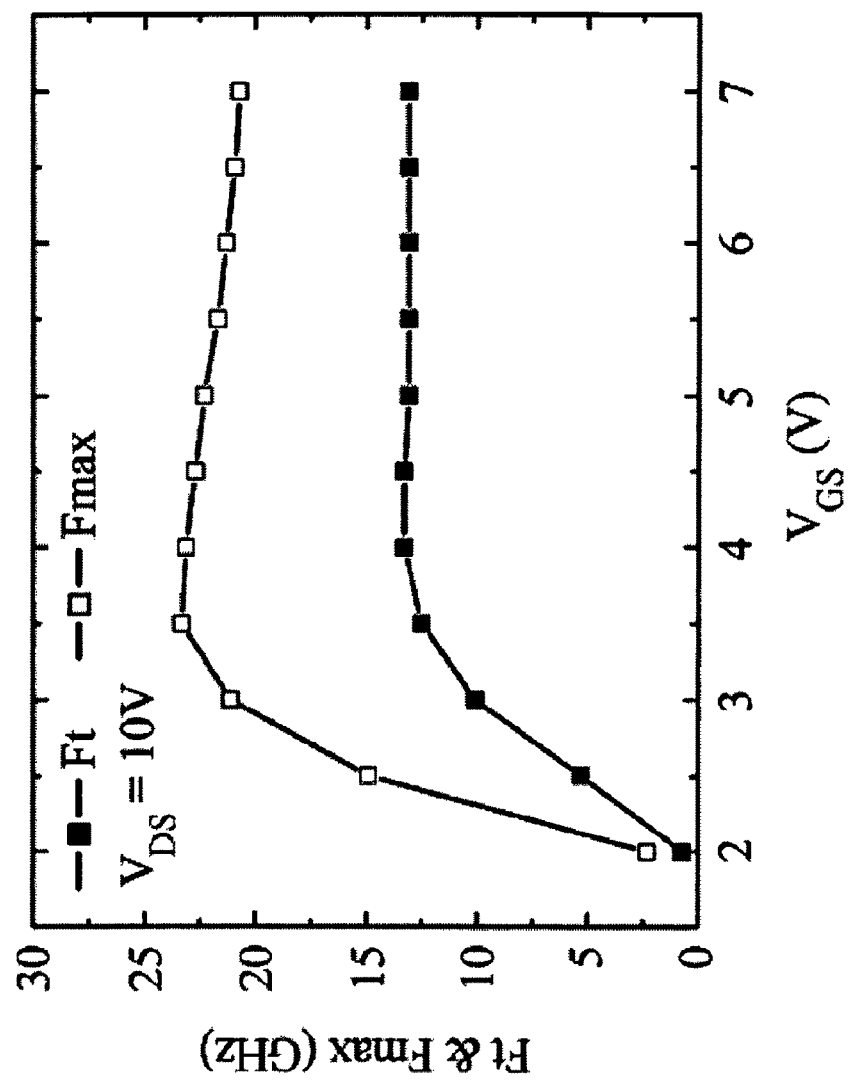
FIG. 21 shows small signal RF characteristics.

The constructed device was then characterized. The DC output characteristics of the E-mode MISHFETs are plotted in FIG. 18. The devices exhibit a peak current density of about 420 mA/mm, an ON-resistance of about 5.67 Ω·MM and a knee voltage of about 3.3 V at $V_{GS}$ 7 V. FIG. 19A shows the transfer characteristics of the same device with 1×10-μm gate dimension. It can be seen that the $V_{th}$ is about 2 V, indicating a 6-V shift of $V_{th}$ (compared to a conventional D-mode HFET) achieved by the insertion of the Si$_3$N$_4$ insulator and plasma treatment. The peak transconductance gm is about 125 mS/mm. FIG. 19B shows the gate leakage current at both the negative bias and forward bias. The forward bias turn-on voltage for the gate is about 6.8 V, providing a much larger gate bias swing compared to the E-mode HFETs. Pulse measurements were taken on the E-mode MISHFETs with 1×100-μm gate dimensions with a pulse length of 0.2 μs and a pulse separation of 1 ms. The quiescent bias point is chosen at $V_{GS}$=0 V (below $V_{th}$) and $V_{DS}$=20 V. FIG. 20 shows that the pulsed peak current is higher than the static one, indicating no current collapse in the device. The static maximum current density of the large device with a 100-μm gate width is about 330 mA/mm, smaller than device with 10-μm gate width (about 420 mA/mm). The lower peak current density in the larger device is due to the self-heating effect that lowers the current density. Since little self-heating occurs during pulse measurements, the maximum current for the 100-μm wide device can reach the same level as the 10-μm wide device. On wafer small-signal RF characteristics were performed from 0.1 to 39.1 GHz on the 100-μm wide E-mode MISHFETs at $V_{DS}$=10 V. As shown in FIG. 21, the maximum current gain cutoff frequency ($f_T$) and power gain cutoff frequency ($f_{max}$) are 13.3 and 23.3 GHz, respectively. When the gate bias is 7 V, the small-signal RF performance does not significantly degrade, with an $f_T$ of 13.1 GHz and an $f_{max}$ of 20.7 GHz, indicating that the Si$_3$N$_4$ insulator offers an excellent insulation between gate metal and semiconductor.

Models

A theoretical characterization model was developed for some of the present innovations. For a conventional AlGaN/GaN HEMT with silicon modulation doped layer, as shown in FIG. 7, the polarization charges need to be taken into account in the calculation of HEMTs threshold voltage. Modified from a generally used formula by taking into account the effects of charge polarization, surface and buffer traps, the threshold voltage of the AlGaN/GaN HEMT can be expressed as:

$$V_{th} = \phi_B/e - d\sigma/\varepsilon - \Delta E_C/e + E_{10}/e - \frac{e}{\varepsilon}\int_0^d dx \int_0^x N_{Si}(x)dx - edN_{st}/\varepsilon - eN_b/C_b. \quad (1)$$

Where the parameters are defined as follows:
$\phi_B$ is the metal-semiconductor Schottky barrier height.
σ is the overall net (both spontaneous and piezoelectric) polarization charge at the barrier—AlGaN/GaN interface.
d is the AlGaN barrier-layer thickness.
$N_{si}(x)$ is the silicon-doping concentration.
$\Delta E_c$ is the conduction-band offset at the AlGaN/GaN heterostructure.
$E_{f0}$ is the difference between the intrinsic Fermi level and the conduction band edge of the GaN channel.
∈ is the dielectric constant of AlGaN.
$N_{st}$ is the effective net-charged buffer traps per unit area.
$N_b$ is the effective net-charged buffer traps per unit area.
$C_b$ is the effective buffer-to-channel capacitance per unit area.

The last two terms in equation (1) describe the effects of the surface traps and buffer traps, respectively. The AlGaN surface is at x=0, and the direction pointing to the channel is the positive direction for the integration. To represent the devices described above, immobile negative charges are introduced into the AlGaN barrier layer under the gate. Because of electrostatic induction, these immobile negative charges can deplete 2DEG in the channel, raise the energy band, and hence modulate $V_{th}$. Including the effect of the negative charges confined in the AlGaN barrier, the modified threshold voltage from equation (1) is given by:

$$V_{th} = \phi_B/e - d\sigma/\varepsilon - \Delta E_C/e + E_{10}/e - \frac{e}{\varepsilon}\int_0^d dx \int_0^x (N_{Si}(x) - N_F(x))dx - edN'_{st}/\varepsilon - eN_b/C_b. \quad (2)$$

The positive-charge distribution profile $N_{si}(x)$ is replaced by the net charge distribution $N_{si}(x)-N_F(x)$, where $N_F(x)$ is the concentration of the negatively charged fluorine ion. The surface-trap density ($N_{st}$) could be modified by the plasma treatment.

By applying Poisson's equation and Fermi-Dirac statistics, a simulation was made of the conduction-band profiles and the electron distributions of AlGaN/GaN HEMT structures with and without fluorine ions incorporated in AlGaN layer.

Figure 22:
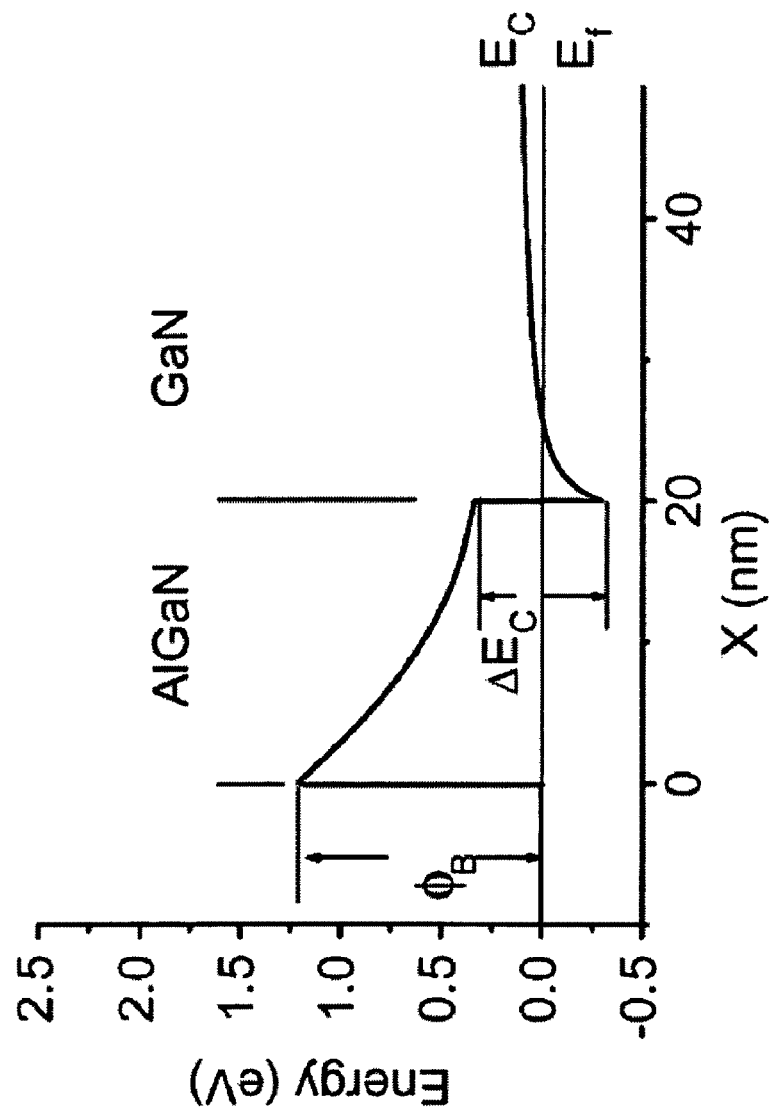
FIG. 22 shows simulated conduction-band diagrams of conventional D-mode AlGaN/GaN HEMT without $CF_4$ plasma treatment.
Figure 24:
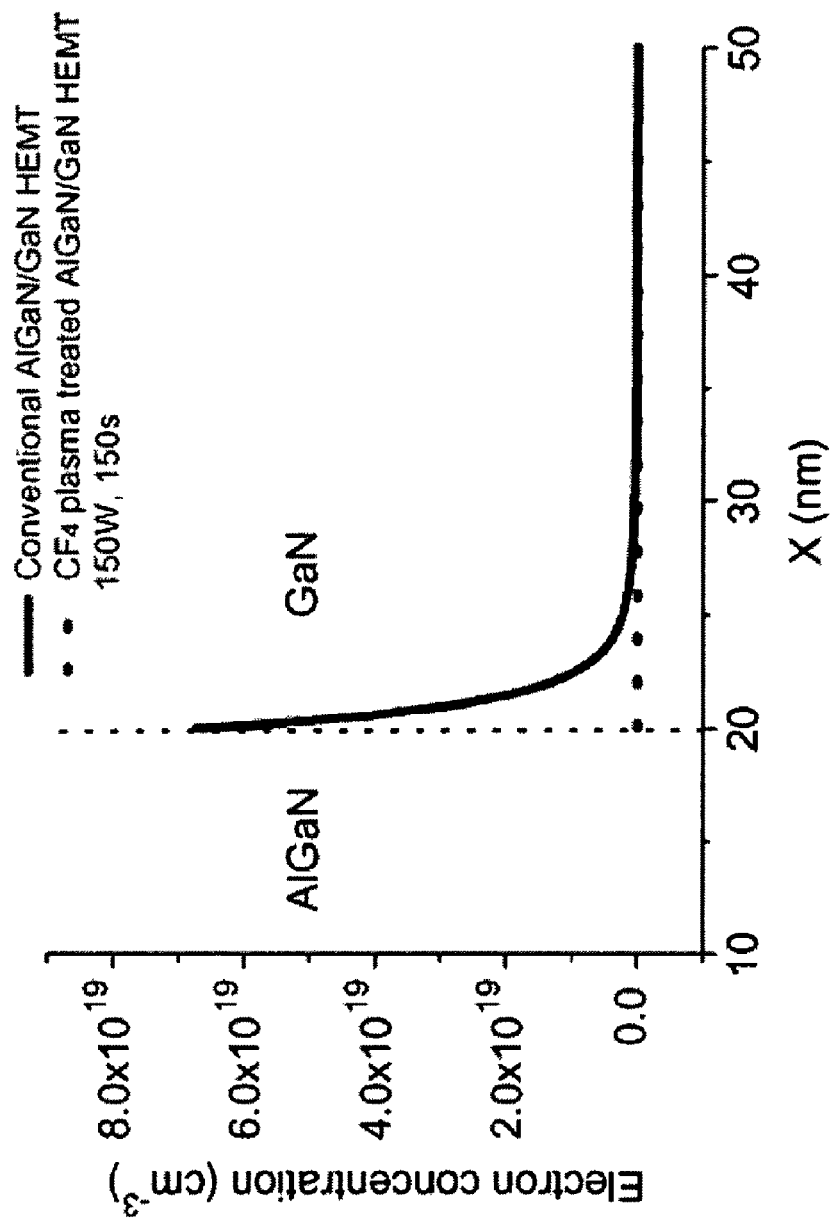
FIG. 24 shows the electron concentration of a conventional D-mode AlGaN/GaN HEMT without $CF_4$ plasma treatment and of an E-mode AlGaN/GaN HEMT with $CF_4$ plasma treatment.

Both structures have the same epitaxial structure, shown in FIG. 7. For the fluorine ions incorporated HEMT structure, the negatively charged fluorine ions' profile was extracted from SIMS measurement results of the fluorine atoms' distribution of an AlGaN/GaN HEMT structure that was treated by $CF_4$ plasma at 150 W for 150 s and converted to an E-mode HEMT. The simulated conduction band diagrams at zero gate bias were plotted in FIGS. 22 and 23 For the simulated conduction band of E-mode HEMT, as shown in FIG. 22 the fluorine concentration is approximated by using a linear distribution that the peak fluorine concentration is $3\times10^{19}$ cm$^{-3}$ at the AlGaN surface, and the fluorine concentration is assumed to be negligible at the AlGaN/GaN interface. A total fluorine ion sheet concentration of about $3\times10^{13}$ cm$^{-2}$ is sufficient to not only compensate the silicon doping (about $3.7\times10^{13}$ cm$^{-2}$) in the AlGaN barrier but also to compensate for the piezoelectric and spontaneous polarization-induced charges (about $1\times10^{13}$ cm$^{-2}$). Two significant features can be observed. First, compared to the untreated AlGaN/GaN HEMT structure, the plasma-treated structure has its 2DEG channel's conduction-band minimum above Fermi level, indicating a completely depleted channel and E-mode HEMT. As shown in the electron profiles in FIG. 24, there are no electrons in the channel under the zero gate bias in the plasma-treated structure, indicating an E-mode HEMT operation. Second, the immobile negatively charged fluorine ions cause an upward bending of the conduction band, especially in AlGaN barrier, yielding an additional barrier height ΦF, as shown in FIG. 23 Such an enhanced barrier can significantly suppress the gate Schottky diode current of AlGaN/GaN HEMT in both the reverse and forward bias regions.

Figure 25:
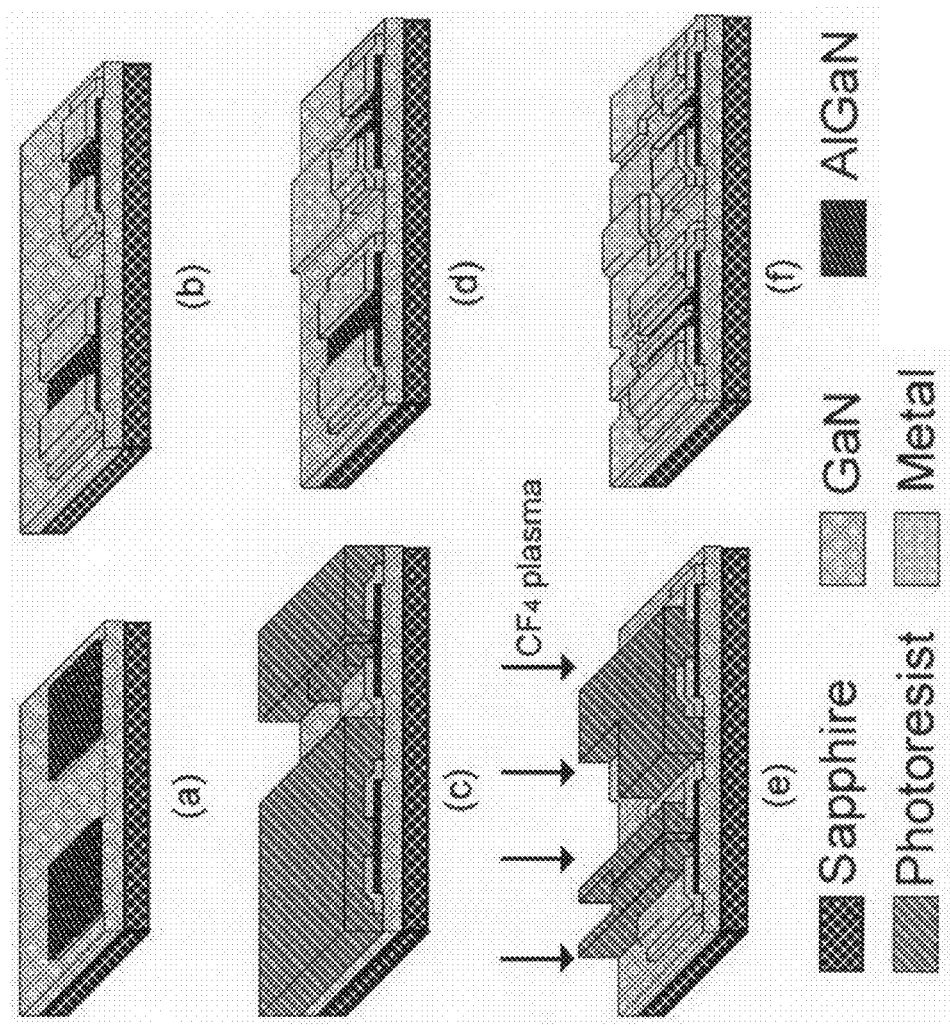
FIG. 25 shows one embodiment for a process flow of monolithic integration of E-mode and D-mode HEMTs for an inverter according to the present innovations.

The epitaxial structure for the monolithically-integrated E/D-mode HFET consists of: (a) a semiconductor substrate (sapphire, SiC, silicon, AlN or GaN, etc.); (b) a buffer layer grown on the substrate; (c) a channel layer; (d) a barrier layer including an undoped spacer layer, a modulation doped carrier supply layer and an undoped cap layer. The fabrication process includes: (f) active region isolation; (g) ohmic contacts formation on source and drain terminals; (h) photolithography of the gate regions for the E-mode HFETs; (i) fluoride-based plasma treatment to the exposed barrier layer of the e-mode HFETs; (j) gate metal deposition of the E-mode HFETs; (k) photolithography of the gate regions for the D-mode HFETs; (l) gate metal deposition of the D-mode HFETs; ml) surface passivation of the D-mode and e-mode HFETs; (n) gate annealing at elevated temperatures. A schematic process flow for this monolithic integration is depicted in FIG. 25.

The active device isolation in the above-described monolithic integration process used the mesa etching, which features the active region removal by etching techniques in the areas without the HFETs. Such an approach imposes limits to the integration density, photolithography resolution. For high frequency circuits, the edges of the mesas also introduce additional discontinuities for wave propagation, which in turn, complicate the circuit design and analysis. Since the fluoride-based plasma treatment is able to deplete the electrons in the channel (providing electrical turn-off of the channel), it can be used for device isolation. With increased plasma power and treatment time, the regions where active devices are not desired can be completely turned off electrically, providing electrical isolation between devices. Such an approach does not involve any material removal, therefore, enables a flat wafer surface for planar process.

EXAMPLE

Figure 26A:
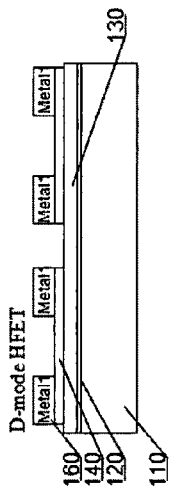
FIGS. 26A through 26F show a sample process flow for monolithic integration of E-mode and D-mode HFETs.
Figure 26B:
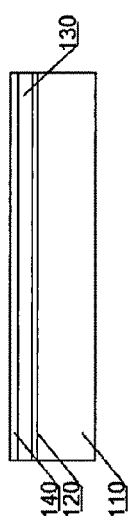
Figure 26C:
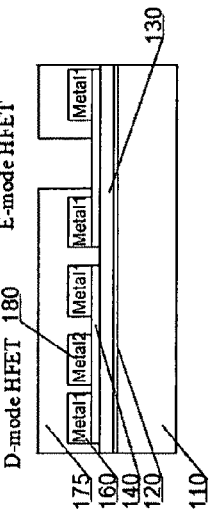
Figure 26D:
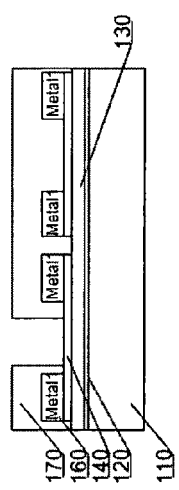
Figure 26E:
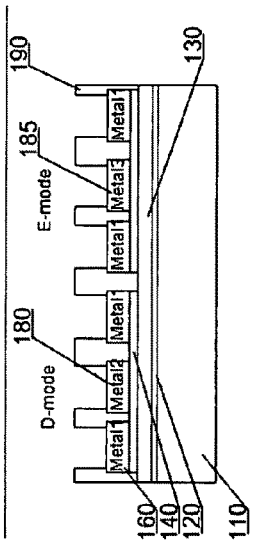
Figure 26F:
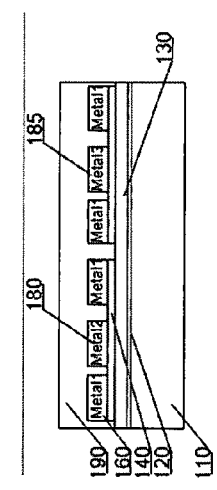

FIGS. 26A through 26F illustrate the process of monolithically integrating the E/D-mode HFETs for integrated circuits according to one embodiment of the present invention. FIG. 26A illustrates a preferred epitaxial structure of this invention, where the reference numerals 110, 120, 130 and 140 denote substrate, low temperature grown GaN nucleation layer, high temperature grown GaN buffer layer, and $Al_xGa_{1-x}N$ barrier layer including the modulation doped carrier supply layer. The manufacturing method of monolithic integration of E/D-mode HFETs for integrated circuits is described below. For both D-mode and E-mode HFETs, the mesa isolations are simultaneously formed using Cl2/He plasma dry etching followed by the source/drain ohmic contact formation 160 with Ti, Al, Ni and Au annealed at 850° C. for 45 seconds as shown in FIG. 26B. The gates as well as gate-source interconnections of D-mode HFETs are patterned by photoresist 170 as shown in FIG. 26C, followed by depositing and lift-off Ni and Au 178. Thereafter, the E-mode HFETs' gates, pads and second interconnections are patterned with photoresist 175 as shown in FIG. 26D. Then the fluoride ions are incorporated into $Al_xGa_{1-x}N$ barrier layer beneath E-mode HFETs' gates by, for examples, either fluoride plasma treatment or fluoride ions implantation as shown in FIG. 26D. The gate electrode 180 is formed on the barrier layer 140 by depositing and lift-off Ni and Au. Thereafter, post-gate rapid thermal annealing (RTA) is conducted at 400-450° C. for 10 minutes. A passivation layer 190 is grown on the top of the wafer as shown in FIG. 26E. Then the contact pads and via holes are opened by removing portions of the passivation layer on them as shown in FIG. 26F. Finally, a third interconnection is formed.

An E/D HFETs inverter and a 17-stage direct-coupled ring oscillator were created on a 20 nm $Al_{0.25}Ga_{0.75}N$ barrier layer on 2 μm GaN buffer layer with typical $CF_4$ plasma treatment condition of 150 W for 150 seconds and typical post-gate RTA condition of 450° C. for 10 minutes for E-mode HFETs. The inverter has a $NM_L$ of 0.21 V and a $NM_H$ of 0.51 V at a supply voltage of 1.5 V. When supply voltage of 3.5 V is applied, the 17-stage ring oscillator shows a maximum oscillation frequency of 225 MHz corresponding to a minimum propagation delay of 130 ps.

EXAMPLE

Figure 27:
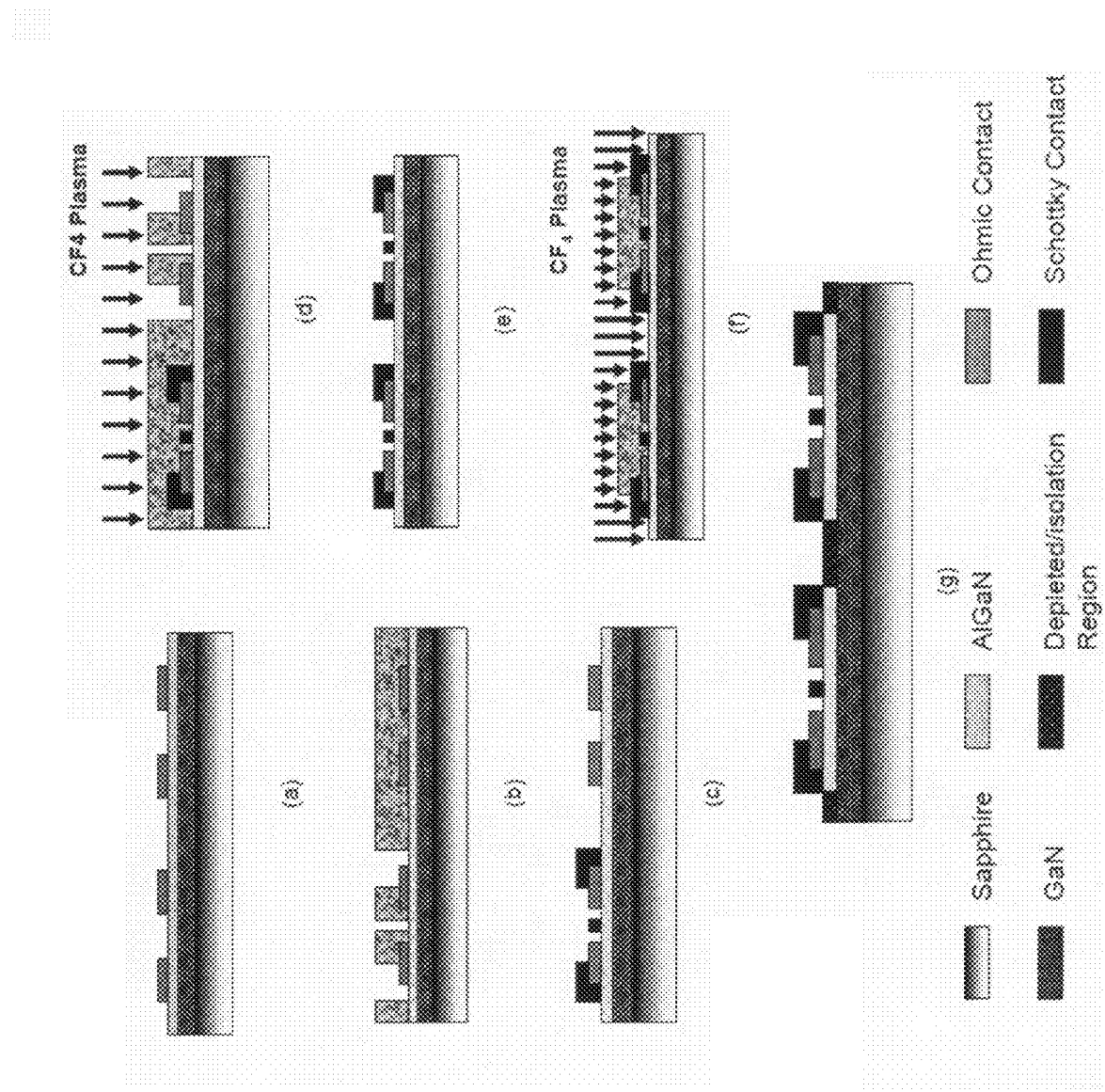
FIG. 27 shows a planar process flow for monolithic integration.

This embodiment describes a method for planar monolithic integration of E-mode and D-mode AlGaN/GaN HFETs. As described in the first embodiment, the isolation among active devices can be obtained by creating active device mesa through etching, which creates non-flat wafer surfaces. In integrated circuit fabrications, planar process are always desirable. Following the same principle of channel depletion by the negatively charged fluorine ions in the AlGaN, depletion of the desired inactive (isolated) areas by fluoride-based plasma treatment can be effected. The plasma power and treatment time can both be increased to enhance the carrier depletion. The process flow is illustrated in FIG. 27, where: (a) source/drain ohmic contacts formation; (b) D-mode HFET gate definition by photolithography; (c) D-mode HFET gate metallization and part of the interconnects formation; (d) E-mode HFET gate definition by photolithography followed by plasma treatment; (e) E-mode HFET gate metallization and part of the interconnects formation; (f) isolation region definition by photolithography followed by the second fluoride-based plasma treatment; (g) final chip followed by passivation.

EXAMPLE

The AlGaN/GaN HEMT structure in this example was grown on a (0001) sapphire substrates in an Aixtron AIX 2000

HT MOCVD system. The HEMT structure consists of a low-temperature GaN nucleation layer, a 2.5-μm thick unintentionally doped GaN buffer layer, and an AlGaN barrier layer with a nominal 30% Al composition. The barrier layer is composed of a 3-nm undoped spacer, a 21-nm carrier supplier layer doped at $2\times10^{18}$ cm$^{-3}$, and a 2-nm undoped cap layer. Room-temperature hall measurements of the structure yield an electron sheet density of $1.3\times10^{13}$ cm$^{-2}$ and an electron mobility of 950 cm$^2$/Vs.

Figure 28:
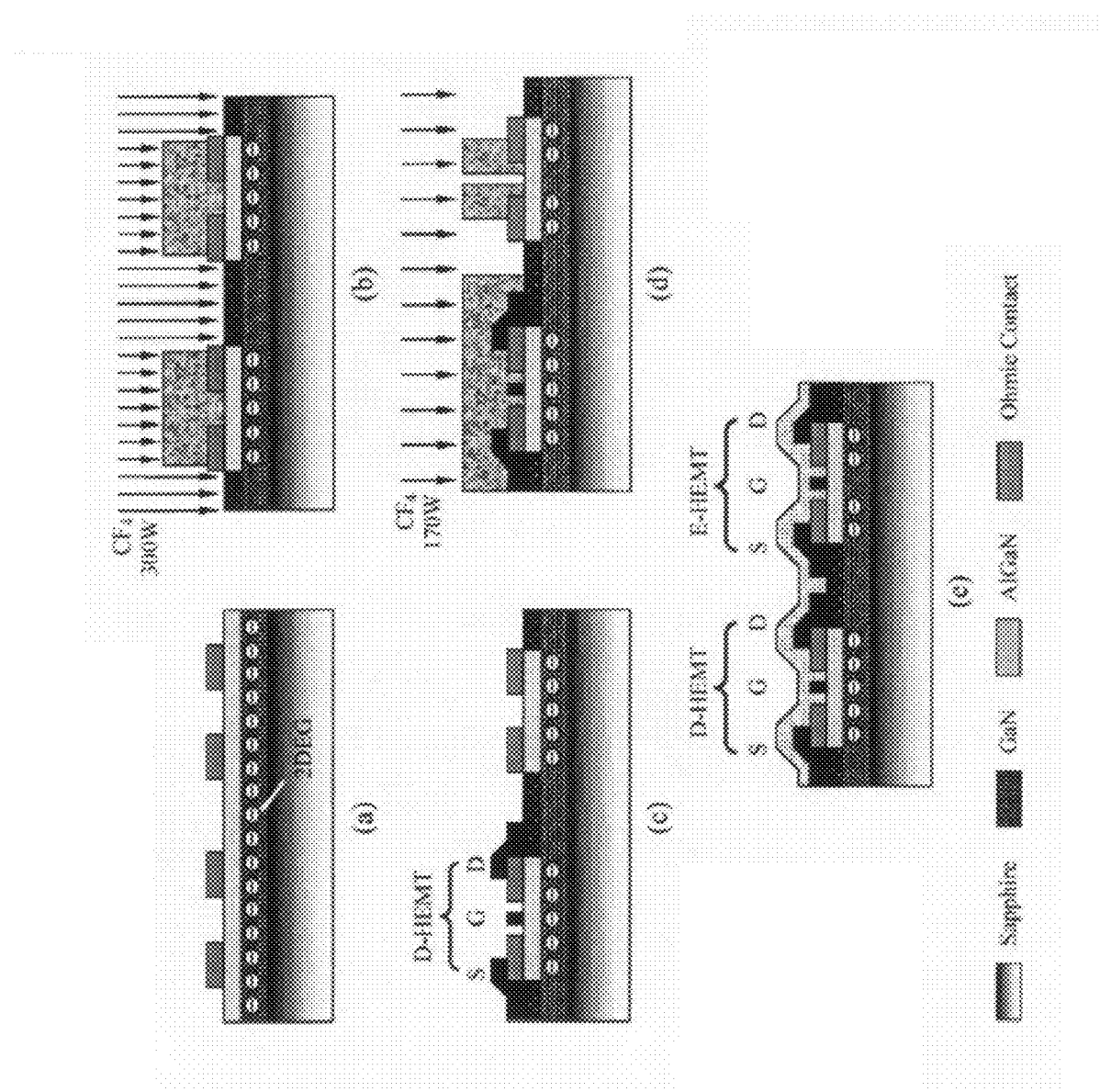
FIG. 28 shows another sample process flow for E/D-mode HEMTs.

The integration process flow is illustrated in FIG. 28. First, the source/drain ohmic contacts of the E/D-mode devices were formed simultaneously by a deposition of e-beam evaporated Ti/Al/Ni/Au (20 nm/150 nm/80 nm) and rapid thermal annealing at 850° C. for 30 seconds, as shown in FIG. 28(a). Second, the active regions for both E/D-mode devices were patterned by a photolithography, which followed by the CF$_4$ plasma treatment in a reactive ion etching system. The plasma power was 300 W, and the treatment time was 100 seconds. The gas flow was controlled to be 150 sccm, and the plasma bias was set to be 0 V. The isolation regions are the locations where a large amount of fluorine ions are incorporated in the AlGaN and GaN layer near the surface, and then deplete the two-dimensional electron gas in the channel, as shown in FIG. 28(b). The D-mode HEMTs' gate electrodes were then patterned by the contact photolithography, which is followed by the e-beam evaporation of Ni/Au (50 nm/300 nm) and liftoff as shown in FIG. 28(c). next, E-mode HEMTs' gate electrodes and interconnections were defied. Prior to the e-beam evaporation of Ni/Au, the gate regions of the E-mode HEMTs were treated by the CF$_4$ plasma (which has a negligible etching to AlGaN) at 170 W for 150 seconds, as shown in FIG. 28(d). This plasma treatment performed the function of converting the treated devices from the D-mode to E-mode HEMT. A 200-nm-thick silicon nitride passivation layer was deposited by PECVD, and the probing pads were opened. Then, the sample was annealed at 400° C. for 10 minutes to repair the plasma-induced damage in the AlGaN barrier and channel of the E-mode HEMTs as in FIG. 28(e). As a comparison, the D-mode devices were fabricated on another piece of the sample from the same substrate by the standard process, in which inductively coupled plasma reactive ion etching was used to define the mesa as the active region. For the direct-coupled FET logic inverter shown in FIG. 1A, the E-mode HEMT driver is designed with a gate length, gate-source spacing, gate-drain spacing, and gate width of 1.5, 1.5, 1.5, and 50 μm, respectively; the D-mode HEMT load is designed with a gate length, gate-source spacing, gate-drain spacing, and gate width of 4, 3, 3, and 8 μm, yielding a ration $\beta=(W_E/L_E)/(W_D/L_D)$ of 16.7. Discrete E-mode and D-mode HEMTs with 1.5×100 μm gate dimension are fabricated for characterizations.

Device and Circuit Characteristics

Figure 29:
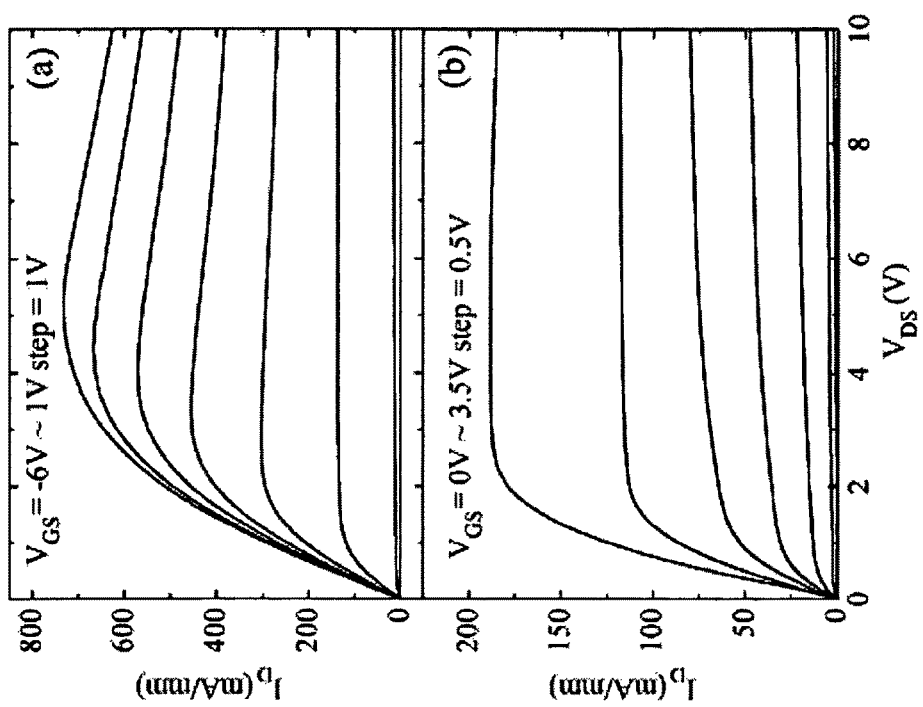
FIG. 29 shows DC output characteristics of an D-HEMT and an E-HEMT fabricated by a planar process.
Figure 30:
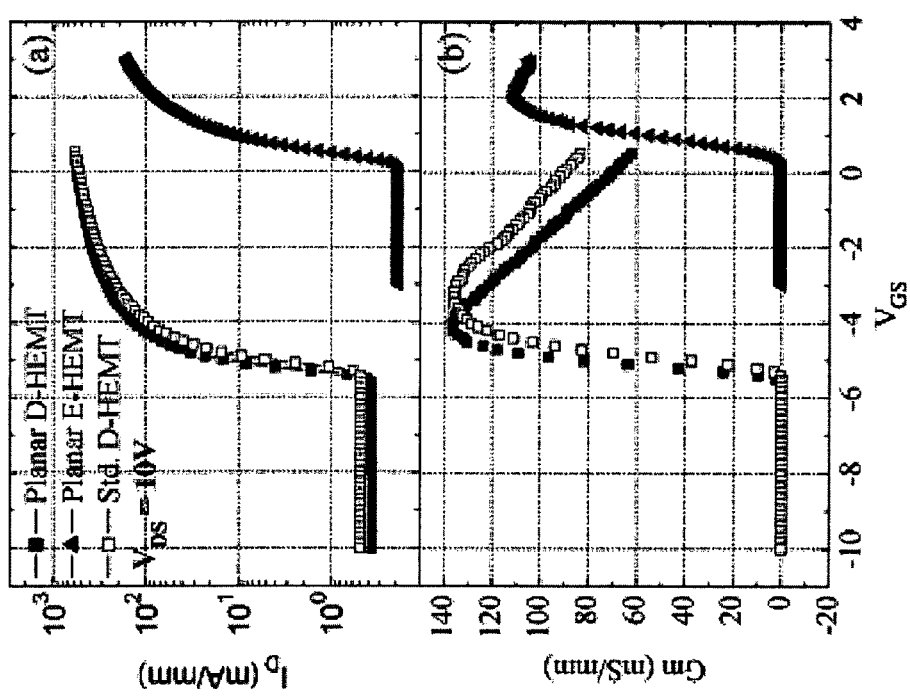
FIG. 30 compares transfer characteristics of the planar process with those of a conventional process.

For the E/D-mode HEMTs fabricated by the planar process, the output characteristics are plotted in FIG. 29. The peak current density for D-mode and E-mode HEMTs are about 730 and 190 mA/mm. FIG. 30 shows the DC transfer characteristics comparison between the planar and the standard process. It can be seen that the drain leakage current for the planar process is about 0.3 mA/mm, reaching the same level as the devices fabricated by the standard mesa etching. The D-mode HEMTs by the planar process have the comparable drain-current and transconductance characteristics as shown in FIG. 30(b), as the ones by the standard process. Also, the leakage current between two pads (400×100 μm$^2$) was measured with a spacing of 150 μm. At the DC bias of 10 V, the leakage current by the planar process is about 38 μA, at the same level of the standard mesa etching sample (about 30 μA). compared with the standard mesa process, the fluoride-based plasma treatment can achieve the same level of the active device isolation, enabling a complete planar-integration process. The E-mode HEMTs exhibit a smaller transconductance ("$g_m$") compared to the D-mode devices, which is due to the incomplete of the plasma-induced damage. The fact that the sample has been through a thermal annealing at 400° C. also indicates that a good thermal stability is expected at a temperature at least up to 400° C. It should be noted that an ion-implantation technique has also been developed for inter-device isolation accomplished by a multiple energy N+ implantation to produce significant lattice damage throughout the thickness of the GaN buffer layer. Compared to the ion-implantation technique, the CF$_4$ plasma-treatment technique has the advantages of low cost and low damage.

Figure 31:
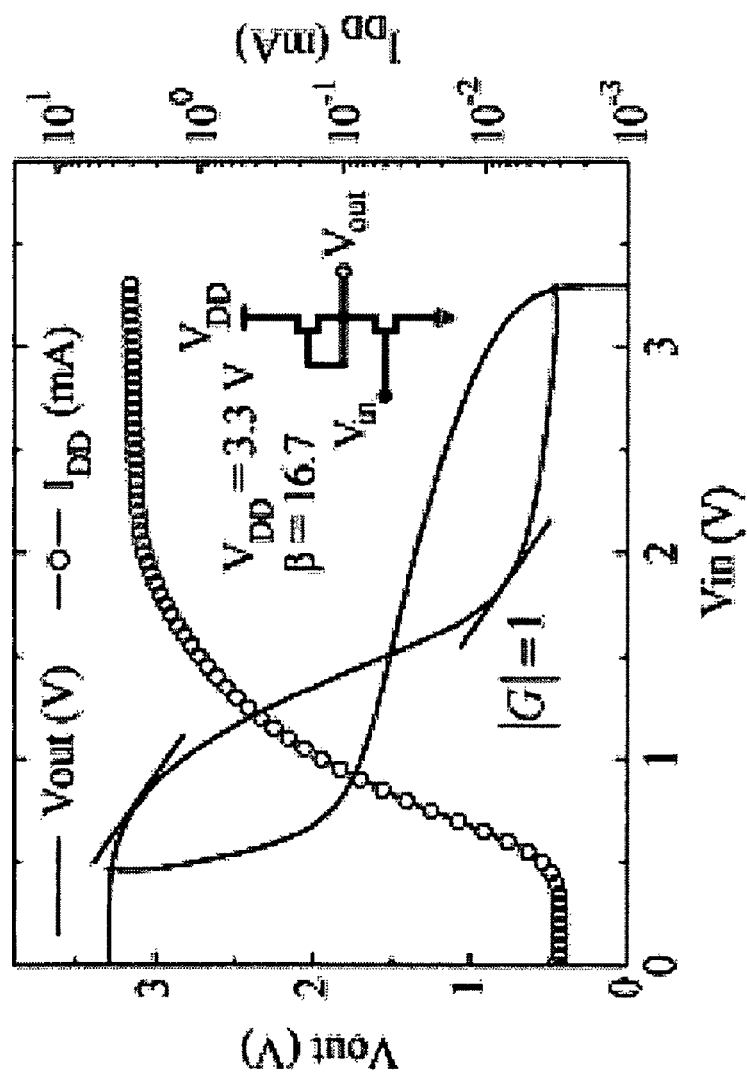
FIG. 31 shows static voltage transfer characteristics of an E/D HEMT inverter fabricated by a planar fabrication process.

The E/D-mode HEMTs DCFL inverter fabricated by the planar-integration process was characterized. FIG. 31 shows the measured static voltage transfer curve of the inverter at a supply voltage $V_{DD}=3.3$ V. High-and low-output logic levels ($V_{OH}$ and $V_{OL}$) are 3.3 and 0.45 V, respectively, with the output swing ($V_{OH}-V_{OL}$) of 2.85 V. The DC voltage gain in the linear region is 2.9. By defining the values of $V_{IL}$ and $V_{IH}$ at the unit gain points, the low and high noise margins are 0.34 and 1.47 V. The inverter DC current is also shown in FIG. 31. The leakage current with the E-mode device pinch-off is about 3 μA, which is consistent with the discrete device results.

EXAMPLE

Figure 32:
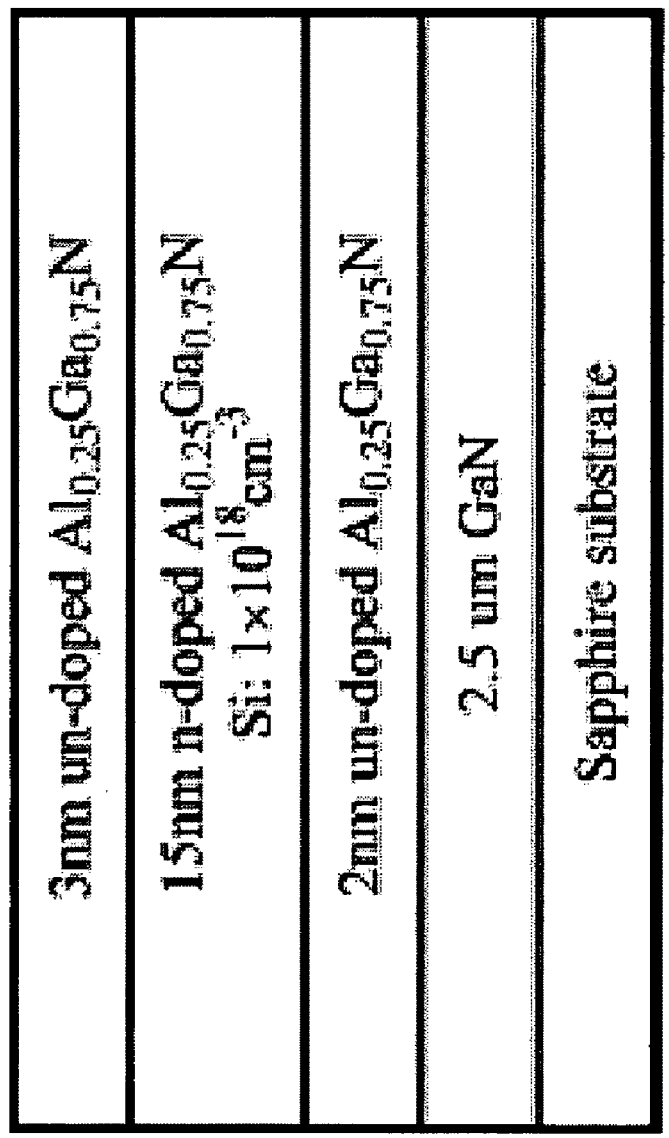
FIG. 32 show an epitaxial structure for the HEMTs used in a sample embodiment.

FIG. 32 shows AlGaN/GaN epitaxial heterostructures during the fabrication of an HEMTs according to the present innovations. They include the following: 2.5 μm GaN buffer layer and channel, 2 nm undoped Al$_{0.25}$Ga$_{0.75}$N spacer, 15 nm Al$_{0.25}$Ga$_{0.75}$N carrier supply layer with Si doping at $1\times10^{18}$ cm$^{-3}$, and a 3 nm undoped Al$_{0.25}$Ga$_{0.75}$N cap layer. The structures were grown on sapphire substrate in an Aixtron 2000 HT MOCVD system. The process flow is shown in FIGS. 33(a) through 33(f).

Figure 33:
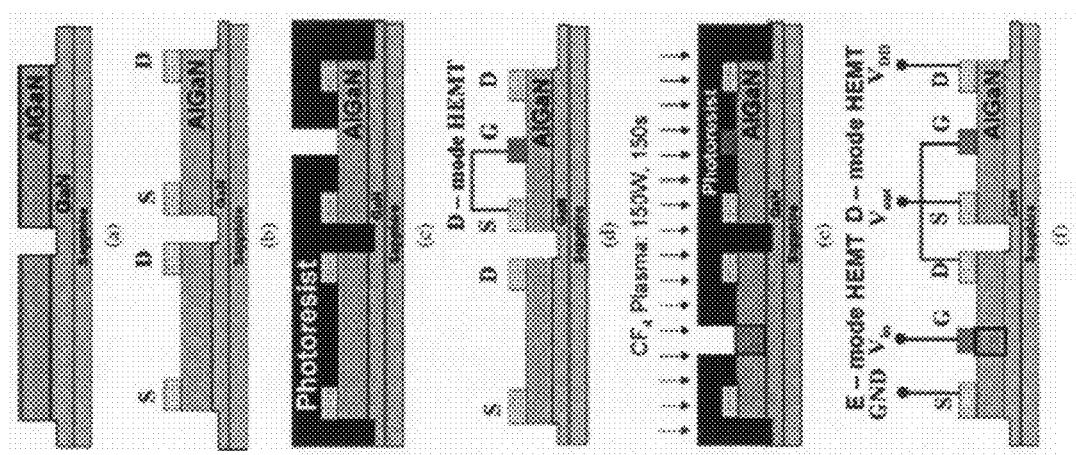
FIG. 33 show the integrated process flow of monolithic integration of E-mode and D-mode HEMTs for a monolithic inverter.

The mesa and source/drain ohmic contacts were formed simultaneously for both E-mode and D-mode HEMTs, as shown in FIGS. 33(a) and (b). The D-mode HEMTs' gate electrodes were then formed by photolithography, metal deposition, and liftoff as shown in FIGS. 33(c) and (d). After defining the patterns of E-mode HEMTs' gates and interconnections, samples were treated by CF$_4$ plasma at a source power of 150 W for 150 seconds in an STS RIE system as shown in FIG. 33(e), followed by gate metallization and lift-off for the E-mode HEMTs. Inspected by atomic force microscope ("AFM") measurements, the AlGaN barrier thickness was reduced by 0.8 nm after the plasma treatment. Next, a post-gate thermal annealing was conducted at 450° C. for 10 minutes as shown in FIG. 33(f). The CF$_4$ plasma treatment converts the treated GaN HEMT from D-mode to E-mode. The magnitude of threshold voltage shift depends on the treatment conditions, e.g., plasma power and treatment time, as described previously. The post-gate annealing is employed to recover the plasma-induced damages in AlGaN barrier and channel. In principle, the higher is the annealing temperature, the more efficient is the damage repair. However, in practice, the post-gate annealing temperature should not exceed the highest temperature (~500° C., in our case) that the gate Schottky contact can endure, as mentioned earlier. It was found that the D-mode HEMTs' characteristics remain the same after the annealing, whereas the E-mode HEMTs' drain current density increases significantly. The post-gate annealing was found to have no effect on the threshold voltage shift introduced by the plasma treatment.

For the E/D inverter and the ring oscillator, the most important physical design parameter is the drive/load ratio, $\beta=(W_g/L_g)\text{E-mode}/(W_g/L_g)\text{D-mode}$. Several E/D inverters and ring oscillators with $\beta$ varying from 6.7 to 50 were designed and fabricated on the same sample. The geometric parameters of each design are listed in FIG. 34. Discrete E-mode and D-mode GaN HEMTs with $1\times100$ μm gate dimension were simultaneously fabricated on the same sample for dc and RF testing.

Characteristics of E/D-Mode HEMTs

Figure 35:
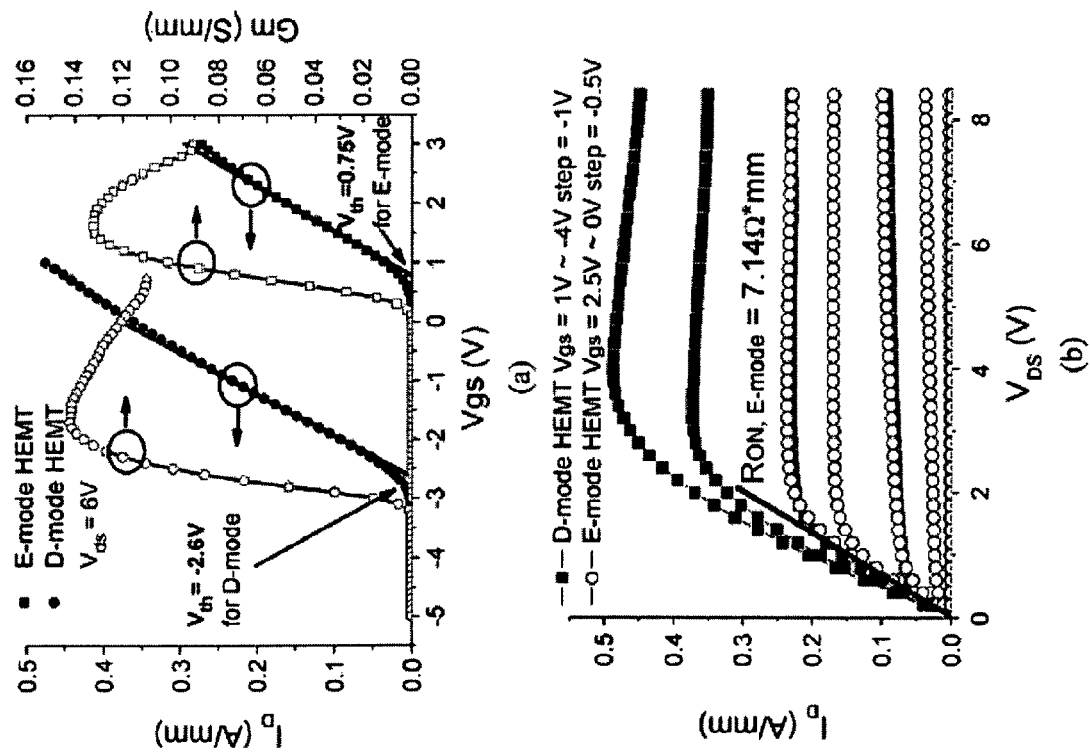
FIG. 35 show DC I-V transfer characteristics and output characteristics of sample D-mode and E-mode AlGaN/GaN HEMTs as disclosed.
Figure 37:
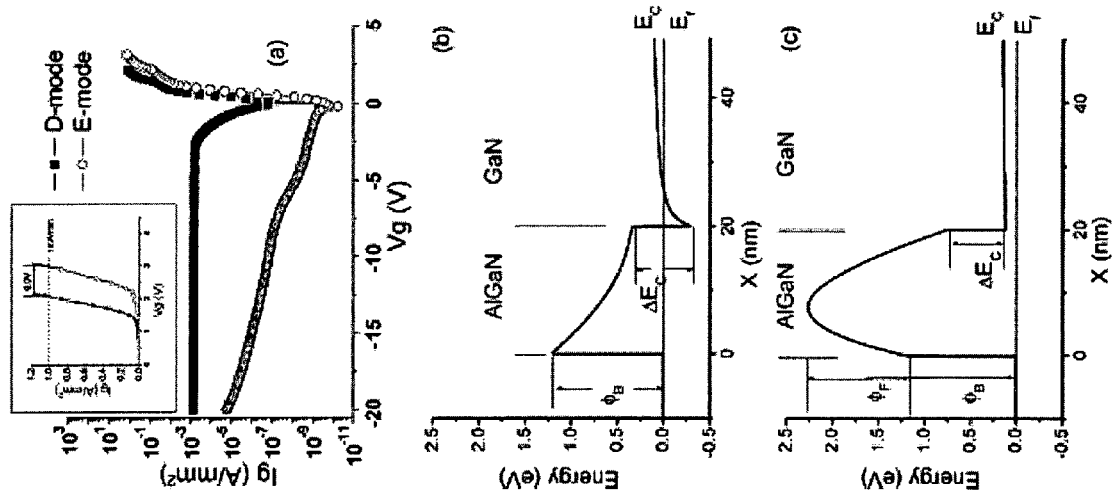
FIG. 37 show $I_g$-$V_g$ characteristics of both D- and E-mode HEMTs and simulated conduction-edge band diagrams under the gate electrode for a D-mode HEMT and an E-mode HEMT.

DC current-voltage (I-V) characteristics of the discrete devices were measured using an HP4156A parameter analyzer. The transfer characteristics of the E/D-mode HEMTs are plotted in FIG. 35(*a*). On-wafer small-signal RF characterization of the discrete devices were carried out in the frequency range of 0.1-39.1 GHz using Cascade microwave probes and an Agilent 8722ES network analyzer. The measured parameters of E/D-mode HEMTs are listed in FIG. 36. The threshold voltage and peak transconductance ($g_{m,max}$) are 0.75 V and 132 mS/mm for the E-mode HEMT and −2.6 V and 142 mS/mm for the D-mode HEMT. The relatively low peak current density of 480 mA/mm for D-mode HEMT is due to relatively low Al composition of 25% and relatively low doping density of $1\times10^{18}$ cm$^{-3}$ in AlGaN barrier layer. Different from the AlGaN/GaN HEMTs used for RF/microwave power amplifiers, the digital ICs are less demanding on the current density. As shown in FIG. 35(*b*), a low knee voltage of 2.5 V is obtained for E-mode HEMTs. At a gate bias of 2.5 V, an on-resistance of 7.1 Ω·mm was achieved for the E-mode HEMT, which is the same as that for the D-mode HEMT at the same saturation current level. One observation is that the gate current in both the reverse- and forward-bias conditions is significantly reduced in the E-mode HEMT as shown in FIG. 37(*a*) compared to the D-mode HEMT. The mechanism of this gate current suppression is the modulation of the potential in the AlGaN barrier by the negatively charged fluorine ions that are introduced by the plasma treatment. The conduction-edge band diagrams simulated for the D- and E-mode HEMTs by solving Poisson's equation and Fermi-Dirac statistics. For the simulated conduction band of E-mode HEMTs, the profile of fluorine distribution is approximated by a linear function that features a maximum fluorine ion concentration of $3\times10^{19}$ cm$^{-3}$ at the AlGaN surface and reaches zero (negligible) at the AlGaN/GaN interface. A total fluorine ion sheet concentration of about $3\times10^{13}$ cm$^{-2}$ is sufficient to compensate not only the Si+ donors' concentration of about $3.7\times10^{12}$ cm$^{-2}$ but also the piezoelectric and spontaneous polarization-induced charges (about $1\times10^{13}$ cm$^{-2}$). It should be noted that the Schottky barrier height at the gate/AlGaN junction is assumed to remain the same in this example. As seen from the simulated conduction bands shown in FIGS. 37(*b*) and (*c*), the potential of the AlGaN barrier can be significantly enhanced by the incorporation of the fluorine ions, resulting in an enhanced Schottky barrier and the subsequent gate current suppression. The gate current suppression in the forward bias is particularly beneficial to digital IC applications. The suppressed gate current allows the E-mode devices' gate bias to be increased up to 2.5 V. Such an increase results in a larger gate voltage swing, larger dynamic range for the input, and higher fan-out. The increased input voltage swing permits higher supply voltage that is an important factor in achieving higher operation speed and higher noise margins for digital ICs. Without the increased gate input swing, a larger supply voltage will lead to an output voltage (at logic "high") that exceeds the turn-on voltage of following stage's input gate. The wider dynamic range for the input enables direct logic level matching between the input and the output, eliminating the need for level adjustment between adjacent stages.

It should be noted that silicon nitride passivation, which is an important technique generally used for the stable operation of the GaN-based HEMTs, can also affect the threshold voltage to a lesser degree. The deposition of silicon nitride passivation layer on the active region, in general, can alter the stress in the AlGaN and GaN layers. Subsequently, the piezoelectric polarization charge density and the threshold voltage of the device can be slightly modified. In general, the widely used silicon nitride layer deposited by high-frequency PECVD introduces additional tensile stress in the AlGaN layer, resulting in a negative shift of the threshold voltage in the range of a few tenths of a volt. In practice, this effect should be taken into consideration in the process design. The plasma treatment dose can be increased accordingly to compensate the negative shift in threshold voltage by the SiN passivation layer. The stress of the Sin passivation layer can also be reduced by modifying the process parameters of the PECVD deposition so that the negative shift in the threshold voltage is minimized.

EXAMPLE

DCFL Inverter

Figure 1:
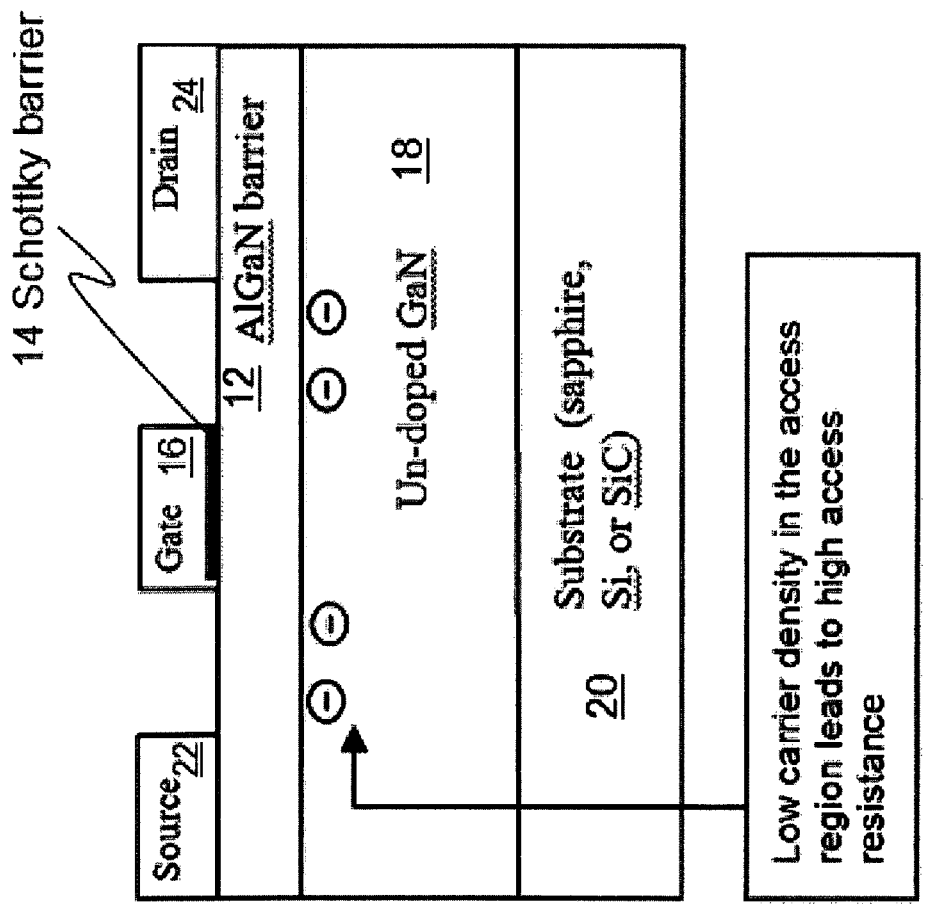
FIG. 1 shows a prior art E-mode HFET.
Figure 1A:
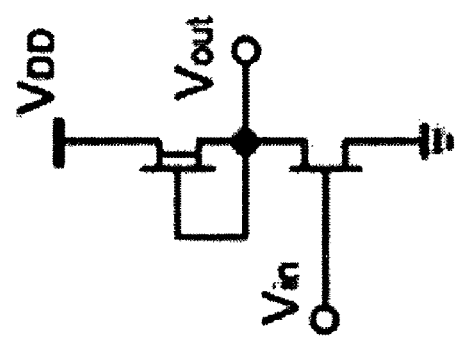
FIG. 1A shows a DCFL circuit schematic for an E/D inverter.
Figure 38:
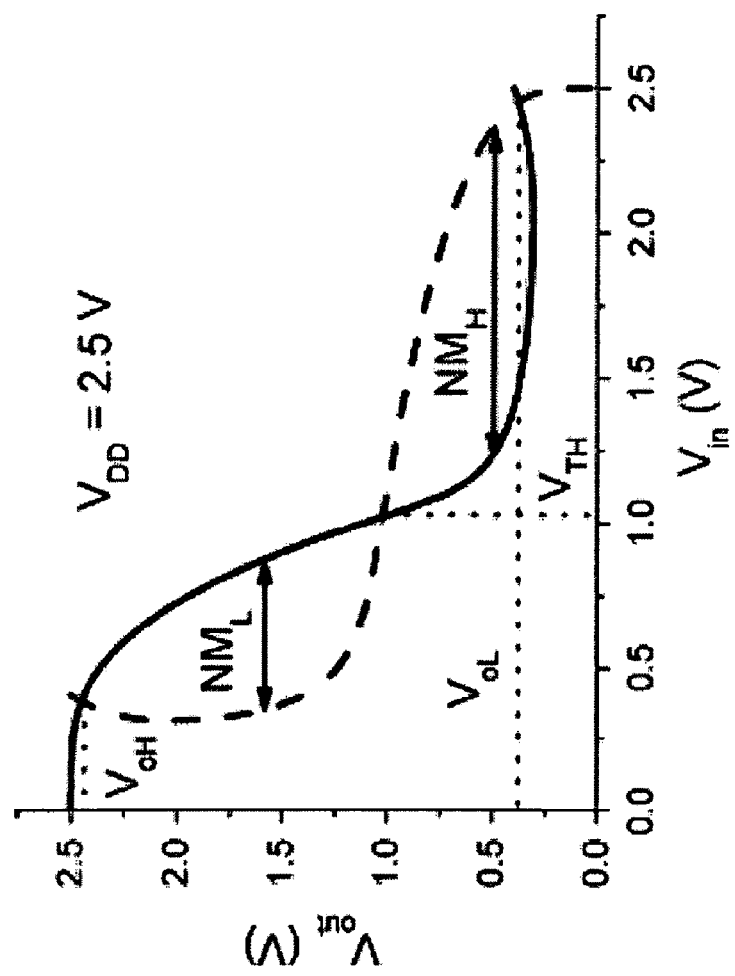
FIG. 38 shows static voltage transfer characteristics for a conventional E/D HEMT inverter.
Figure 39:
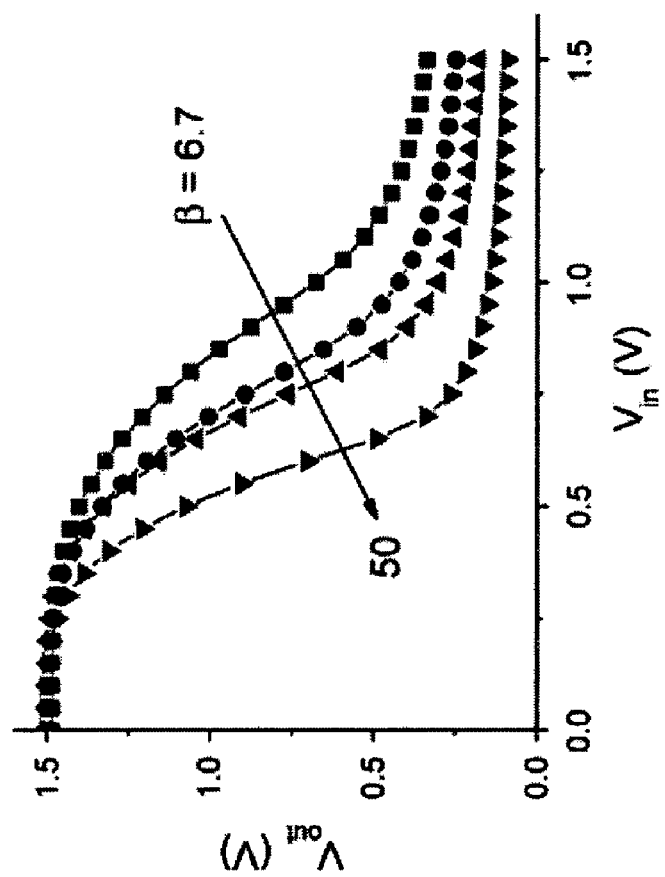
FIG. 39 shows static voltage transfer characteristics of E/D HEMT inverters with $\beta$=6.7, 10, 25, and 50 according to various disclosed embodiments.

The circuit schematic of an E/D HEMT inverter is shown in FIG. 1A, where the D-mode HEMT is used as load with its gate tied to its source and the E-mode HEMT is used as a driver. FIG. 1B shows a fabricated photomicrograph of an inverter according to the present innovations. The fabricated inverters were characterized using an HP4156A parameter analyzer. FIG. 38 shows the static voltage transfer characteristics (the solid curve) for a typical E/D HEMT inverter. The rise in the output voltage at the large input voltages (>2.1 V) is a result of the gate Schottky diode's turn-on. The dashed curve is the same transfer curve with the axis interchanged and represents the input-output characteristics of the next inverter stage. The parameter definitions follow those given for GaAs- and InP-based HEMTs. The static output levels ($V_{OH}$ and $V_{OL}$) are given by the two intersections of the curves in stable equilibrium points, and the difference between the two levels is defined as the output logic voltage swing. The inverter threshold voltage ($V_{TH}$) is defined as $V_{in}$, where $V_{in}$ is equal to $V_{out}$. The static noise margins are measured using the method of largest width for both logic-low noise margin ($NM_L$) and logic-high noise margin ($NM_H$). the measured static voltage transfer curves of E/D inverters with $\beta$ varied from 6.7 to 50 at a supply voltage $V_{DD}=1.5$ V are plotted in FIG. 39. High output logic level ($V_{OH}$) is maintained at 1.5 V, indicating that the E-mode HEMTs are well switched off, whereas low output logic level ($V_{OL}$) is improved from 0.34 to 0.09 V as a result of $\beta$ increasing from 6.7 to 50. As a result, the output logic swing defined as $V_{OH}-V_{OL}$ increases from 1.16 to 1.41 V. As $\beta$ is increased from 6.7 to 50, $V_{TH}$ decreases from 0.88 to 0.61 V, the DC voltage gain (G) in the linear region increases from 2 to 4.1. FIG. 40 lists the measured values of static noise margins, as well as $V_{OH}$, $V_{OL}$, output logic swing, $V_{TH}$, and G. Both $MN_L$ and $NM_H$ are improved as $\beta$ increases.

Figure 41:
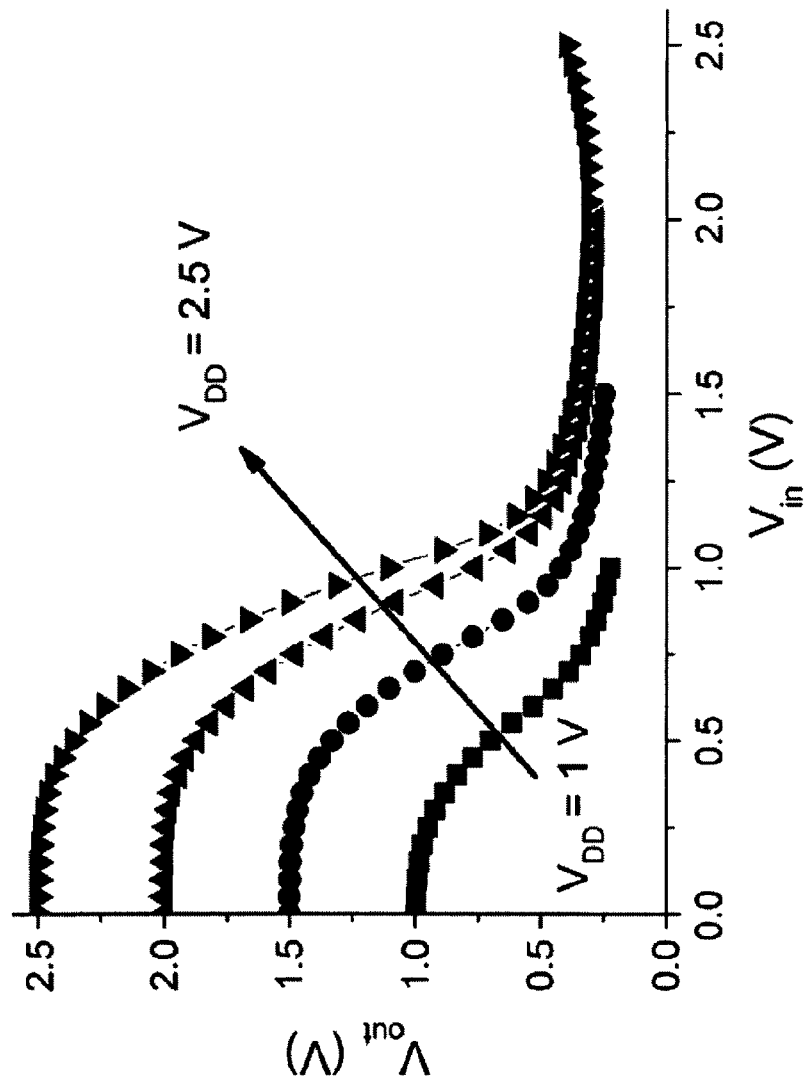
FIG. 41 shows static voltage transfer characteristics of E/D HEMT inverters with $\beta$=10 measured at different supply voltages.
Figure 43:
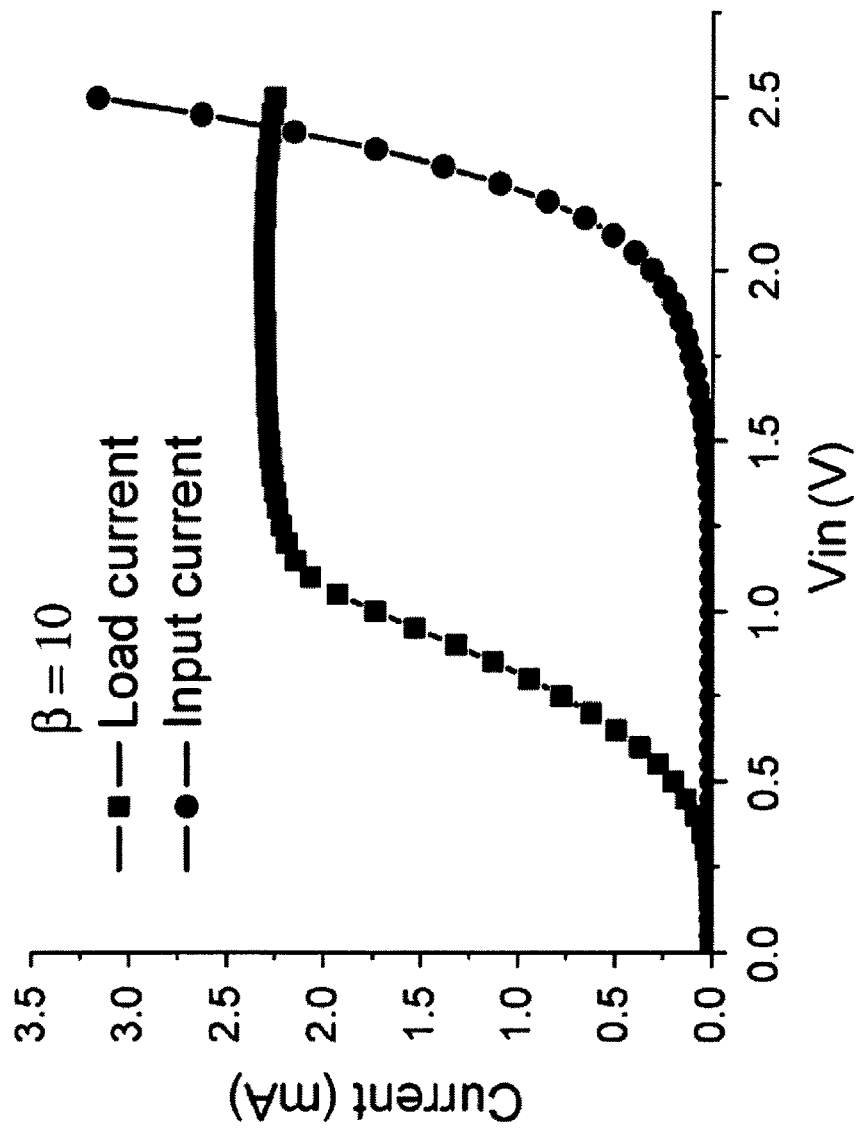
FIG. 43 shows load and input current of an inverter with $\beta$=10 at $V_{DD}$=2.5 V, according to a sample embodiment.

The static voltage transfer curves of the inverter with $\beta=10$ were measured at different supply voltages and are plotted in FIG. 41. The circuit performance parameters are listed in FIG. 42. When supply voltage increases, all the parameters of E/D inverter increase accordingly. This means that the increase of supply voltage improves the static performance of the E/D inverter. As well known, for HEMT and MESFET E/D inverters, the input voltage is always limited by the turn-on voltage of the gate Schottky diode. At a large input voltage, gate conduction causes an increased voltage drop across the parasitic source resistance of the E-mode device that is used as a driver, raising the voltage of the logic low level. The rise in the output voltage can be observed in the static transfer curves as the supply voltage and the required input voltage increase, as shown in FIG. 41. The gate current, when increased by the large input voltage, can significantly degrade the inverter's capability of driving multiple stages, reducing the fan-out. Usually, the turn-on voltage of the gate Schottky diode is around 1 V for a normal AlGaN/GaN HEMT. For a gate-recessed E-mode GaN HEMT, the thinned AlGaN barrier further decreases the turn-on voltage due to an enhanced tunneling current. As a result, for the inverter based on a gate-recessed E-mode GaN HEMT, the output voltage rises when the input voltage is beyond 0.8 V. As disclosed earlier, the E-mode GaN HEMT fabricated by $CF_4$ plasma treatment possesses a suppressed gate current because of the enhanced Schottky barrier in the AlGaN layer, which is induced by the electronegative fluorine ions. Such a gate current suppression enables a larger input voltage swing for the E/D inverter. As can be seen in FIG. 41, the rise in output voltage does not occur until the input voltage is beyond 2 V, indicating about 1 V extension of input voltage swing. FIG. 43 shows the dependences of the load current and input current on the input voltage. The lower input current (gate current of the E-mode HEMT) implies a larger amount of fan-out. At "ON" state, the input current exceeds 10% load current when the input voltage is larger than 2 V.

EXAMPLE

DCFL Ring Oscillator

Figure 1D:
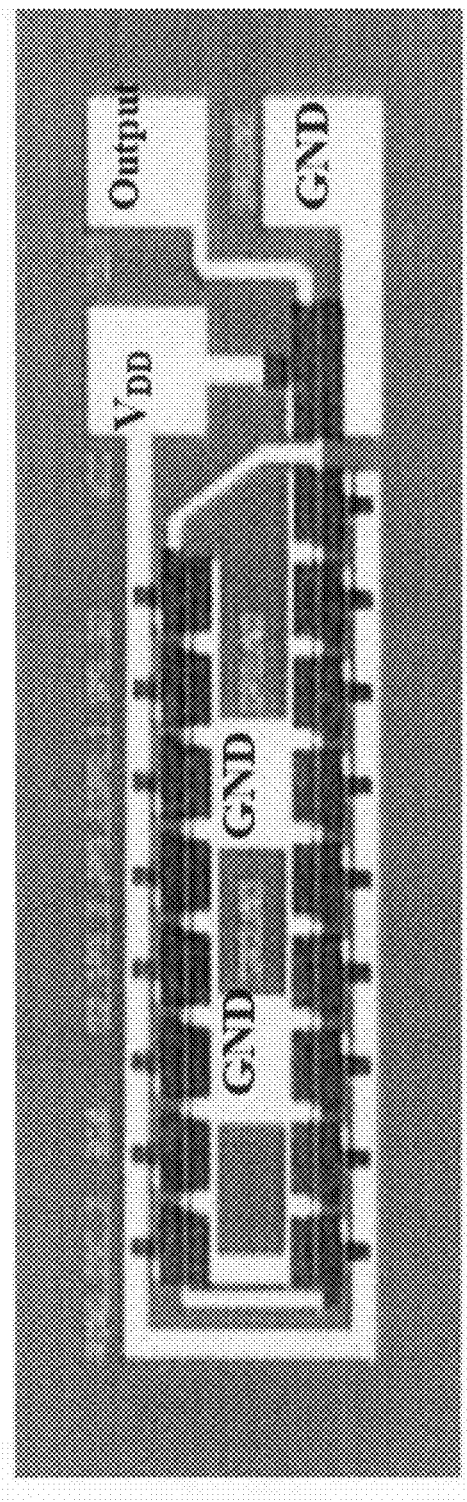
FIG. 1D shows a photomicrograph of a ring oscillator as one embodiment of the present innovations.
Figure 44:
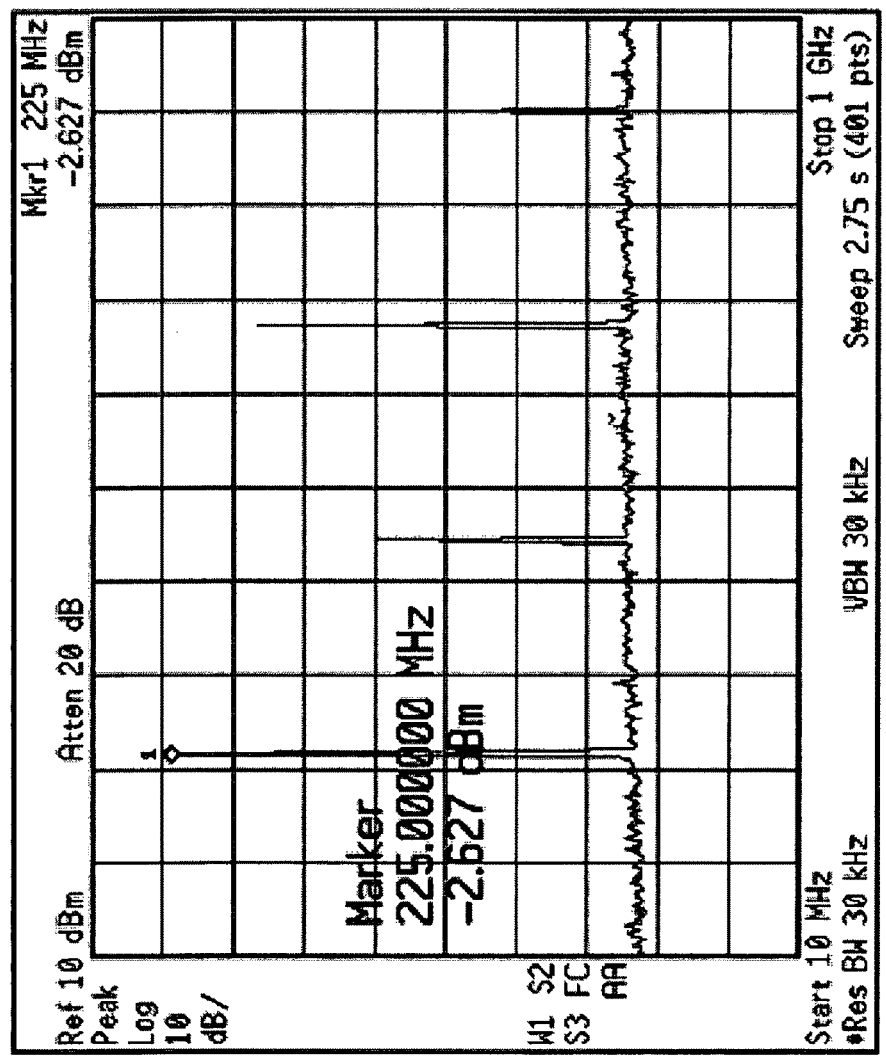
FIG. 44 Shows a frequency spectrum.
Figure 45:
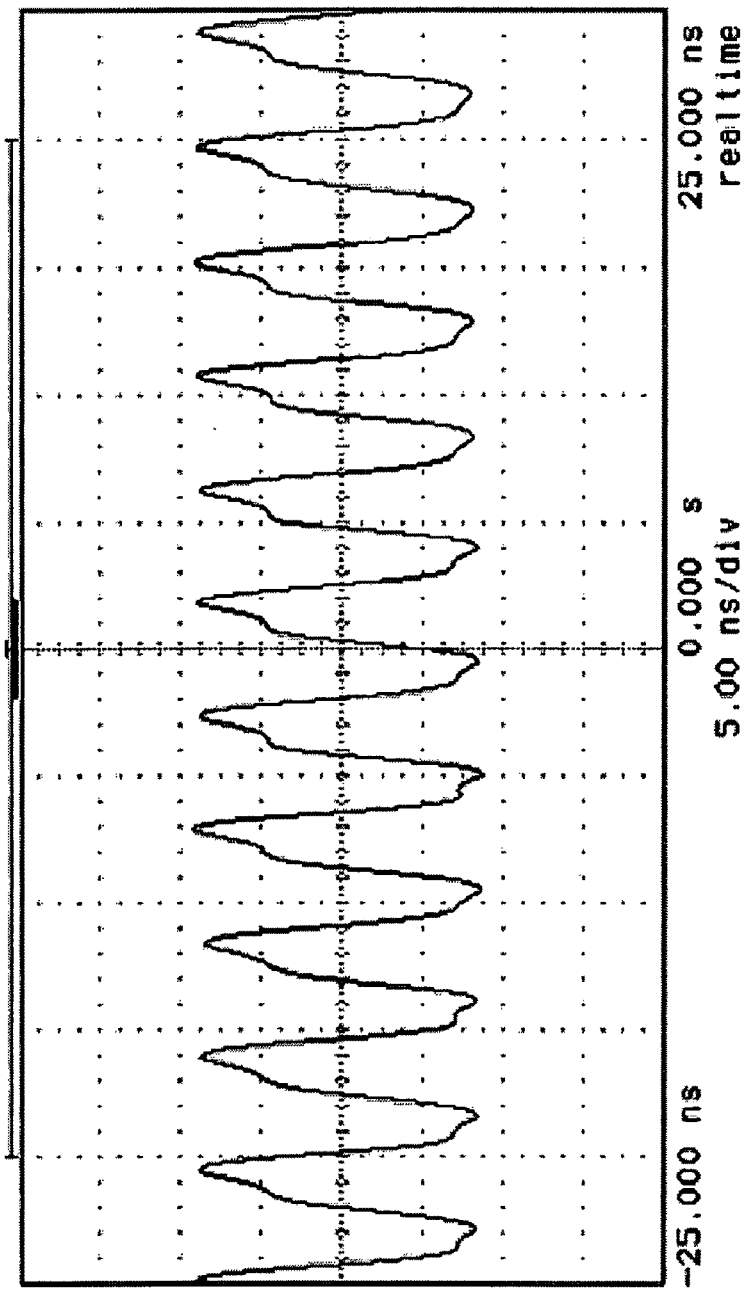
FIG. 45 shows time-domain characteristics, of a 17-stage ring oscillator with $\beta$=10 biased at $V_{DD}$=3.5 V.
Figure 46:
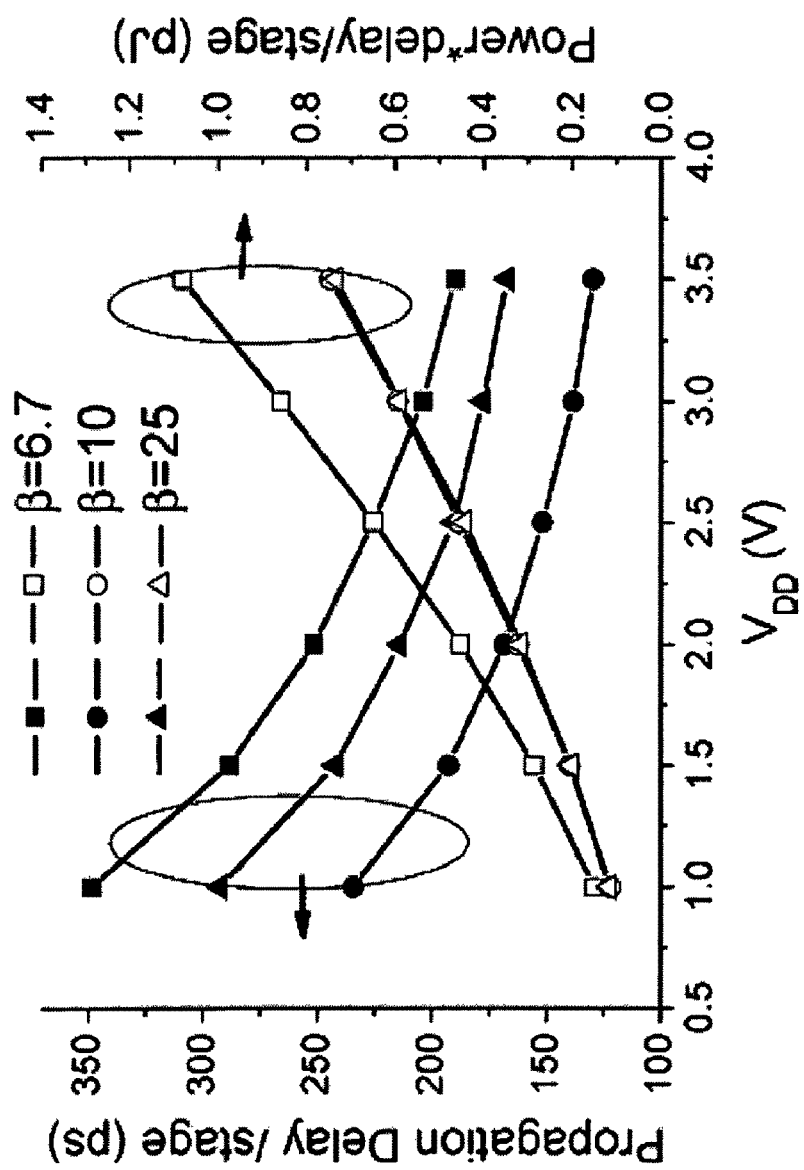
FIG. 46 shows dependences of propagation delay and power-delay product on the supply voltage for one circuit embodiment.

FIG. 1B shows a schematic circuit diagram of a DCFL ring oscillator, which is formed with an odd-numbered E/D inverter chain. Seventeen-stage ring oscillators were fabricated with inverters' $\beta=6.7$, 10, and 25. For each ring oscillator, 36 transistors were used including an output buffer. FIG. 1D shows a photomicrograph of a fabricated ring oscillator according to the present innovations. The ring oscillators were characterized on-wafer using an Agilent E4404B spectrum analyzer and an HP 54522A oscilloscope. The DC power consumption was also measured during the ring oscillators' operation. FIGS. 44 and 45 show the frequency- and time-domain characteristics of the 17-stage ring oscillator with $\beta=10$ biased at $V_{DD}=3.5$ V. The fundamental oscillation frequency is 225 MHz. According to the formula of propagation delay per stage $\tau pd=(2nf)^{-1}$, where the number of stages n is 17, and $\tau_{pd}$ was calculated to be 130 ps/stage. The dependences of $\tau_{pd}$ and power-delay product on $V_{DD}$ were plotted in FIG. 46. With the increase of supply voltage, the propagation delay was reduced, whereas power-delay product increases. Compared to $\tau_{pd}$ (234 ps/stage) measured at 1 V, $\tau_{pd}$ measured at 3.5 V is reduced by 45%. The fact that the ring oscillator can operate at such a high $V_{DD}$ attributes to the larger input voltage swing realized by the $CF_4$ plasma treatment technique used in the integration process. A minimum power-delay product of 0.113 pJ/stage was found at a $V_{DD}$ of 1 V. FIG. 46 also shows $\tau_{pd}$ and power-delay product characteristics of ring oscillators with $\beta=6.7$ and 25. For the ring oscillator with $\beta=6.7$ the larger $\tau_{pd}$ and power-delay product is due to the larger input capacitance determined by the larger gate length (1.5 μm) of the E-mode HEMT. For the ring oscillator with $\beta=25$, the larger $\tau_{pd}$ is due to the lower charging current determined by the larger gate length (4 μm) of the D-mode HEMT, whereas the power-delay product is at the same level as the one with $\beta=10$. When this integration technology is implemented in the sub-micrometer regime, the gate delay time is expected to be further reduced.

Recently, the discrete E-mode HEMTs and the DCFL ring oscillators have been tested at elevated temperature up to 375 C. No significant shift has been observed in the threshold voltage of the E-mode HEMTs, and the ring oscillator exhibits an oscillation frequency of 70 MHz at 375 C.

According to a disclosed class of innovative embodiments, there is provided: a field-effect transistor, comprising: a source contact and a drain contact; a channel, in a vertically inhomogeneous semiconductor material overlain by a gate, which electrically separates said source contact from said drain contact; said vertically inhomogeneous material having a higher aluminum fraction and a wider bandgap near a surface; and a region of trapped charge, within said semiconductor material, which lies between said gate and said channel, and which also extends laterally toward said drain.

According to a disclosed class of innovative embodiments, there is provided: a method for fabricating semiconductor active devices, comprising the actions of: i) introducing dopants into a first semiconductor material, where exposed by a patterned layer, to populate at least one deep level thereof and thereby introduce trapped charge; and ii) forming heterostructure transistors, which include channel regions in a narrower-bandgap semiconductor which is immediately under a respective portion of said first semiconductor; wherein ones of said transistors also include said trapped charge over portions of said first semiconductor material which connect said channel region to a respective drain region.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

While the above example describes a lateral device, it is also contemplated that the various disclosed inventions can be used in merged devices including a lateral transistor element.

It is also contemplated that the disclosed inventions can be applied to some classes of vertical devices with appropriate changes.

In the embodiments shown above, two levels of fixed-charge are provided between gate and drain. However, in alternatives, additional intermediate steps can be used if desired, or a continuous increment can be used.

For high-voltage applications, it is also possible to include a fixed-charge component on the source side too, using the same techniques as described above for use on the drain side. This will slightly degrade on-resistance, but can be advantageous where the maximum voltage withstand is required in a HEMT.

The methods and structures described above provide a new tool in electric field control. These concepts are not only applicable to HEMT or MISHFET devices, but also to III-N MESFET (Metal-semiconductor FET) and MOSFET devices. (MESFET devices do not use a gate insulator, but instead provide a Schottky barrier between gate and channel.)

For another example, minor variations in the semiconductor composition, e.g. use of a phosphonitride instead of a pure nitride, or use of an $Al_xGa_{1-x}N$ over $Al_yGa_{1-y}N$ heterostructure for the basic HEMT structure, are contemplated as alternatives.

For another example, in the various device structures shown, a variety of materials can optionally be used for gate electrodes (taking into account any resulting differences in work function).

Similarly, various changes or substitutions can be made in the epitaxial layer doping.

Similarly, as noted above, various materials can optionally be used for the substrate.

Various disclosed embodiments provide field-effect transistors with a new kind of drain engineering, i.e. a new approach to electric field control on the drain side. However, it is also contemplated that the disclosed transistor embodiments can be part of a merged device structure, e.g. with a lateral transistor used to control injection into another device structure.

In another class of alternative embodiments, it is also contemplated that the proposed field-shaping fixed charge can be used for electric field shaping in a high-voltage diode, especially on the anode side.

It is also contemplated that the present invention can be combined with conventional drain-field modification techniques, using e.g. differential diffusion, field plates, and/or sidewall spacers.

It is also contemplated that the disclosed inventions can be adapted to barrier control in a Schottky diode.

It is also contemplated that the disclosed inventions can be adapted to field control in a high-voltage diode.

Additional general background, which helps to show variations and implementations, may be found in the following publications, all of which are hereby incorporated by reference:

Y. Cai et al., 26 IEEE electron Device letters 435-437, July 2005;
W. Saito et al., 53 IEEE Transactions of Electron Devices 356-362, February 2006;
Y. Ando et al., 24 IEEE Electron Device Letters 289-291, 2003;
Y. F. Wu et al., IEDM 2004, pp. 1078-1079;
Y. Ando et al., IEDM 2005, pp. 576-579.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A field-effect transistor, comprising:
a source contact and a drain contact;
a channel, in a vertically inhomogeneous semiconductor material having at least two layers, a top layer of the at least two layers overlain by a gate, wherein the gate is disposed between the source contact and the drain contact; the top layer of said vertically inhomogeneous semiconductor material having a higher aluminum fraction than an other layer of the at least two layers and a wider bandgap than the other layer; and
a first fixed negative ion region and a second permanently fixed negative ion region within the top layer of the at least two layers of said vertically inhomogeneous semiconductor material, said first fixed negative ion region being under the gate, and said second permanently fixed negative ion region being between the gate and the drain contact, wherein a non-zero density of negative ions is lower in said second permanently fixed negative ion region than a density of negative ions in said first fixed negative ion region.

2. The field-effect transistor of claim 1, wherein said vertically inhomogeneous semiconductor material is an Aluminum-Gallium-Nitride/Gallium-Nitride (AlGaN/GaN) layered structure.

3. The transistor of claim 1, wherein said vertically inhomogeneous semiconductor material is an epitaxial layer supported by a substrate of sapphire, silicon, Silicon-Carbide (SiC), Aluminum-Nitride (AlN), or Gallium-Nitride (GaN).

4. The field-effect transistor of claim 1, wherein said vertically inhomogeneous semiconductor material is an epitaxial structure comprising a nucleation layer of Gallium-Nitride (GaN) or Aluminum-Nitride (AlN), a buffer layer of GaN or Aluminum-Gallium-Nitride (AlGaN), a GaN channel, and an AlGaN barrier.

5. The field-effect transistor of claim 1, wherein said source contact and said drain contact are formed by depositing multiple metal layers and rapid thermal annealing, wherein said metals are selected from the group consisting of Titanium (Ti), Aluminum (Al), Nickel (Ni), and Gold (Au).

6. The field-effect transistor of claim 1, at least one of the first fixed negative ion region or the second permanently fixed negative ion region comprise fluoride ions based in part on a fluorine-based plasma treatment using a feed gas selected from the group consisting of carbon tetrafluoride ($CF_4$), Sulfur hexafluoride ($SF_6$), Boron trifluoride ($BF_3$), and mixtures thereof.

7. The field-effect transistor of claim 1, further comprising a passivation material selected from the group consisting of silicon nitride, silicon oxide, polyimide, and benzocyclobutene deposited over the field-effect transistor.

8. The field-effect transistor of claim 1, the vertically inhomogeneous semiconductor material comprising an improved micro-structure associated with a higher drain current density based in part on a post-gate thermal anneal below a selected temperature, the temperature selected to prevent damage to at least one Schottky contact associated with the field-effect transistor while retaining an enhancement mode of the field-effect transistor after the post-gate thermal anneal.

9. The field-effect transistor of claim 1, wherein said negatively charged ions are fluoride ions.

10. A field-effect transistor, comprising:
a source contact and a drain contact;
a channel, in a vertically inhomogeneous semiconductor material having at least two layers, a top layer of the at least two layers overlain by a gate, wherein the gate is disposed between the source contact and the drain contact; the top layer of said vertically inhomogeneous semiconductor material having a higher aluminum fraction than an other layer of the at least two layers and a wider bandgap than the other layer; and
a first fixed negatively charged fluorine ion region and a second fixed negatively charged fluorine ion region within the top layer of the at least two layers of said vertically inhomogeneous semiconductor material, said first fixed negatively charged fluorine ion region being under the gate, said second fixed negatively charged fluorine ion region being between the gate and the drain contact, wherein said first fixed negatively charged fluorine ion region and said second fixed negatively charged fluorine ion region are physically adjacent to each other, and a non-zero density of negatively charged fluorine ion in said second fixed negatively charged fluorine ion region is lower than a density of negatively charged fluorine ion in said first fixed negatively charged fluorine ion region.

11. The field-effect transistor of claim 10, the vertically inhomogeneous semiconductor material comprising an improved micro-structure associated with a higher drain current density based in part on a post-gate thermal anneal below a selected temperature, the temperature selected to prevent damage to at least one Schottky contact associated with the field-effect transistor while retaining an enhancement mode of the field-effect transistor after the post-gate thermal anneal.

12. A field-effect transistor, comprising:
a source contact and a drain contact;
a channel, in a vertically inhomogeneous semiconductor material having at least two layers, a top layer of the at least two layers overlain by a gate, wherein the gate is disposed between the source contact and the drain contact;
the top layer of said vertically inhomogeneous semiconductor material having a higher aluminum fraction than an other layer of the at least two layers and a wider bandgap than the other layer; and
a region of trapped fluorine ions, within the top layer of said vertically inhomogeneous semiconductor material, which lies between said gate and said channel, and which also extends laterally toward said drain contact.

13. The field-effect transistor of claim 12, the vertically inhomogeneous semiconductor material comprising an Aluminum-Gallium-Nitride/Gallium-Nitride (AlGaN/GaN) layered structure.

14. A field-effect transistor, comprising: a source contact and a drain contact; a top layer directly on an other layer, wherein the top layer is overlain by a gate, wherein the gate is provided between the source contact and the drain contact, and wherein the top layer has a higher aluminum fraction and a wider bandgap than the other layer; and
a first fixed negative ion region and a second permanently fixed negative ion region within the top layer, wherein the first fixed negative ion region is under the gate, and the second permanently fixed negative ion region is between the gate and the drain contact, wherein a non-zero density of negative ions is lower in the second permanently fixed negative ion region than a density of negative ions in the first fixed negative ion region.

* * * * *